(12) United States Patent
Xie et al.

(10) Patent No.: US 10,431,663 B2
(45) Date of Patent: Oct. 1, 2019

(54) METHOD OF FORMING INTEGRATED CIRCUIT WITH GATE-ALL-AROUND FIELD EFFECT TRANSISTOR AND THE RESULTING STRUCTURE

(71) Applicant: GLOBALFOUNDRIES INC., Grand Cayman (KY)

(72) Inventors: Ruilong Xie, Schenectady, NY (US); Balasubramanian Pranatharthiharan, Watervliet, NY (US); Pietro Montanini, Albany, NY (US); Julien Frougier, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/867,036

(22) Filed: Jan. 10, 2018

(65) Prior Publication Data
US 2019/0214473 A1    Jul. 11, 2019

(51) Int. Cl.
*H01L 27/12* (2006.01)
*H01L 29/423* (2006.01)
(Continued)

(52) U.S. Cl.
CPC .. *H01L 29/42392* (2013.01); *H01L 21/30604* (2013.01); *H01L 21/31053* (2013.01);
(Continued)

(58) Field of Classification Search
CPC ....... H01L 29/42392; H01L 21/823431; H01L 21/823412; H01L 21/823481;
(Continued)

(56) References Cited

U.S. PATENT DOCUMENTS 7,601,570 B2   10/2009  Damlencourt
8,173,993 B2    5/2012  Bangsaruntip et al.
(Continued)

FOREIGN PATENT DOCUMENTS

TW        201601219 A     1/2016

OTHER PUBLICATIONS

APA citation: World's First Vertically Stacked Gate-All-Around Si Nanowire CMOS Transistors, Dec. 23, 2016, Retrieved on Jun. 14, 2017. https://phys.org/news/2016-12-world-vertically-stacked-gate-all-around-si.html, pp. 1-2.

(Continued)

*Primary Examiner* — Ismail A Muse
(74) *Attorney, Agent, or Firm* — Gibb & Riley, LLC; Anthony J. Canale

(57) ABSTRACT

Disclosed are methods for forming an integrated circuit with a nanowire-type field effect transistor and the resulting structure. A sacrificial gate is formed on a multi-layer fin. A sidewall spacer is formed with a gate section on the sacrificial gate and fin sections on exposed portions of the fin. Before or after removal of the exposed portions of the fin, the fins sections of the sidewall spacer are removed or reduced in size without exposing the sacrificial gate. Thus, the areas within which epitaxial source/drain regions are to be formed will not be bound by sidewall spacers. Furthermore, isolation material, which is deposited into these areas prior to epitaxial source/drain region formation and which is used to form isolation elements between the transistor gate and source/drain regions, can be removed without removing the isolation elements. Techniques are also disclosed for simultaneous formation of a nanosheet-type and/or fin-type field effect transistors.

20 Claims, 43 Drawing Sheets

(51) Int. Cl.
| | |
|---|---|
| *H01L 27/02* | (2006.01) |
| *H01L 29/66* | (2006.01) |
| *H01L 21/306* | (2006.01) |
| *H01L 21/762* | (2006.01) |
| *H01L 21/311* | (2006.01) |
| *H01L 21/3105* | (2006.01) |
| *H01L 21/768* | (2006.01) |
| *H01L 21/8234* | (2006.01) |
| *H01L 29/06* | (2006.01) |
| *H01L 29/78* | (2006.01) |
| *H01L 29/10* | (2006.01) |
| *H01L 29/08* | (2006.01) |
| *H01L 27/088* | (2006.01) |

(52) U.S. Cl.
CPC .. *H01L 21/31111* (2013.01); *H01L 21/76224* (2013.01); *H01L 21/76897* (2013.01); *H01L 21/823412* (2013.01); *H01L 21/823418* (2013.01); *H01L 21/823431* (2013.01); *H01L 21/823437* (2013.01); *H01L 21/823481* (2013.01); *H01L 27/0207* (2013.01); *H01L 27/0886* (2013.01); *H01L 29/0649* (2013.01); *H01L 29/0673* (2013.01); *H01L 29/0847* (2013.01); *H01L 29/1033* (2013.01); *H01L 29/6656* (2013.01); *H01L 29/66545* (2013.01); *H01L 29/66636* (2013.01); *H01L 29/66795* (2013.01); *H01L 29/7851* (2013.01)

(58) Field of Classification Search
CPC ..... H01L 21/823437; H01L 21/823418; H01L 29/0649; H01L 29/0847; H01L 29/1033; H01L 29/7851; H01L 29/0673; H01L 29/66795; H01L 21/76897; H01L 21/31053; H01L 21/31111; H01L 21/76224; H01L 21/30604; H01L 29/6656; H01L 29/66636; H01L 29/66545; H01L 27/0207; H01L 27/0886
See application file for complete search history.

(56) References Cited

U.S. PATENT DOCUMENTS

| | | | |
|---|---|---|---|
| 8,679,902 | B1 | 3/2014 | Basker et al. |
| 9,000,530 | B2 | 4/2015 | Balakrishnan et al. |
| 9,286,434 | B2 | 3/2016 | Zou et al. |
| 9,437,501 | B1 | 9/2016 | Cheng et al. |
| 2008/0135949 | A1 | 6/2008 | Lo et al. |
| 2015/0083999 | A1 | 3/2015 | Cheng et al. |
| 2015/0303197 | A1* | 10/2015 | Ching ............... H01L 29/66439 257/9 |
| 2015/0372115 | A1* | 12/2015 | Koh ..................... H01L 29/6656 438/301 |
| 2016/0020305 | A1* | 1/2016 | Obradovic .......... H01L 29/7391 257/39 |
| 2016/0155800 | A1* | 6/2016 | Zang ................... H01L 29/0673 257/347 |
| 2017/0005190 | A1 | 1/2017 | Chang et al. |
| 2017/0040321 | A1 | 2/2017 | Mitard |
| 2017/0077232 | A1 | 3/2017 | Balakrishnan et al. |
| 2017/0154960 | A1 | 6/2017 | Rachmady et al. |
| 2017/0263728 | A1* | 9/2017 | Kittl ..................... H01L 29/6681 |
| 2017/0271514 | A1* | 9/2017 | Kittl ..................... H01L 29/7848 |
| 2017/0278842 | A1* | 9/2017 | Song ................... H01L 29/0673 |
| 2017/0294358 | A1 | 10/2017 | Cheng et al. |
| 2018/0122704 | A1* | 5/2018 | Zhou ............... H01L 21/823418 |
| 2018/0175167 | A1* | 6/2018 | Reboh .............. H01L 29/78696 |
| 2018/0190829 | A1* | 7/2018 | Song ................. H01L 29/78618 |
| 2018/0315817 | A1* | 11/2018 | Van Dal ............. H01L 29/0673 |
| 2018/0330998 | A1* | 11/2018 | Gaben .................. H01L 21/845 |

OTHER PUBLICATIONS

Gaillardon et al., "Nanowire Systems: Technology and Design," Phil. Trans. R. Soc. A 372: Jan. 2, 2013. http://dx.doi.org/10.1098/rsta.2013.0102, pp. 1-15.

Sacchetto et al., "Vertically-Stacked Gate-All-Around Polysilicon Nanowire FETs with Sub-um Gates Patterned by Nanostencil Lithography," Microelectronic Engineering, vol. 98, 2012, pp. 355-358.

Taiwanese Application No. 107144322, Examination Report dated May 24, 2019 and Search Report dated May 23, 2019, pp. 1-6.

\* cited by examiner

METHOD OF FORMING INTEGRATED CIRCUIT WITH GATE-ALL-AROUND FIELD EFFECT TRANSISTOR AND THE RESULTING STRUCTURE

BACKGROUND

Field of the Invention

The present invention relates to integrated circuits (IC) and, more particularly, to embodiments of a method for forming an IC that includes at least one gate-all-around field effect transistor (GAAFET) and to embodiments of an IC structure formed according to the method.

Description of Related Art

Integrated circuit (IC) design decisions are often driven by device performance, scalability, and manufacturability. For example, recently, to improve device drive current and electrostatics and to allow for further device size scaling, gate-all-around field effect transistors (GAAFETs) (e.g., nanowire-type GAAFETs or nanosheet-type GAAFETs) were developed. A GAAFET includes elongated nanoshape(s) (e.g., nanowires or nanosheets), which extend laterally between source/drain regions, and a gate structure, which wraps around the nanoshape(s) (i.e., which is adjacent to the top, bottom and two opposing sides of the each nanoshape) such that the nanoshape(s) function as channel region(s). However, with continued device size scaling, conventional GAAFET processing techniques may no longer be suitable and, particularly, may no longer allow for proper formation of epitaxial source/drain regions.

SUMMARY

In view of the foregoing, disclosed herein are method embodiments for forming an integrated circuit (IC) structure having at least one gate-all-around field effect transistor (GAAFET) and, particularly, at least one nanowire-type field effect transistor (NWFET). In the method embodiments, a sacrificial gate can be formed on a multi-layer fin. Then, sidewall spacer processing can be performed such that a gate section of a sidewall spacer is formed on the sacrificial gate and fin sections are formed on exposed portions of the fin. Either before or after selective removal of the exposed portions of the fin, the fins sections of the sidewall spacer can be completely removed or at least reduced in size without significantly impacting the integrity of the gate section. As a result, the areas within which the transistor source/drain regions are to be formed will not be bound by the original fin sections of the sidewall spacer. Furthermore, any isolation material, which is deposited into these areas prior to epitaxial source/drain region formation and which is used to form the isolation elements that will provide electrical isolation between the transistor gate and source/drain regions, can be selectively removed without impacting the integrity of the isolation elements. Thus, the method embodiments include processes that allow for device size scaling while still ensuring proper formation of epitaxial source/drain regions. Techniques are also disclosed for the simultaneous formation, on the same semiconductor substrate, of different types of GAAFET (e.g., one or more nanosheet-type field effect transistors (NSFETs)) and/or fin-type field effect transistor (FINFETs). Also disclosed herein are IC structure embodiments formed using the above-described method.

More particularly, embodiments of the disclosed method include providing a semiconductor substrate, which is made of a first semiconductor material, and forming, on the substrate, one or more semiconductor fins, including at least one multi-layer semiconductor fin, which includes alternating layers of a second semiconductor material and the first semiconductor material. The embodiments of the method can further include forming at least a first transistor and, particularly, a nanowire-type field effect transistor (NWFET) using a multi-layer semiconductor fin.

In some embodiments of the method, the process of forming of the first transistor can include forming a sacrificial gate on a first portion of the multi-layer semiconductor fin such that second portions of the multi-layer semiconductor fin extend laterally beyond the sacrificial gate. Sidewall spacer processing can then be performed in order to form a sidewall spacer, having a gate section on the sacrificial gate and fin sections on the exposed second portions of the multi-layer semiconductor fin. The exposed second portions of the multi-layer semiconductor fin can be selectively removed to create source/drain openings, which are initially defined by the fin sections of the sidewall spacer and which expose vertical surfaces of the first semiconductor material and the second semiconductor material on opposing sides of the remaining first portion of the multi-layer semiconductor fin. The source/drain openings can be widened (i.e., the size of each source/drain opening) can be increased. Then, exposed vertical surfaces of the second semiconductor material in the first portion of the multi-layer semiconductor fin can be etched back to form cavities. An isolation layer can be conformally deposited to at least fill the cavities. A selective isotropic etch process can then be performed in order to remove the isolation layer from the source/drain openings. This selective isotropic etch process can also specifically be stopped prior to removal of the isolation layer from the cavities such that isolation elements remain within the cavities. Source/drain regions can then be formed in the widened source/drain openings and additional process steps can be performed in order to complete the transistor structure. By widening the source/drain openings, this method embodiment ensures that the isolation layer can be removed from the source/drain openings and, thus, ensures that source/drain region formation is not blocked.

To enable widening of the source/drain openings, the following exemplary processes can be performed. During sidewall spacer processing, a multi-layer sidewall spacer can be formed. Specifically, a first spacer layer can be conformally deposited and selectively and anisotropically etched. Then, a second spacer layer can be conformally deposited and selectively and anisotropically etched. As a result, a multi-layer sidewall spacer is formed. After the multi-layer sidewall spacer is formed, a first layer of interlayer dielectric (ILD) material can be formed so as to laterally surround the first transistor and further so that the top surface of this first layer of ILD material is at or below the level of the top surfaces of the fin sections. The exposed second portions of the multi-layer semiconductor fin can then be removed, thereby forming the source/drain openings. These source/drain openings can then be widened by performing a selective isotropic etch process to remove the first spacer layer of the fin sections of the sidewall spacer from the source/drain openings and then performing another selective isotropic etch process to completely remove the second spacer layer. It should be noted that the first spacer layer of the gate section will be protected by the second spacer layer when the exposed portion of the first spacer layer is etched out of the source/drain openings.

Alternatively, to enable widening of the source/drain openings, the following exemplary processes can be performed. During sidewall spacer processing, a thick sidewall spacer can be formed. That is, a thick spacer layer can be conformally deposited and a selective anisotropic etch process can be performed in order to form the thick sidewall spacer. After the thick sidewall spacer is formed, the exposed second portions of the multi-layer semiconductor fin can be removed, thereby forming the source/drain openings. These source/drain openings can then be widened by performing a selective isotropic etch process to reduce the size of (or completely remove) the fin sections. It should be noted that the gate section will only have one exposed side and, thus, will be etched at a much slower rate than the fin sections. The selective isotropic etch process should be stopped prior to exposure of the sacrificial gate.

In another embodiment of the method, the process of forming of the first transistor can similarly include forming a sacrificial gate on a first portion of the multi-layer semiconductor fin such that second portions of the multi-layer semiconductor fin extend laterally beyond the sacrificial gate. Sidewall spacer processing can then be performed in order to form a sidewall spacer, having a gate section on the sacrificial gate and fin sections on the exposed second portions of the multi-layer semiconductor fin. After the sidewall spacer is formed, a protective cap can be formed on the gate section only of the sidewall spacer. Specifically, a sacrificial material layer can be formed adjacent to the sidewall spacer such that a top surface of the sacrificial material layer is above the level of the top surfaces of the fin sections and at or below the level of the top surface of the gate section. A protective cap layer can be conformally deposited and a selective anisotropic etch process can be performed in order to form the protective cap on the gate section of the sidewall spacer. The fin sections only of the sidewall spacer can then be removed. Specifically, a selective anisotropic etch process can be performed to remove the fin sections of the sidewall spacer and, during this selective anisotropic etch process, the protective cap protects the gate section of the sidewall spacer such that the gate section remains intact. Removal of the fin sections exposes the second portions of the multi-layer semiconductor fin and, once exposed, the second portions of the multi-layer semiconductor fin can be selectively removed, thereby exposing designated areas for source/drain region formation as well as vertical surfaces of the first semiconductor material and the second semiconductor material on opposing sides of the remaining first portion of the multi-layer semiconductor fin. Exposed vertical surfaces of the second semiconductor material of the first portion of the multi-layer semiconductor fin can then be selectively etched back to form cavities. An isolation layer can be conformally deposited so as to at least fill the cavities. Then, a selective isotropic etch process can be performed in order to completely remove the isolation layer from the designated areas for source/drain region formation. This selective isolation region can, however, specifically be stopped prior to removal of the isolation layer from the cavities such that isolation elements remain in the cavities. Source/drain regions can then be formed in the designated areas for source/drain region formation and additional process steps can be performed in order to complete the transistor structure. By removing the fin sections of the sidewall spacer, this method embodiment ensures that the isolation layer can be removed from areas outside the cavities and, thus, ensures that source/drain region formation is not blocked.

Also disclosed herein are embodiments of an integrated circuit (IC) structure formed according to the method embodiments discussed above.

For example, one embodiment of an IC structure disclosed herein includes a substrate and a first transistor and, more particularly, a nanowire-type field effect transistor (NWFET) on the substrate.

The first transistor can include source/drain regions on the substrate and at least channel region and, particularly, a nanowire (NW) channel region that extends laterally between the source/drain regions. Specifically, each channel region can have top, bottom and side surfaces and can further have end portions immediately adjacent to the source/drain regions, respectively. Each channel region can further have a first width, which is, for example, less than or equal to 15 nanometers. Each source/drain region can further have a lower portion and an upper portion above the lower portion. The lower portion of each source/drain region can have essentially vertical sidewalls and a second width that is greater than the first width (e.g., that is at least 10 nanometers greater than the first width). Optionally, the size of the upper portion can be different than that of the lower portion. For example, the upper portion can be narrower in width than the lower portion. The first transistor can further include a gate adjacent to the top, bottom and side surfaces of each nanowire channel region. The first transistor can further include a sidewall spacer and isolation elements that electrically isolate the gate from the source/drain regions. Specifically, the sidewall spacer can be adjacent to outer sidewalls of the gate. The isolation elements can be below the end portions of each nanowire channel region and can positioned laterally between the gate and the source/drain regions.

The IC structure can further include a first layer of interlayer dielectric material on the substrate and laterally surrounding a lower region of the first transistor, an etch stop layer on the top surface of the first layer of interlayer dielectric material and a second layer of interlayer dielectric material on the etch stop layer. The top surface of the first layer of interlayer dielectric material can be approximately level with the interface between the lower portion and the upper portion of each source/drain region. Furthermore, the top surface of the upper portion of each source/drain region can, specifically, be above the level of the top surface of the etch stop layer and below the level of the top surface of the second layer of interlayer dielectric material.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
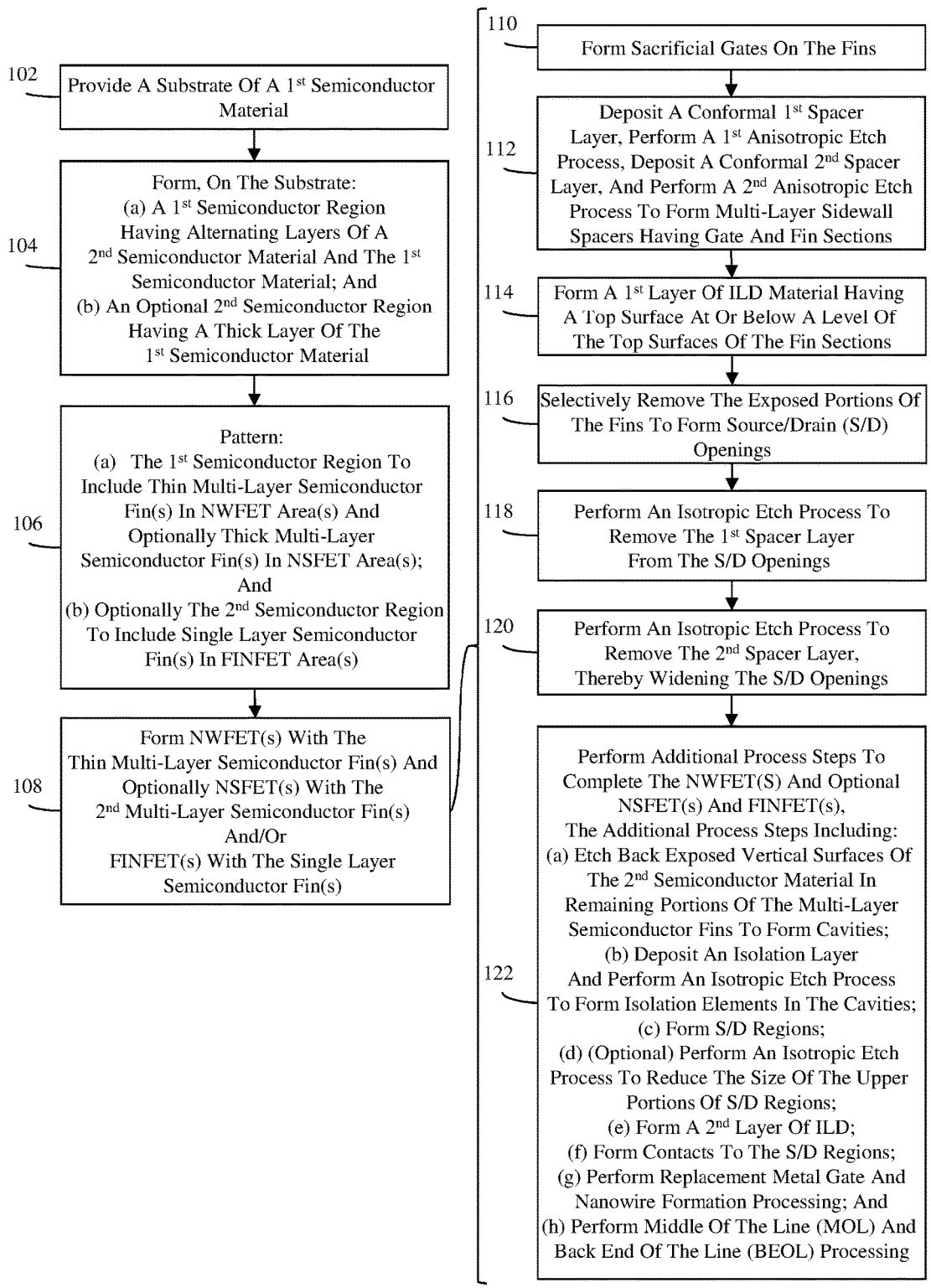
FIG. 1 is a flow diagram illustrating an embodiment of a method of forming an integrated circuit (IC) structure having at least one gate-all-around field effect transistor (GAAFET)

As mentioned above, integrated circuit (IC) design decisions are often driven by device performance, scalability, and manufacturability. For example, recently, to improve device drive current and electrostatics and to allow for further device size scaling, gate-all-around field effect transistors (GAAFETs) (e.g., nanowire-type GAAFETs or nanosheet-type GAAFETs) were developed. A GAAFET includes elongated nanoshape(s) (e.g., nanowires or nanosheets), which extend laterally between source/drain regions, and a gate structure, which wraps around the nanoshape(s) (i.e., which is adjacent to the top, bottom and two opposing sides of the each nanoshape) such that the nanoshape(s) function as channel region(s). However, with continued device size scaling, conventional GAAFET processing techniques may no longer be suitable and, particularly, may no longer allow for proper formation of epitaxial source/drain regions.

Specifically, current GAAFET processing techniques begin with a semiconductor substrate of a $1^{st}$ semiconductor material and form, on that substrate, a stack of alternating layers of different semiconductor materials (e.g., a second semiconductor material and the first semiconductor material). The stack is then patterned into a semiconductor fin. A sacrificial gate is formed on a first portion of the semiconductor fin with second portions of the semiconductor fin extending laterally beyond the sacrificial gate. A gate sidewall spacer is formed on the sacrificial gate. Given the height of the semiconductor fin, formation of the gate sidewall spacer on the sacrificial gate also results in formation of a fin sidewall spacer on the exposed second portions of the semiconductor fin. Subsequently, the second portions of the semiconductor fin are selectively removed and exposed vertical surfaces of the second semiconductor material in the first portion of the semiconductor fin are etched back, thereby forming shallow cavities. Isolation elements are formed in these cavities, for example, by conformally depositing a thin isolation layer and performing a selective isotropic etch process to remove any of the isolation layer material that is outside the cavities. Next, epitaxial source/drain regions are grown adjacent to exposed vertical surfaces of the first semiconductor material in the first portion of the semiconductor fin.

With continued device size scaling, however, when the second portions of the semiconductor fin are removed, the resulting source/drain openings defined by the fin sidewall spacer can be very narrow and, more particularly, can have a very high aspect ratio (i.e., can be very tall and narrow). In this case, the isotropic etch process that is used during formation of the isolation elements may not be sufficient to completely remove the isolation layer material from the source/drain openings. Any isolation layer material that remains in the source/drain openings will block epitaxial source/drain region formation. Unfortunately, extending the etch time to allow for complete removal of the isolation layer material from the source/drain openings also results in removal of the isolation elements.

In view of the foregoing, disclosed herein are method embodiments for forming an integrated circuit (IC) structure having at least one gate-all-around field effect transistor (GAAFET) and, particularly, at least one nanowire-type field effect transistor (NWFET). In the method embodiments, a sacrificial gate can be formed on a multi-layer fin. Then, sidewall spacer processing can be performed such that a gate section of a sidewall spacer is formed on the sacrificial gate and fin sections are formed on exposed portions of the fin. Either before or after selective removal of the exposed portions of the fin, the fins sections of the sidewall spacer can be completely removed or at least reduced in size without significantly impacting the integrity of the gate section. As a result, the areas within which the transistor source/drain regions are to be formed will not be bound by the original fin sections of the sidewall spacer. Furthermore, any isolation material, which is deposited into these areas prior to epitaxial source/drain region formation and which is used to form the isolation elements that will provide electrical isolation between the transistor gate and source/drain regions, can be selectively removed without impacting the integrity of the isolation elements. Thus, the method embodiments include processes that allow for device size scaling while still ensuring proper formation of epitaxial source/drain regions. Techniques are also disclosed for the simultaneous formation, on the same semiconductor substrate, of different types of GAAFET (e.g., one or more nanosheet-type field effect transistors (NSFETs)) and/or fin-type field effect transistor (FINFETs). Also disclosed herein are IC structure embodiments formed using the above-described method.

More particularly, some method embodiments disclosed herein form an integrated circuit (IC) structure with one or more transistors including at least one nanowire-type field effect transistor (NWFET) and, optionally, a nanosheet-type field effect transistor (NSFET) and/or a fin-type field effect transistor (FINFET). In these method embodiments, during formation of the transistor(s), exposed portions of semiconductor fin(s) can be selectively removed to form source/drain openings and the source/drain openings can then be widened (or removed all together) to ensure proper source/drain region formation therein.

Figure 2:
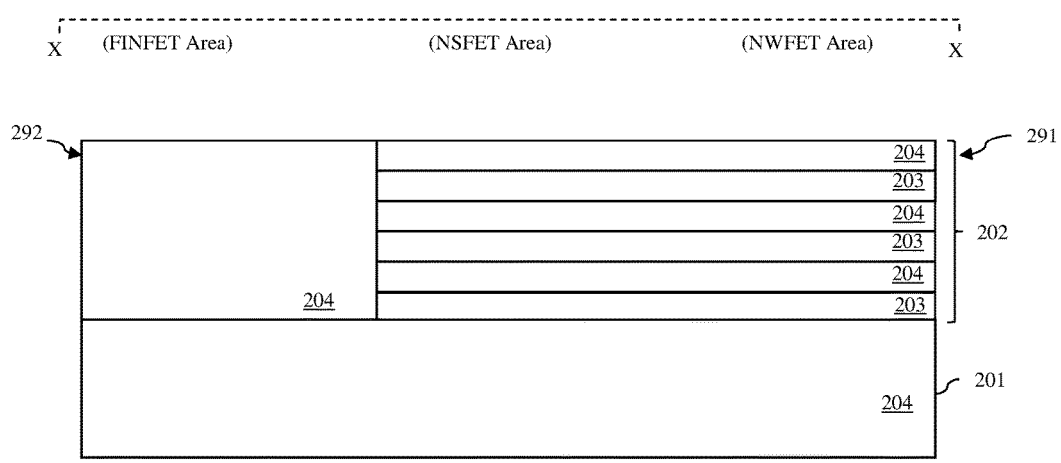
FIG. 2 is a cross-section diagram illustrating a partially completed IC structure formed according to the flow diagram of FIG. 1.

For example, referring to the flow diagram of FIG. 1, one method embodiment disclosed herein can include providing a semiconductor substrate 201 (see process 102 and FIG. 2). The semiconductor substrate 201 can be, for example, a bulk semiconductor substrate made of a first semiconductor material 204. This first semiconductor material 204 can be, for example, monocrystalline silicon. Alternatively, the semiconductor substrate 201 can be the semiconductor layer of a semiconductor-on-insulator structure.

A first semiconductor region 291 and, optionally, a second semiconductor region 292 can be formed on the substrate 201 (see process 104, see FIG. 2). The first semiconductor region 291 can subsequently be used for forming gate-all-around field effect transistors (GAAFETs), including nanowire-type field effect transistors (NWFETs) in NWFET areas and nanosheet-type field effect transistors (NSFETs) in NSFET areas, as discussed in greater detail below, and can include a multi-layer stack 202 including alternating layers of a second semiconductor material 203 and the first semiconductor material 204. That is, in this first semiconductor region an initial layer of the second semiconductor material 203 can be immediately adjacent to the top surface of the substrate 201, an initial layer of the first semiconductor material 204 can be on the initial layer of the second semiconductor material 203, another layer of the second semiconductor material 203 can be on the initial layer of the first semiconductor material 204, and so on. The optional second semiconductor region 292 can subsequently be used for forming fin-type field effect transistors (FINFETs) in FINFET areas, as discussed in greater detail below, and can include a thick layer of the first semiconductor material 204. The first semiconductor region 291 and the optional second semiconductor region 292 can have equal thicknesses. That is, the top surface of the multi-layer stack 202 in the first semiconductor region 291 and the top surface of the thick layer in the optional second semiconductor region 292 can be co-planar.

To form the two semiconductor regions 291-292, alternating layers of different semiconductor materials 203 and 204 can be formed on the semiconductor substrate by, for example, epitaxial deposition. The first semiconductor material 204 can, as mentioned above, be monocrystalline silicon. The second semiconductor material 203 can be monocrystalline silicon germanium or any other suitable semiconductor material, which can be used to grow monocrystalline silicon and which can be selectively etched away from monocrystalline silicon during subsequent processing. A hard mask layer (e.g., a silicon nitride layer) can be formed on the top surface of the stack of alternating layers of different semiconductor materials. A photoresist layer can be deposited and patterned (e.g., using lithographic patterning techniques) in order to expose the portion(s) of the hard mask layer in area(s) designated for FINFET formation. Then, selective anisotropic etch processes can be performed in order to remove the exposed portion(s) of the hard mask layer and to further remove the portion(s) of the stack of alternating layers of different semiconductor materials below, thereby exposing the semiconductor substrate in the area(s) designated for FINFET formation. During these selective anisotropic etch processes the portion(s) of the stack of alternating layers of different semiconductor materials in area(s) designated for GAAFET formation will be protected. The remaining portion(s) of the photoresist layer can then be removed and the thick layer of the first semiconductor material 204 can be formed by epitaxial deposition on the top surface of the semiconductor substrate in the area(s) designated for FINFET formation. The remaining portion(s) of the hard mask layer can then be removed.

For purposes of illustration, the multi-layer stack 202 is shown in FIG. 2 as having six total layers including three layers of the second semiconductor material 203 and three layers of the first semiconductor material 204. However, it should be understood that the figures are not intended to be limiting and that, alternatively, the multi-layer stack could include a total of at least two layers including one layer of the second semiconductor material and one layer of the first semiconductor material 204 so that, in the resulting IC structure, any gate-all-around field effect transistors (GAAFETs) have at least channel region in the form of an elongated nanoshape. Additionally, it should be noted that the thickness of each of the layers of the first semiconductor material 204 in the multi-layer stack should be equal to the desired height of the elongated nanoshape(s), which will form the channel region(s) of GAAFETs. Furthermore, the thickness of each of the layers of the second semiconductor material should be equal to the desired substrate to channel region or channel region to channel region spacing.

For purposes of this disclosure, an elongated semiconductor nanoshape (NS) refers to a feature having a length that is relatively long as compared to its thickness (also referred to herein as its height) and/or its width (also referred to herein as its depth) and further having its thickness and/or its width dimensions constrained to tens of nanometers or less (i.e., constrained to 100 nm or less, for example, to approximately 5-8 nm). Nanoshapes include nanowires, nanosheets and nanofins. Specifically, a nanowire (NW) refers to a nanoshape having both its thickness (or height) and its width (or depth) dimensions constrained to tens of nanometers or less (i.e., constrained to 100 nm or less, for example, to approximately 5-8 nm) and having the ratio of the thickness dimension to the width dimension being, for example, approximately 1 to 1. That is, a nanowire is relatively narrow and short. A GAAFET that includes NW(s) as channel region(s) is referred to herein as a nanowire-type FET (NWFET). A nanosheet (NS) refers to a nanoshape having only its thickness dimension (or height) constrained to tens of nanometers or less (i.e., constrained to 100 nm or less, for example, to approximately 5-8 nm) and having the ratio of the width (or depth) dimension to the thickness (or height) dimension being, for example, significantly over 1 to 1 (e.g., 2 to 1, 5 to 1, 10 to 1, 100 to 1, etc.). That is, a nanosheet is relatively wide and short. A GAAFET that includes NS(s) as channel region(s) is referred to herein as a nanosheet-type FET (NSFET). A nanofin refers to a nanoshape having only its width (or depth) dimension constrained to tens of nanometers or less (i.e., constrained to 100 nm or less, for example, to approximately 5-8 nm) and having the ratio of the width (or depth) dimension to the thickness (or height) dimensions being, for example, significantly less than 1 to 1 (e.g., 1 to 2, 1 to 5, 1 to 10, 1 to 100, etc.). That is, a nanofin is relatively narrow and tall. Fin-type FETs (FINFETs) include one or more nanofins as channel region(s).

Figure 3A:
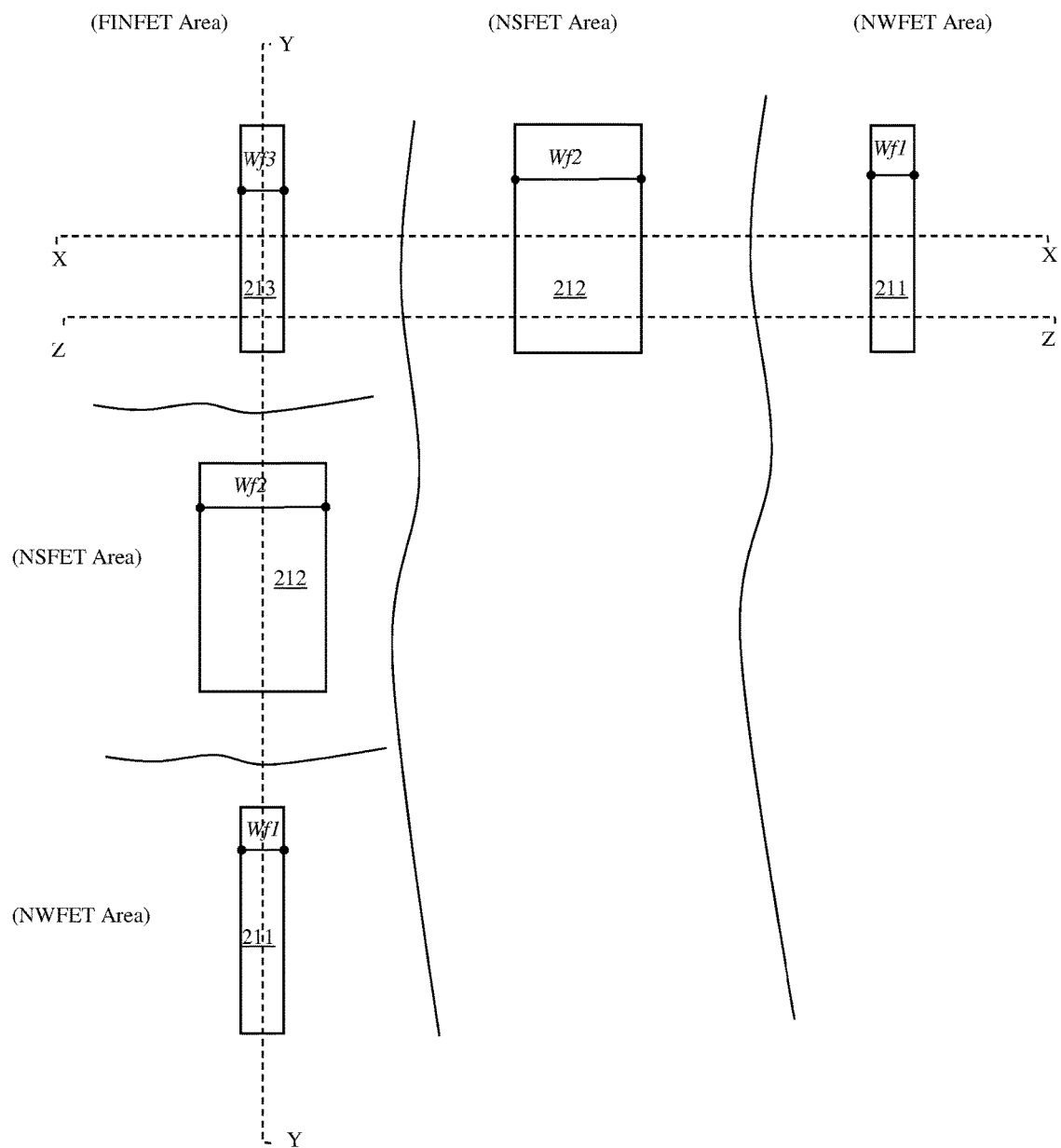
FIG. 3A is an exemplary plan view diagram and FIGS. 3B-3C are different cross-section diagrams illustrating a partially completed IC structure formed according to the flow diagram of FIG. 1.
Figure 3B:
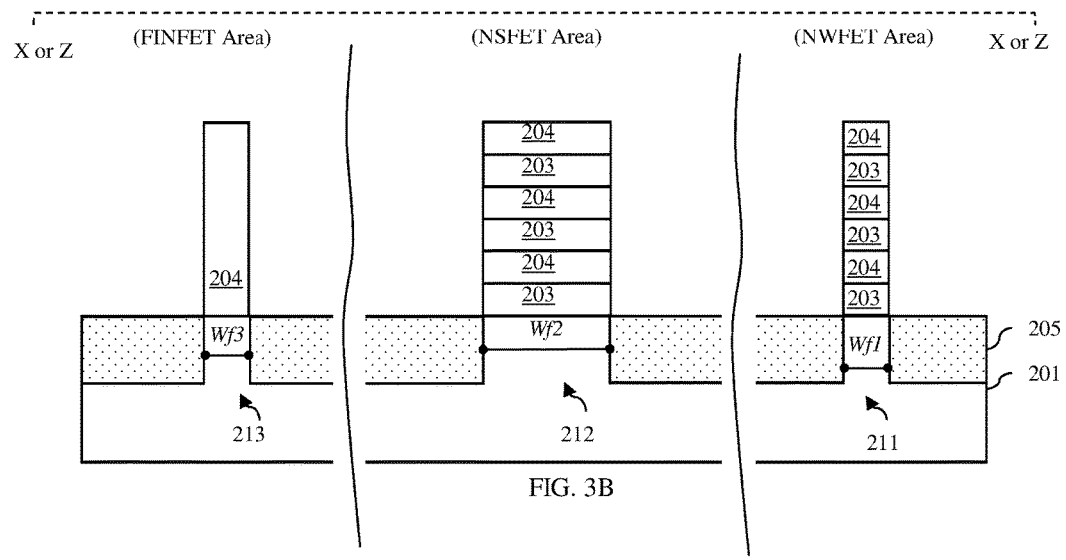

In any case, the first semiconductor region 291 and, optionally, the second semiconductor region 292 can be patterned into one or more fin-shaped semiconductor bodies 211-213 and, particularly, one or more semiconductor fins to be used in the formation one or more field effect transistors (FETs) (see process 106 and FIGS. 3A-3B). For purposes of this disclosure, a "fin" refers to an elongated, relatively tall, essentially rectangular shaped-body. At process 106, the first semiconductor region 291 can be patterned and etched to form the following: at least one relatively narrow multi-layer semiconductor fin 211 to be used for making NW(s) for a first transistor and, particularly, for a NWFET in a NWFET area; and at least one relatively wide multi-layer semiconductor fin 212 to be used for making NS(s) for a second transistor and, particularly, for a NSFET in a NSFET area. The second semiconductor region 292 can optionally be patterned and etched to form at least one relatively narrow single-layer semiconductor fin 213 for a third transistor and, particularly, for a FINFET in a FINFET area. The patterning and etch processes can be performed such that the multi-layer semiconductor fin 211 has a width (Wf1), which is equal to or less than 15 nanometers, such that the multi-layer semiconductor fin 212 has a width (Wf2) that is wider than the width (Wf1) of the multi-layer semiconductor fin 211 (e.g., such that the multi-layer semiconductor fin 212 is 20 nanometers or more wider than the multi-layer semiconductor fin 211), and such that the single-layer semiconductor fin 213 has a width (Wf3) that is essentially the same or similar as the width (Wf1) of the multi-layer semiconductor fin 211. In any case, conventional processing techniques (e.g., lithographic patterning and etch techniques, sidewall image transfer (SIT) techniques, etc.) can be performed at process 106, etching into through the semiconductor regions 291-292 and into the substrate 201 such that the resulting semiconductor fins 211-213 extend vertically upward from a lower portion of the substrate 201.

Figure 3C:
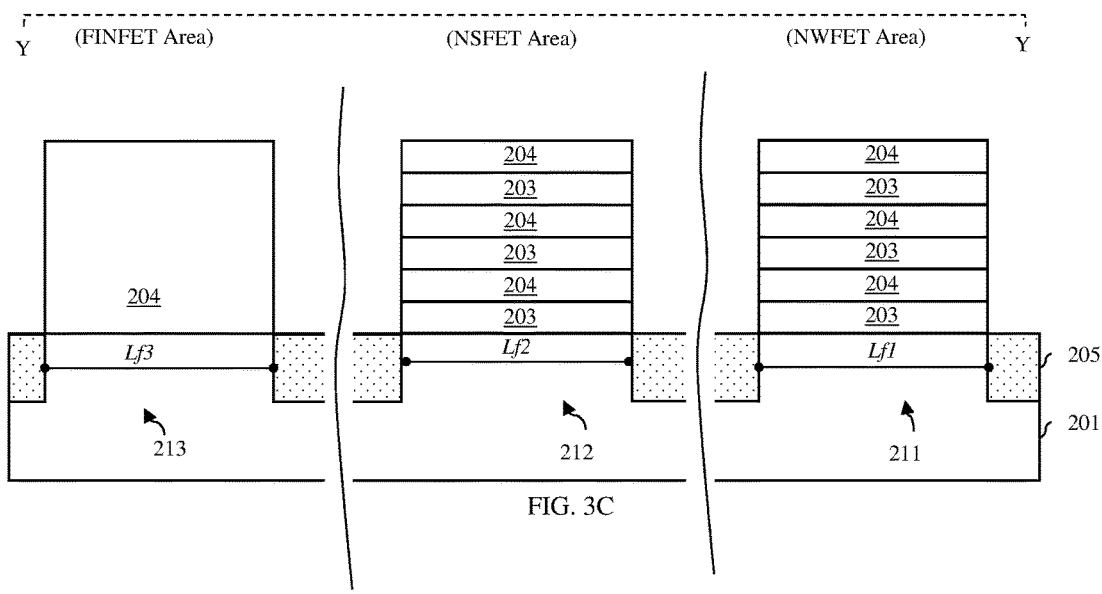
Figure 4A:
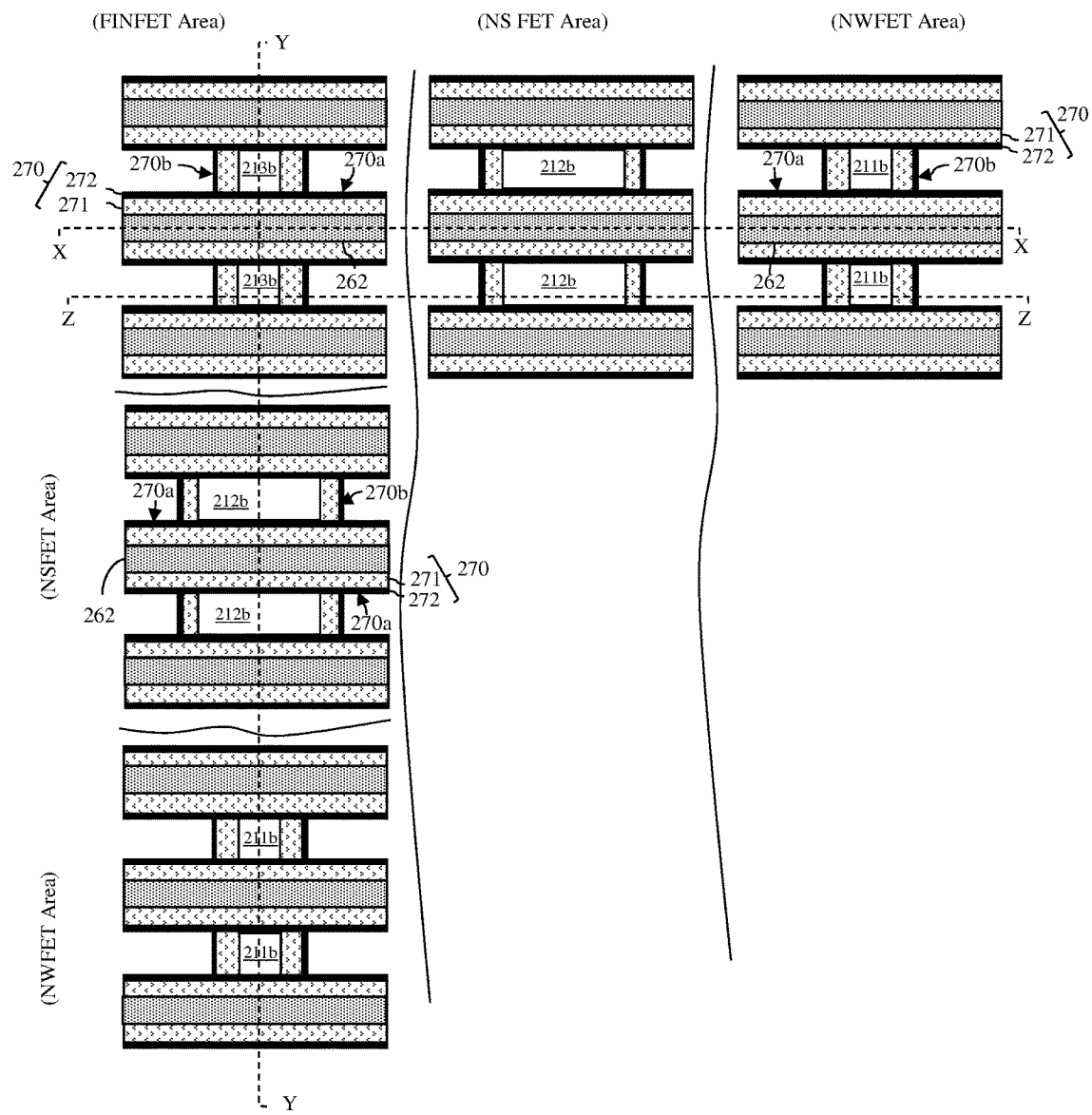
FIG. 4A is a top view diagram and FIGS. 4B-4D are different cross-section diagrams illustrating a partially completed IC structure formed according to the flow diagram of FIG. 1.
Figure 4B:
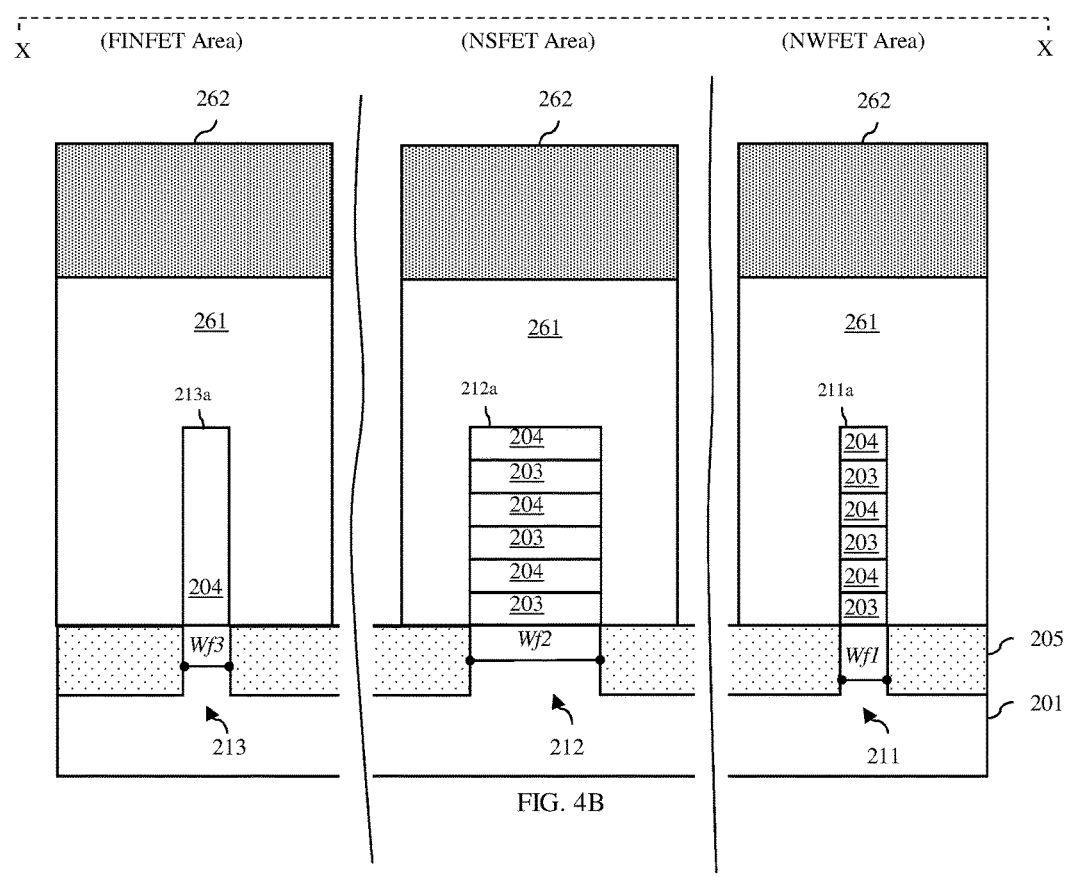
Figure 4C:
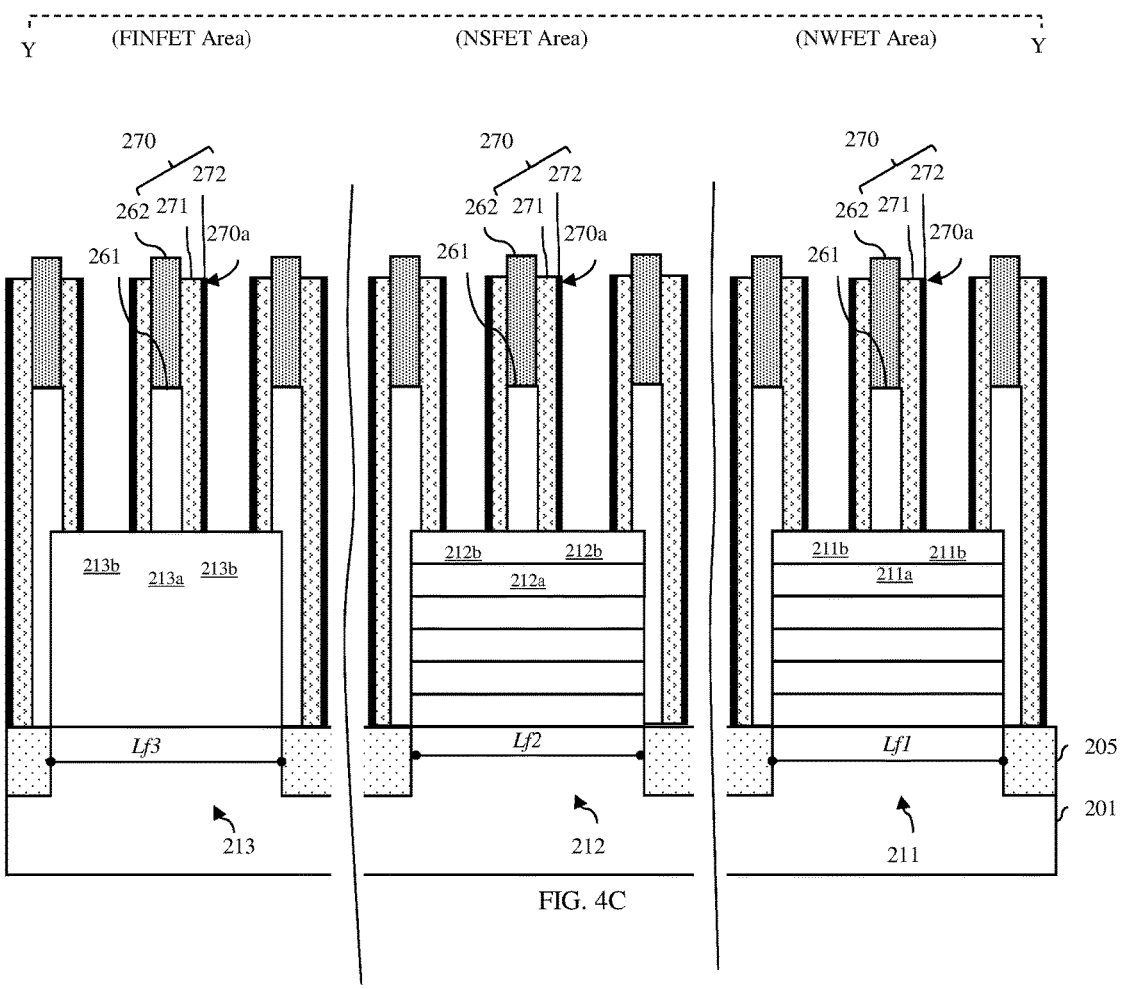
Figure 4D:
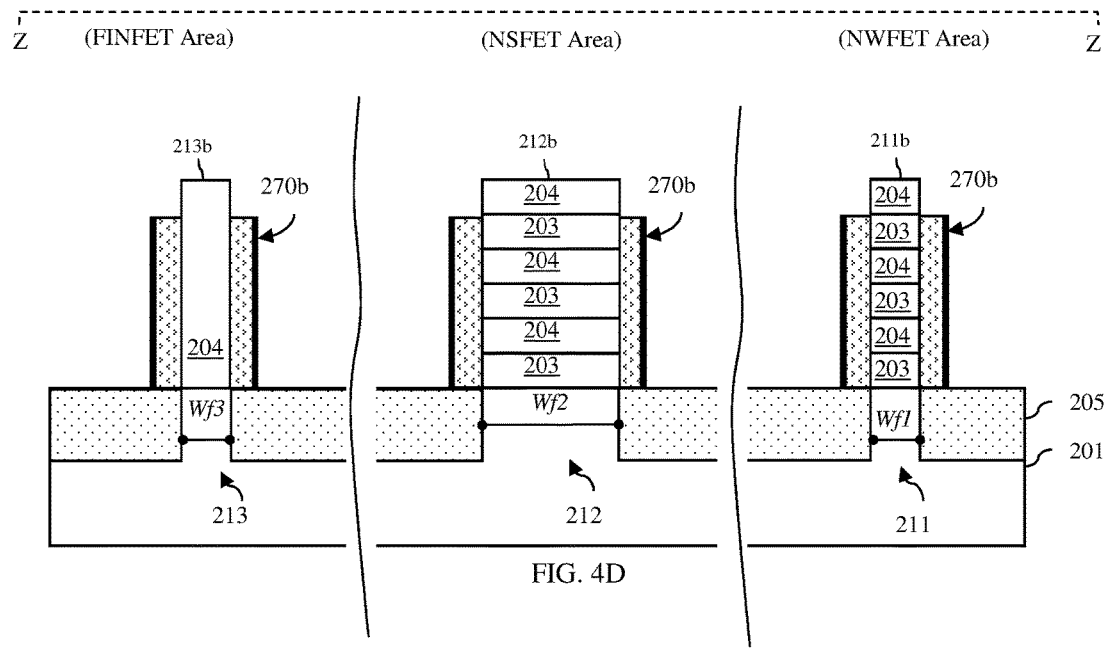

FIG. 3A is an exemplary plan view diagram showing a row of fins including a single-layer semiconductor fin 213 for a FINFET in a FINFET area; a wide multi-layer semiconductor fin 212 for a NSFET in a NSFET area; and a narrow multi-layer semiconductor fin 211 for a NWFET in a NWFET area. FIG. 3A further shows a column of fins including the single-layer semiconductor fin 213 for the FINFET mentioned above, another wide multi-layer semiconductor fin 212 for another NSFET in another NSFET area, and another narrow multi-layer semiconductor fin 211 for another NWFET in another NWFET area. FIG. 3B shows the row of fins in cross-section XX, which cuts across the width of each fin in the row at a designated channel region. Furthermore, at this point in processing, FIG. 3B also shows the row of fins in cross-section ZZ, which cuts across the width of each fin in the row at a designated source/drain region. FIG. 3C shows the column of fins in cross-section ZZ, which cuts across the length of each fin in the column. The curved lines between the FINFET, NSFET and NWFET areas in the row and in the column are provided in order to indicate that these areas and any fins contained therein will be found at different locations on a chip and not actually immediately adjacent to each other as shown. It should be noted that subsequent process steps are described below and illustrated in the drawings with reference to these same cross-sections XX, YY, and ZZ.

An isolation region 205 can then be formed on the lower portion of the substrate 201 so as to laterally surround the lower portions of each of the semiconductor fins 211-213 with the top surface of the isolation region being approximately level with a top surface of the substrate 201 (i.e., approximately level with a bottom surface of the semiconductor regions 291-292). The isolation region 205 can be formed, for example, by depositing one or more layers of isolation material (e.g., a conformal layer of a first dielectric material, such as silicon nitride, and a blanket layer of a second dielectric material, such as silicon dioxide). The isolation material can subsequently be etched back to form the isolation region 205, as described. It should be noted that, alternatively, this isolation region 205 could be formed in subsequent processing.

Those skilled in the art will recognize that in the case of an SOI structure, the semiconductor fins 211-213 would be etched through the semiconductor regions and the semiconductor layer stopping on the insulator layer such that the semiconductor fins extend vertically upward from the isolation layer. In this case, no isolation region 205 need be formed.

Additional processing can then be performed in order to form first transistors and, particularly, NWFETs using the multi-layer semiconductor fins 211 and, optionally, in order to concurrently form second transistors and, particularly, NSFETs using the multi-layer semiconductor fins 212 and/or third transistors and, particularly, FINFETs using the single-layer semiconductor fins 213 (see process 108). For purposes of illustration, process step 108 is described below with respect to concurrently forming NWFETs, NSFETs and FINFETs. However, it should be understood that the description and figures are not intended to be limiting and that the method could be used for form an IC structure having only NWFET(s), having NWFET(s) and NSFET(s), having NWFET(s) and FINFET(s), or having NWFET(s), NSFET(s) and FINFET(s).

More specifically, sacrificial gates 261 with sacrificial gate caps 262 can be formed on the semiconductor fins 211, 212, 213 (see process 110 and FIGS. 4A-4D). For example, a thin conformal silicon dioxide layer (not shown) can be deposited over partially completed structure. A blanket sacrificial gate layer can be deposited onto the conformal silicon dioxide layer. This blanket sacrificial gate layer can be, for example, a polysilicon layer, an amorphous silicon layer or any other suitable sacrificial gate material that is different from the semiconductor materials of the semiconductor fins 211, 212, 213. The sacrificial gate layer can then be polished (e.g., using a chemical mechanical polishing (CMP) process) and a sacrificial cap layer (e.g., a silicon nitride cap layer) can be deposited onto the sacrificial gate layer, thereby forming a sacrificial gate stack. The sacrificial gate stack can then be lithographically patterned and etched to form the sacrificial gates 261 (with sacrificial gate caps 262) such that a sacrificial gate 261 with a sacrificial gate cap 262 is adjacent the top and opposing side surfaces of each first portion 211a, 212a, 213a (i.e., each designated channel area) of a fin and such that second portions 211b, 212b, 213b (i.e., designated source/drain areas) extend laterally beyond the sacrificial gate 261.

Those skilled in the art will recognize that sacrificial gates with gate sidewall spacers, as described above, will typically be patterned such that they are spaced evenly across the length of each semiconductor fin. Thus, as illustrated, each second portion 211b, 212b, 213b of a fin will extend laterally from a sacrificial gate 261 on a first portion 211a, 212a, 213a of the semiconductor fin to another sacrificial gate, which is either on an end of the fin (as illustrated) or on another first portion of the fin. As discussed in greater detail below, adjacent sacrificial gates are used to confine epi source/drain formation.

In any case, sidewall spacers 270 and, particularly, multi-layer sidewall spacers can then be formed such that each sidewall spacer 270 includes a gate section 270a adjacent to the sidewalls of a sacrificial gate 261 and fin sections 270b adjacent to the exposed second portions 211b, 212b, 213b of the semiconductor fin 211, 212, 213 (see process 112 and FIGS. 4A-4D). Specifically, a first spacer layer 271 made of a third dielectric material that is different from the first dielectric material and the second dielectric material can be conformally deposited over the sacrificial gate caps 262 on the sacrificial gates 261 and over the exposed second portions 211b, 212b, 213b of the semiconductor fins 211, 212, 213. As mentioned above, the first dielectric material can be, for example, silicon nitride and the second dielectric material can be, for example, silicon nitride. The third dielectric material can be, for example, silicon oxynitride (SiON), carbon-doped silicon oxynitride (SiONC), carbon-doped silicon (SiC), silicon carbon nitride (SiCN), silicon oxycarbide (SiCO), silicon boron carbon nitride (SBCN), hydrogenated silicon oxycarbide (SiCOH), etc. or any other suitable dielectric material different from the first and second dielectric materials. The first spacer layer can be relatively thick. For example, the conformal first spacer layer can be 4-8 nm (e.g., 6 nm) thick. The first spacer layer can then be anisotropically etched in order to selectively etch the first spacer layer away from horizontal top surfaces of the sacrificial gate caps 262, semiconductor fins 211-213 and isolation region 205 without exposing any vertical surfaces of the sacrificial gates 261. Next, a second spacer layer 272 made, for example, of the first dielectric material can be conformally deposited over the first spacer layer 271. The second spacer layer 272 can be relatively thin. For example, the second spacer layer 272 can be 1-3 nm (e.g., 2 nm) thick. The second spacer layer can then be anisotropically etched in order to selectively etch away horizontal portions of the second spacer layer, thereby forming the multi-layer sidewall spacers. Specifically, the resulting sidewall spacers 270 will each have multiple layers and will each have a gate section 270a covering the vertical surfaces of the sacrificial gates 261 and fin sections 270b, which are shorter than the gate section 270a, covering the vertical surfaces of the second portions 211b, 212b, 213b of the semiconductor fins 211, 212, 213.

Those skilled in the art will recognize that sacrificial gates are typically patterned so as to traverse multiple fins and are cut during subsequent processing (e.g., before or after replacement metal gate processing). Thus, sidewall spacers are not shown on the ends of the sacrificial gates in the plan view diagram of FIG. 4A and no sidewall spacers are shown in the cross-section XX of FIG. 4B.

Figure 5:
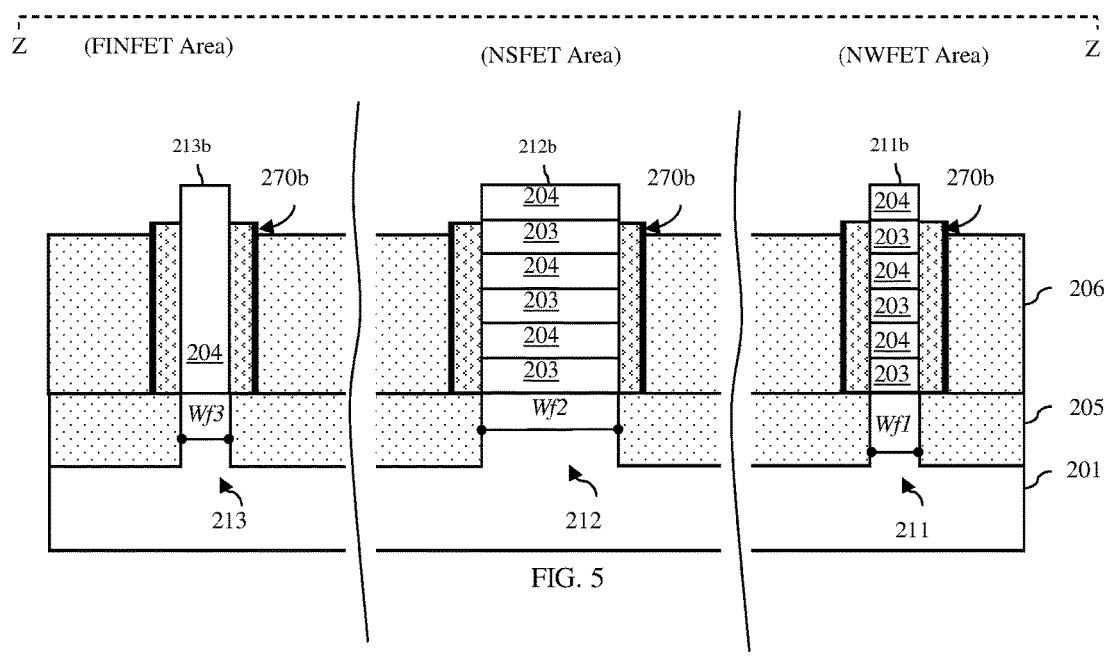
FIG. 5 is a cross-section diagram illustrating a partially completed IC structure formed according to the flow diagram of FIG. 1.

A first layer 206 of interlayer dielectric (ILD) material can be formed on the isolation region 205 and positioned laterally immediately adjacent to the fin sections 270b and filling the space between adjacent fin sections 270b (see process 114 and FIG. 5). The ILD material can be the same material as the second dielectric material (e.g., silicon dioxide). The ILD material can be either deposited using a directional deposition process or deposited and then etched back such that the top surfaces of the fins 211b, 212b, 213b and of the fin sections 270b of the sidewall spacers are above the level of the top surface of the first layer 206 of ILD material. Thus, the height of the first layer 206, as measured from the top of the isolation region 205 is less than the height of the fin sections 270b of the sidewall spacers.

Figure 6A:
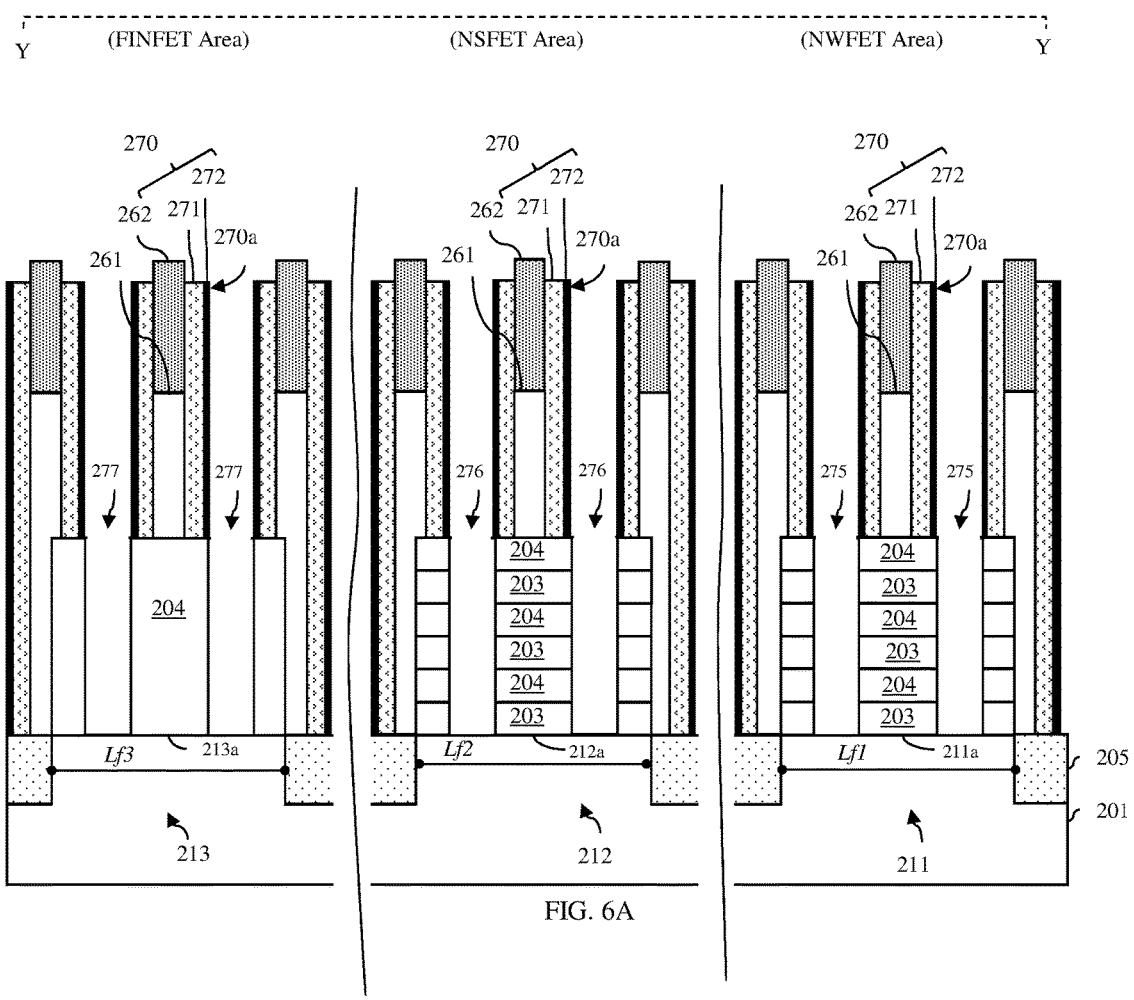
FIGS. 6A-6B are different cross-section diagrams illustrating a partially completed IC structure formed according to the flow diagram of FIG. 1.
Figure 6B:
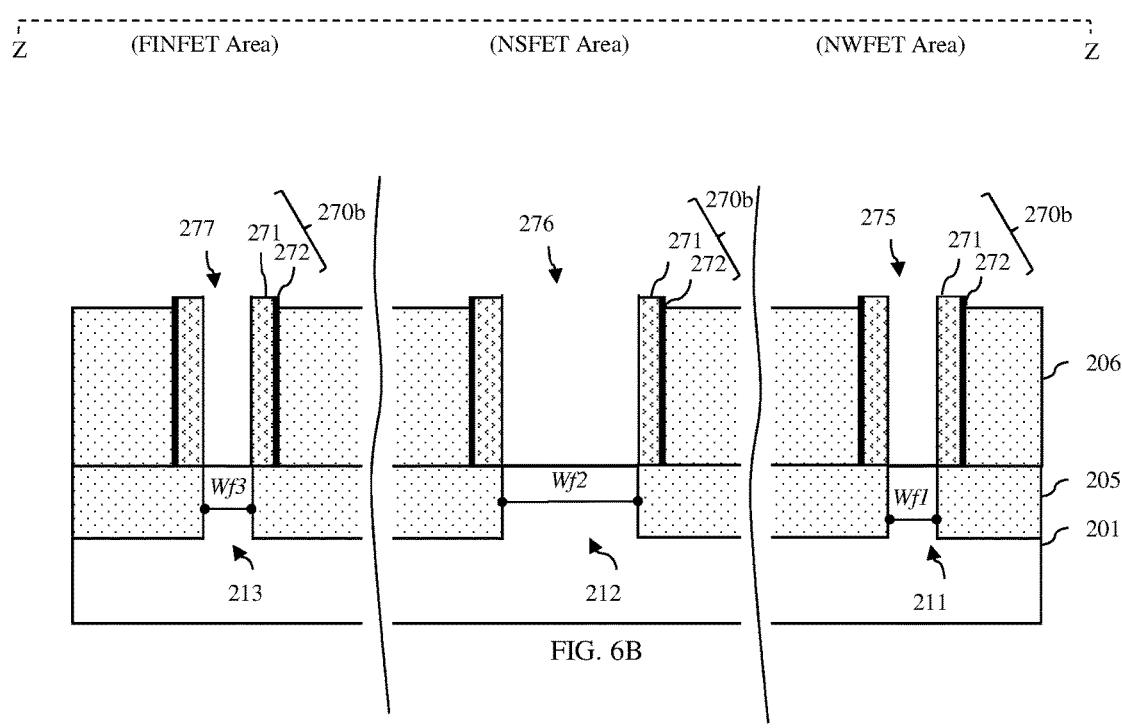

The exposed second portions 211b, 212b, 213b of the semiconductor fins 211, 212, 213 can then be selectively removed (see process 116 and FIGS. 6A-6B). Specifically, an anisotropic etch process can be performed, wherein the etch chemistries used are selective for the materials of the semiconductor fins over the adjacent materials of the first layer 206 of ILD material, the fin sections 270b of the sidewall spacers and the sacrificial gate caps 262. This process 116 of removing the second portions of the semiconductor fins 211, 212, 213, creates source/drain openings 275, 276, 277. Thus, as illustrated, the remaining first portions 211a, 212a, 213a of each semiconductor fin 211, 212, 213 will be positioned laterally between a pair of source/drain openings 275, 276, 277, respectively. However, due to the fact that the multi-layer semiconductor fin 211 and the single layer semiconductor fin 213 are so thin (e.g., less than 15 nm), the source/drain openings 275 and 277 may be unduly narrow and, more particularly, may have aspect ratios that are too high (as discussed above).

Figure 7A:
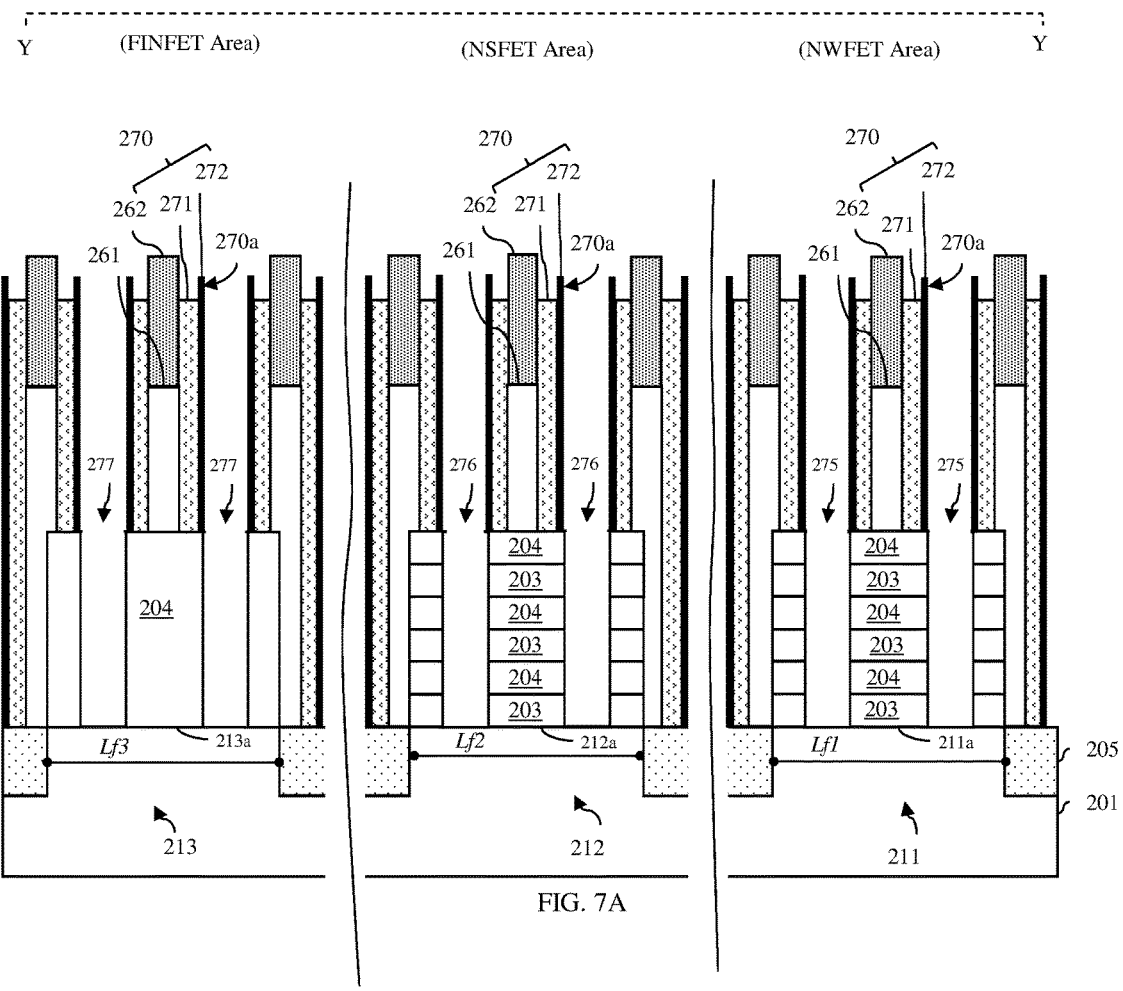
FIGS. 7A-7B are different cross-section diagrams illustrating a partially completed IC structure formed according to the flow diagram of FIG. 1.
Figure 7B:
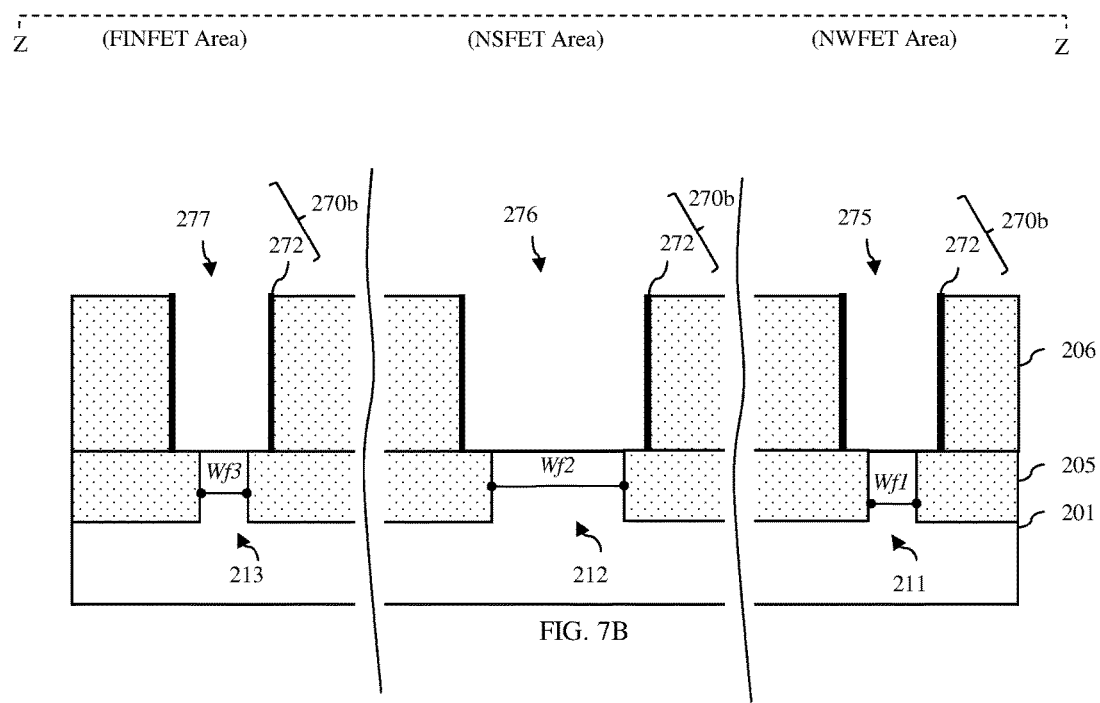
Figure 8A:
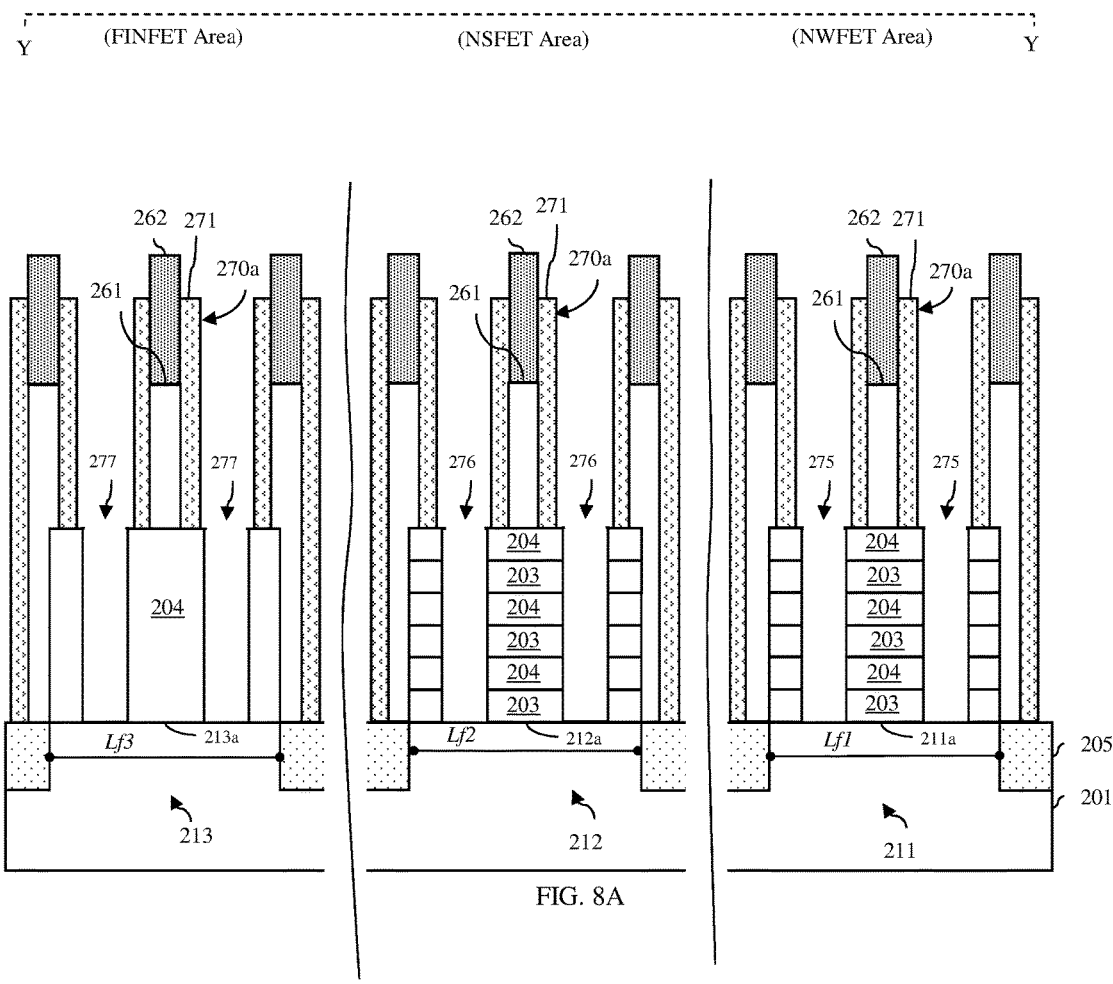
FIGS. 8A-8B are different cross-section diagrams illustrating a partially completed IC structure formed according to the flow diagram of FIG. 1.
Figure 8B:
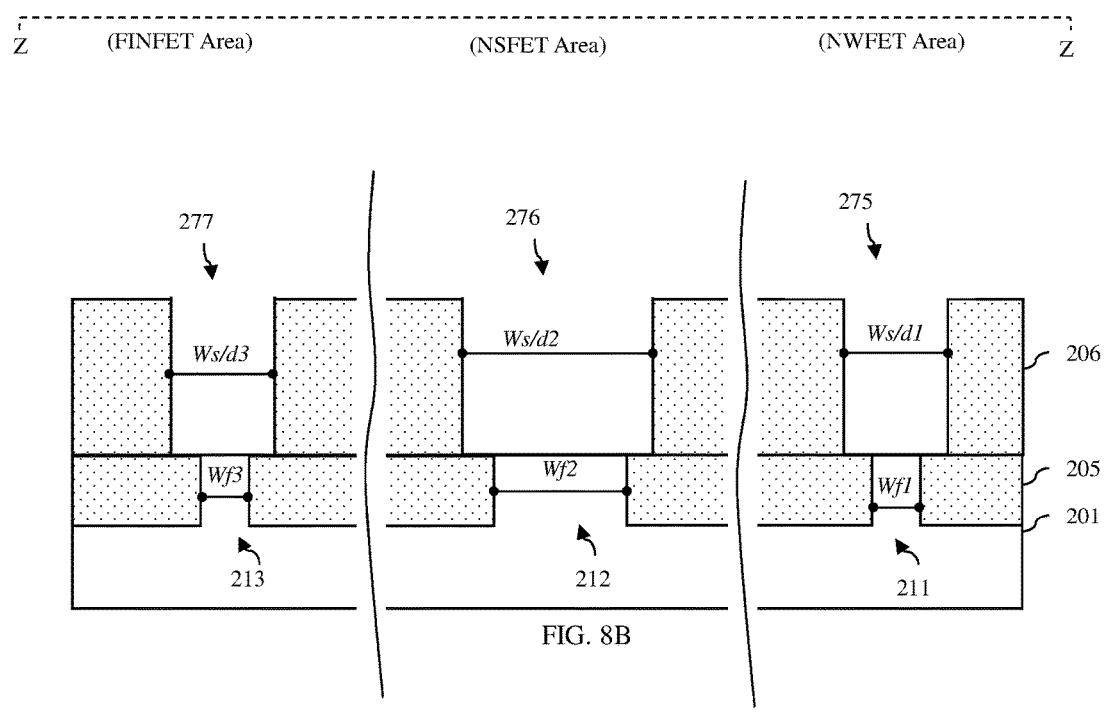
Figure 9:
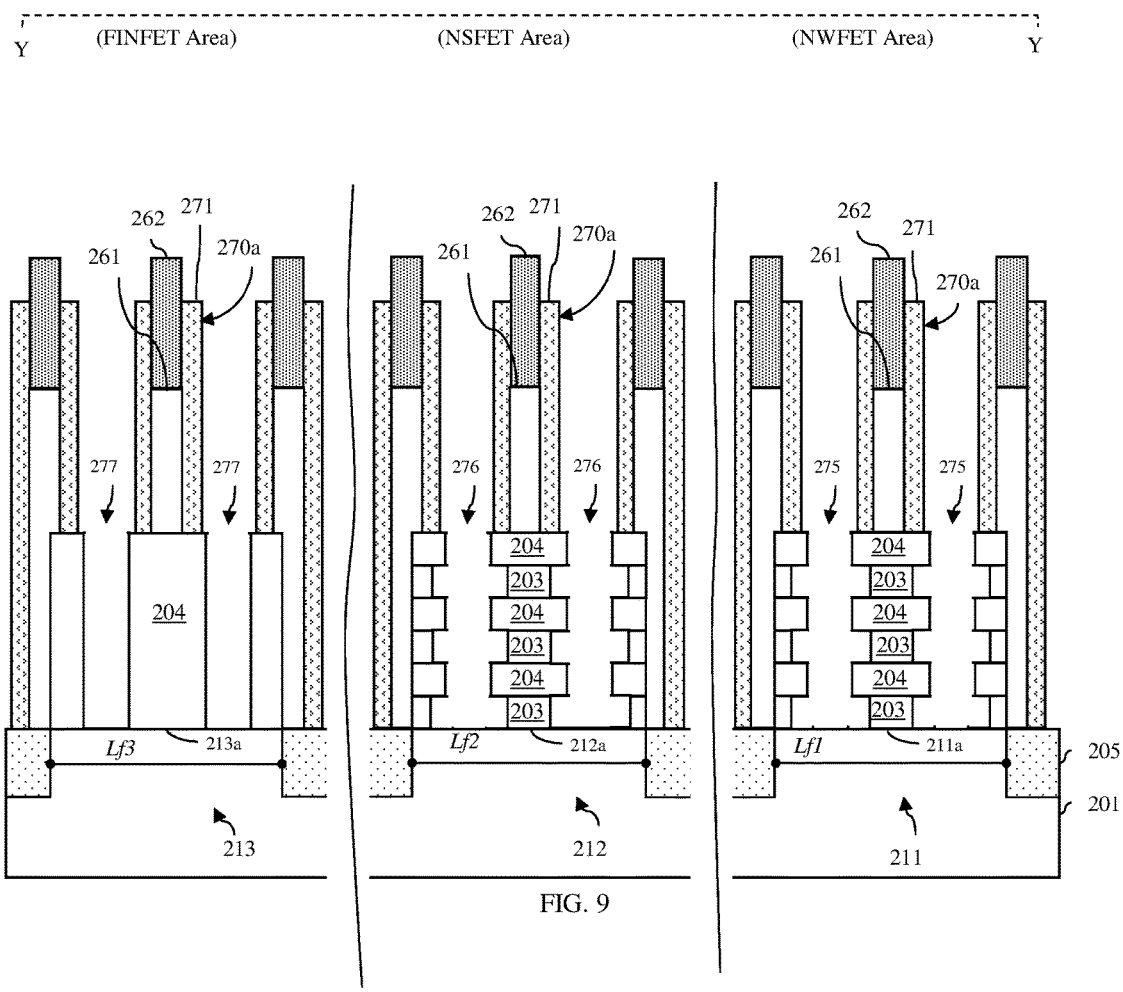
FIG. 9 is a cross-section diagram illustrating a partially completed IC structure formed according to the flow diagram of FIG. 1.

Therefore, the method further includes widening the source/drain openings (i.e., increasing the size of each source/drain opening) (see processes 118-120). Specifically, the third dielectric material of the first spacer layer 271 can be selectively and isotropically etched to remove the exposed portion of the first spacer layer 271 of the fin sections 270b of the sidewall spacer 270 from the source/drain openings 275, 276, 277 (see process 118 and FIGS. 7A-7B). It should be noted that the first spacer layer 271 of the gate section 270a of the sidewall spacer 270 will be protected by the second spacer layer 272 when the exposed portion of the first spacer layer 271 is etched out of the source/drain openings 275, 276, 277. Thus, the first spacer layer 271 of the gate section 270a is only reduced in height slightly. Next, another selective isotropic etch process can be performed in order to completely remove the second spacer layer 272 from the gate section 270a and the remaining fin sections 270b (see process 120 and FIGS. 8A-8B). Following processes 118-120, the source/drain openings 275 will have a width (Ws/d1) that is greater the width (Wf1) of the first portion 211a of the multi-layer semiconductor fin 211. Similarly, the source/drain openings 276 will have a width (Ws/d2) that is greater the width (Wf2) of the first portion 212a of the multi-layer semiconductor fin 212 and the source/drain openings 277 will have a width (Ws/d3) that is greater the width (Wf3) of the first portion 213a of the single layer semiconductor fin 213. Those skilled in the art will recognize that the increased width of the source/drain openings will depend upon the thicknesses of the spacer layers removed therefrom. For example, if the first spacer layer was 6 nm and if the second spacer layer was 2 nm, then following processes 118-120, the width of each source/drain opening would be increased by 16 nm.

Conventional processing can then be performed in order to complete the integrated circuit (IC) structure 200 including the first transistors 10, 10' (i.e., the NWFETs) and, if applicable, the second transistors 20, 20' (i.e., the NSFET) and/or the third transistors 30 (i.e., the FINFET) (see process 122 and FIGS. 9-13D).

Specifically, vertical surfaces of the first semiconductor material 204 and the second semiconductor material 203 on opposing sidewalls of the remaining first portions 211a, 212a of the multi-layer semiconductor fins 211, 212 will be exposed in the source/drain openings 275, 276. The exposed vertical surfaces of the second semiconductor material 203 (not the first semiconductor material) can be laterally etched to form shallow cavities that undercut end portions of the layer(s) of the first semiconductor material 204 (see FIG. 9). That is, an isotropic etch process that is selective for the second semiconductor material 203 over the first semiconductor material 204 can be performed to etch back the exposed vertical surfaces of the second semiconductor material 203 only, thereby creating, within the source/drain openings 275, 276, shallow cavities in the sidewalls of the first portion 211a, 212a of the multi-layer semiconductor fins 211, 212. Since the etch process is selective for the second semiconductor material 203 over the first semiconductor material 204, the first portion 213b of the single layer semiconductor fin 213 will remain essentially intact.

Figure 10A:
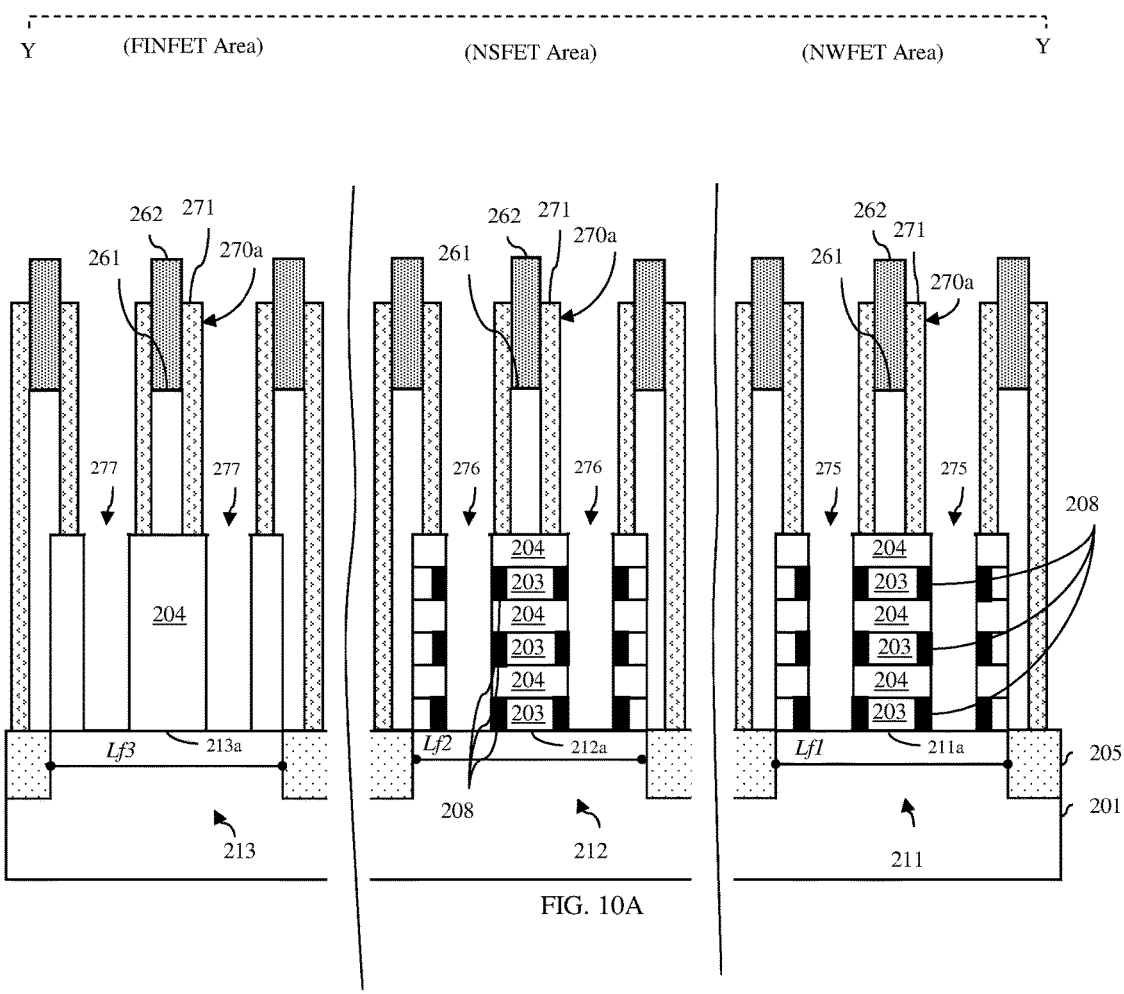
FIGS. 10A-10B are different cross-section diagrams illustrating a partially completed IC structure formed according to the flow diagram of FIG. 1.
Figure 10B:
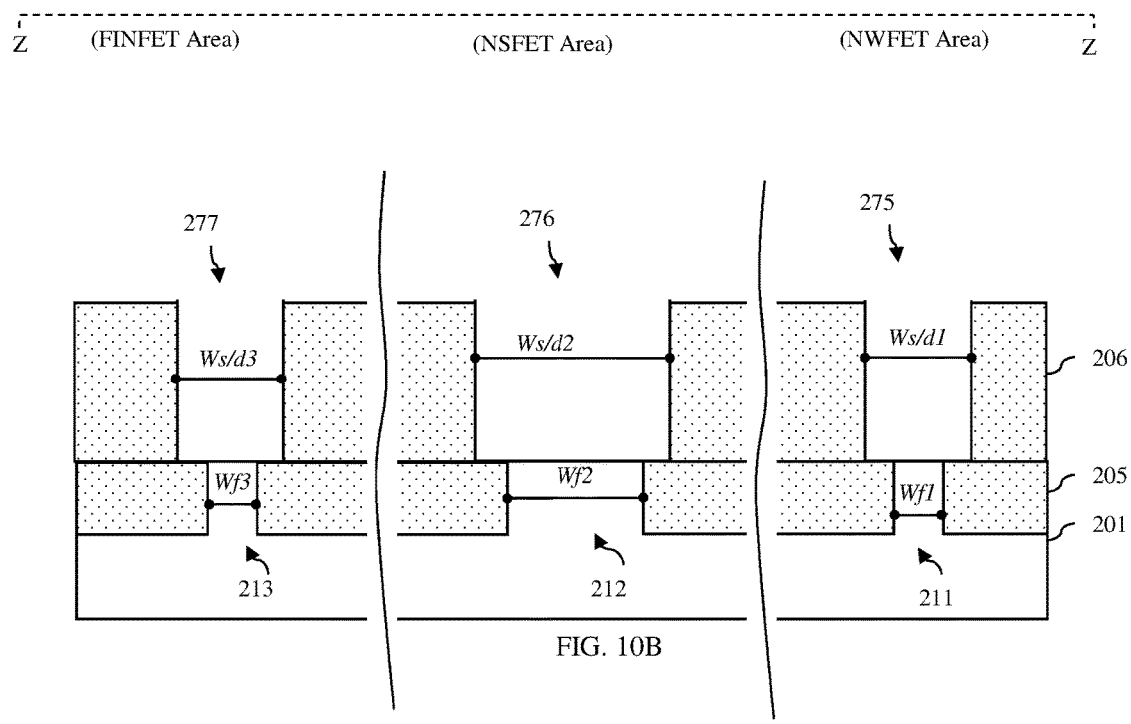

The shallow cavities can then be filled with an isolation material, thereby forming vertically oriented isolation elements 208 (see FIGS. 10A-10B). Specifically, to form isolation elements in the cavities, an isolation layer can be conformally deposited over the partially completed structure, filling the cavities and covering the adjacent areas. The isolation layer can be made of one or more layers of dielectric materials. For example, the isolation layer can be made of the first dielectric material (e.g., silicon nitride), the second dielectric material (e.g., silicon dioxide) and/or any other suitable dielectric material. Then, a selective isotropic etch process can be performed in order to remove any portion of the isolation layer that is outside the cavities. Furthermore, this selective isotropic etch process can be stopped prior to removal of the isolation layer from the cavities such that isolation elements 208 remain within the cavities (see FIG. 10A). By widening the source/drain openings and, thereby increasing the aspect ratio of the source/drain openings, prior to depositing the isolation layer, the method ensures the isotropic etch process can be used to completely remove any portion of the isolation layer that has been deposited into the source/drain openings (see FIG. 10B) and can still be stopped prior to removal of the isolation material from the cavities.

Figure 11A:
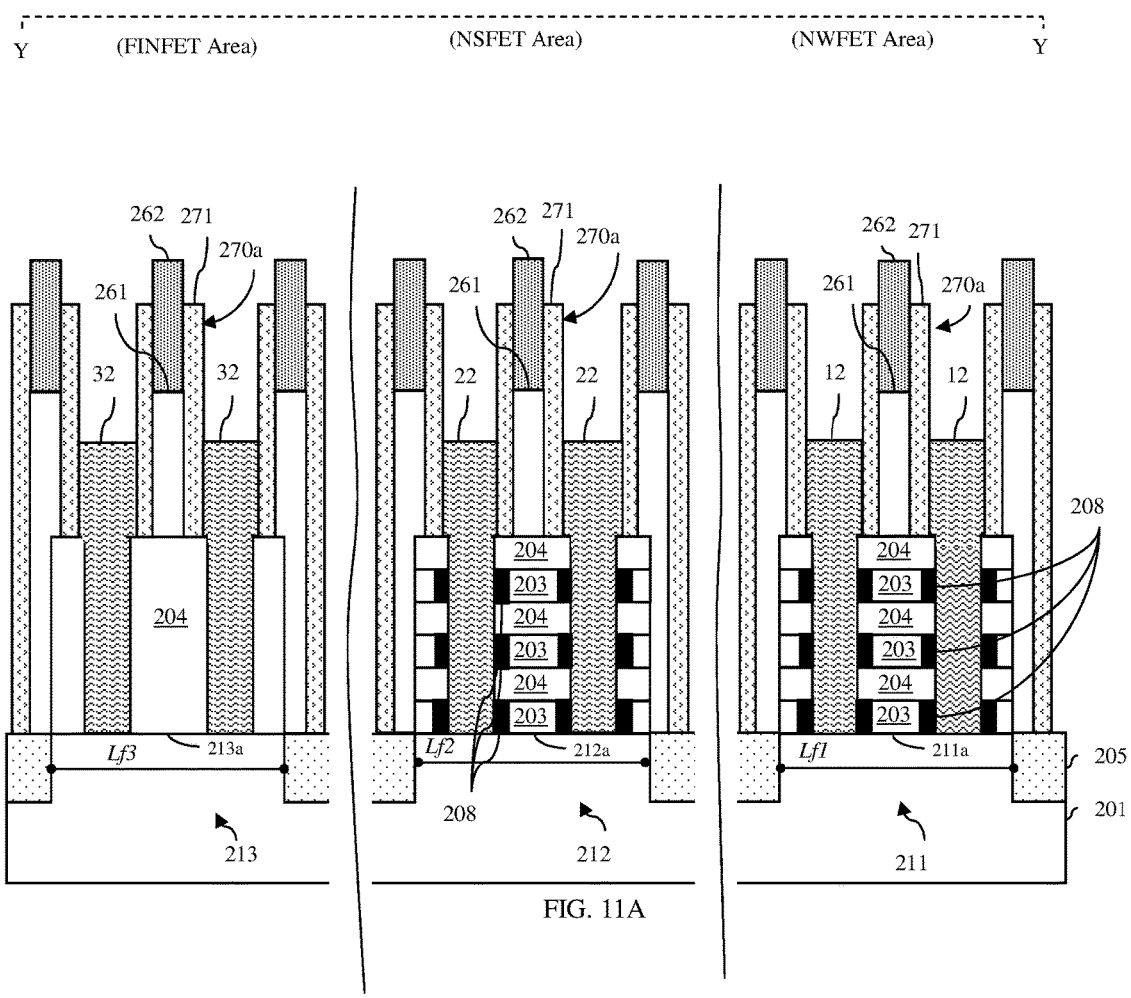
FIGS. 11A-11B are different cross-section diagrams illustrating a partially completed IC structure formed according to the flow diagram of FIG. 1.
Figure 11B:
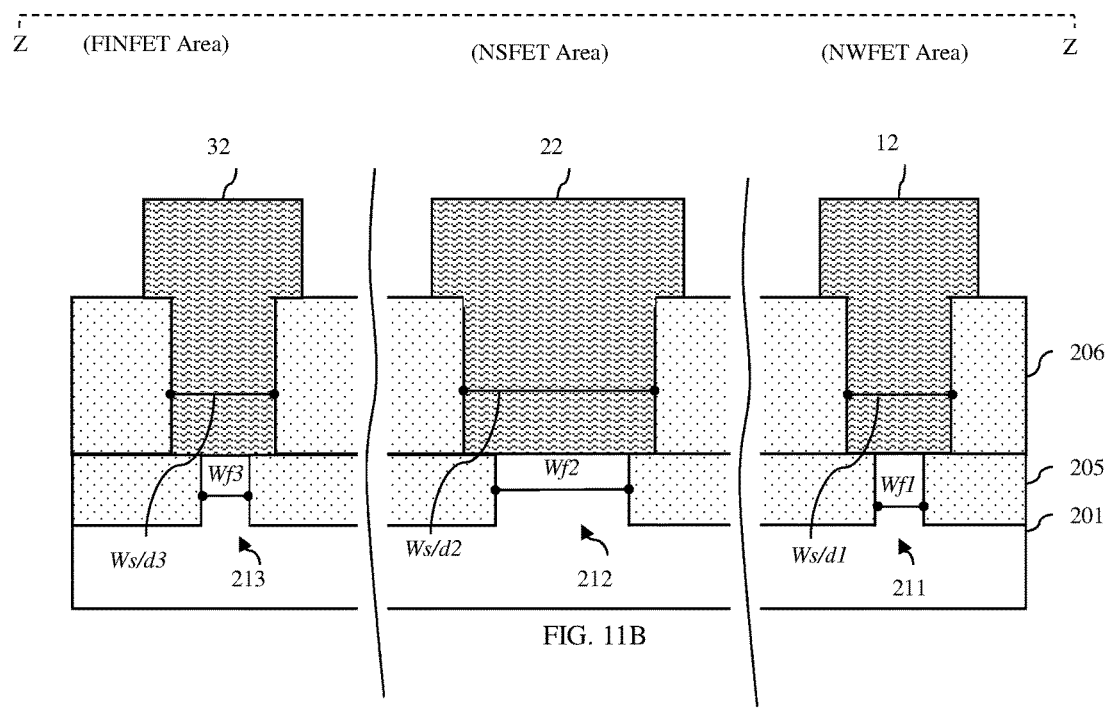
Figure 12:
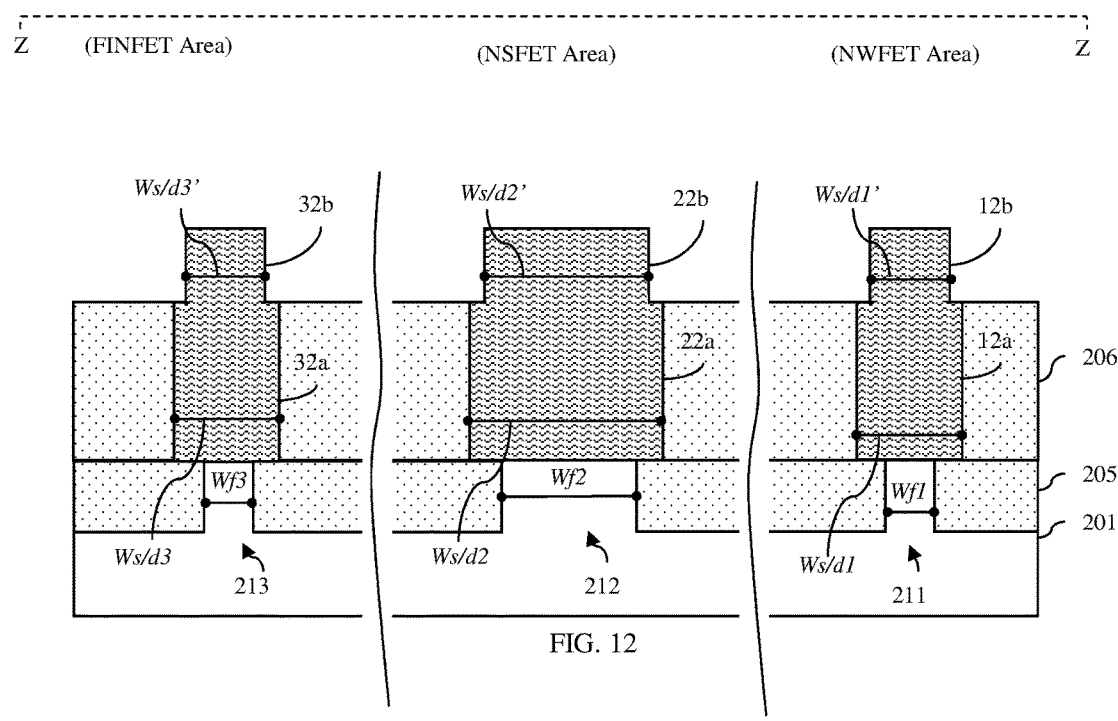
FIG. 12 is a cross-section diagram illustrating a partially completed IC structure formed according to the flow diagram of FIG. 1.

Epitaxial semiconductor material can then be deposited into the source/drain openings 275, 276, 277 in order to form source/drain regions 12, 22, 32 for the first transistor 10 (i.e., the NWFET), the second transistor 20 (i.e., the NSFET) and the third transistor 30 (i.e., FINFET), respectively (see FIGS. 11A-11B). As illustrated, the semiconductor material can be epitaxially deposited so as to overfill the source/drain openings 275, 276, 277. That is, the semiconductor material can be epitaxially deposited so that a lower portion of each source/drain region 12, 22, 32 fills a source/drain opening 275, 276, 277 and so that an upper portion of each source/drain region 12, 22, 32 extends vertically upward above the level of the top surface of the first layer 206 of the ILD material. It should be understood that epitaxial growth of the semiconductor material for the source/drain regions 12, 22, 32 will be confined along the length of each source/drain region by the sacrificial gate 261/gate sidewall spacer 271 at one end and by an adjacent sacrificial gate/gate sidewall spacer (not shown) at the opposite end. Optionally, the epitaxial semiconductor material of the exposed upper portions of the source/drain regions 12, 22, 32 can be selectively and isotropically etched so that the upper portion 12b, 22b, 32b of each source/drain region is narrower in width than the lower portion 12a, 22a, 32a below (see FIG. 12). Specifically, as illustrated in FIG. 12, following the isotropic etch, the lower portion 12a of each source/drain region in each NWFET area will have a width (Ws/d1) and the upper portion 12b will have a width (Ws/d1') that is smaller than the width (Ws/d1). Similarly, following the isotropic etch, the lower portion 22a of each source/drain region in the NSFET area will have a width (Ws/d2) and the upper portion 22b will have a width (Ws/d2') that is smaller than the width (Ws/d2). Similarly, following the isotropic etch, the lower portion 32a of each source/drain region in the FINFET area will have a width (Ws/d3) and the upper portion 32b will have a width (Ws/d3') that is smaller than the width (Ws/d3).

After the source/drain regions 12, 22, 32 are formed, a thin etch stop layer 210 (e.g., a thin silicon nitride layer) can be conformally deposited over the partially completed structure and, particularly, onto the top surface of the first layer 206 of ILD material, over the source/drain regions, etc. A second layer 209 of ILD material (e.g., silicon dioxide) can then be deposited over the partially completed structure and a polishing process (e.g., a chemical mechanical polishing (CMP) process) can be performed to expose the tops of the sacrificial gates 261 (i.e., to remove the sacrificial gate caps 262).

The sacrificial gates 261 can be selectively removed. That is, a selective etch process can be performed in order to selectively etch away the material of the sacrificial gate layer over the semiconductor materials of the semiconductor fins and also over the adjacent dielectric materials (e.g., the third dielectric material of the first spacer layer 271 and the ILD material), thereby exposing the top and side surfaces of the first portions 211a, 212a, 213a of the semiconductor fins 211, 212, 213. As mentioned above, formation of the sacrificial gates 261 typically includes deposition of a thin conformal silicon dioxide layer prior to deposition and patterning of the sacrificial gate material. This thin conformal silicon dioxide layer will protect the semiconductor material of the semiconductor fins during removal of the sacrificial gates. Following removal of the sacrificial gates 261, this silicon dioxide layer can also be removed from the gate openings (e.g., by dilute hydrofluoric acid (DHF)).

Once the sacrificial gates are removed, the remaining second semiconductor material 203 in the first portions 211a, 212a of the multi-layer semiconductor fins 211, 212 can be selectively etched away, thereby creating discrete elongated nanaoshape(s) from the remaining first semiconductor material. Specifically, if the first semiconductor material 204 is silicon and the second semiconductor material 203 is silicon germanium, the silicon germanium can be selectively etched over the silicon and adjacent dielectric materials using any of the following exemplary processes: a thermal etch process (e.g., using gaseous hydrochloric acid (HCl)), a dry plasma etch process, or a wet etch process with process specifications designed to ensure the selective etch of silicon germanium over silicon and various dielectric materials. Alternatively, any other suitable isotropic selective etch process that selectively etches silicon germanium could be used. As a result, at least one discrete elongated NW of the first semiconductor material 204 will extend laterally between the sources/drain regions 12, thereby forming channel region(s) 11 for the first transistors 10, 10' (i.e., the NWFET). Additionally, at least one discrete elongated NS of the first semiconductor material 204 will extend laterally between the source/drain regions 22, thereby forming channel region(s) 21 for the second transistors 20, 20' (i.e., the NWFET). It should be noted that, since the etch process is selective for the second semiconductor material 203 over the first semiconductor material 204, the first portion 213a of the single layer semiconductor fin 213 will remain intact and will form the channel region 31 of the third transistor 30 (i.e., the FINFET).

Gates 13, 23, 33 for the transistors 10/10', 20/20', 30 can then be formed in the gate openings that were created by removal of the sacrificial gates and the second semiconductor material. These gates can be replacement metal gates (RMGs), which are formed, for example, using conventional RMG formation techniques. For example, a gate dielectric layer (e.g., a high-K gate dielectric layer) can be conformally deposited so as to cover exposed surfaces of the channel region(s) 11, 21, 31 within each gate opening. That is, the gate dielectric layer will be deposited so as to wrap around (i.e., will be adjacent to exposed top, bottom and side surfaces of) the NW channel region(s) 11 of each NWFET 10/10' and the NS channel region(s) 21 of each NSFET 20/20' and will further be deposited so as to cover the top and opposing side surfaces of the channel region 31 of each FINFET 30. Those skilled in the art will recognize that, due to the conformal deposition process, the gate dielectric layer may also cover other exposed surfaces within the gate opening (e.g., exposed surfaces of the sidewall spacer and isolation region 205). A gate conductor layer can then be formed on the gate dielectric layer. For example, a work function metal layer can be conformally deposited in the gate openings so as to cover the gate dielectric layer. The metal material or metal alloy material of the conformal work function metal layer can be preselected in order to achieve the optimal gate conductor work function given the conductivity type of the transistors for which the RMGs are being formed. The work function metal layer can then, optionally, be chamfered. The chamfering process can include: depositing a protective fill material onto the work function metal layer; recessing the protective fill material; etching away the exposed work function metal material from above the protective fill material such that the maximum height of the work function metal layer is below the level of the top surface of the gate sidewall spacer; and removing the protective fill material. Finally, a conductive fill material can be deposited to fill any remaining space in the gate openings and a polishing process (e.g., a CMP process) can be performed to remove any RMG materials from above the top surface of the second layer 209 of ILD material. It should be noted that RMGs are well known in the art. Thus, in order to avoid clutter in the drawings and allow the reader to focus on the salient aspects of the disclosed embodiments, only the gates 13, 23, 33, as a whole, are identified in the figures and the individual components of these RMGs (e.g., the gate dielectric layer, the work function metal layer, the conductive fill material, etc.) are not specifically identified.

Next, dielectric gate caps 14, 24, 34 can be formed on the top surfaces of the gates 13, 23, 33, respectively. For example, the conductive fill material within the gate openings can be recessed (i.e., etched back) and a dielectric cap layer (e.g., a silicon nitride cap layer) can be deposited over the partially completed structure. A polishing process (e.g., a CMP process) can be performed so as to remove any of the dielectric cap material from above the top surface of the second layer 209 of ILD material, thereby forming the dielectric gate caps.

Figure 13A:
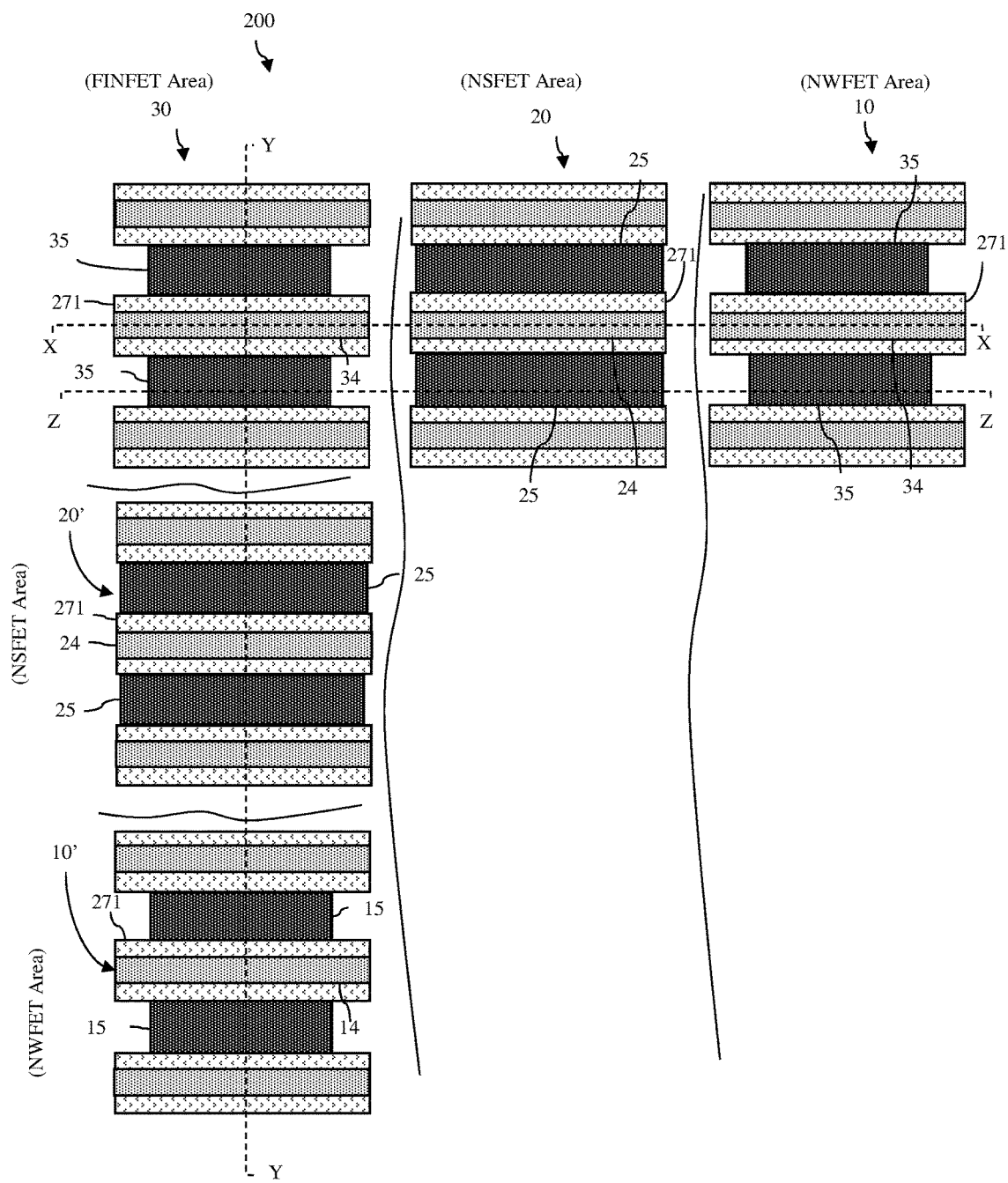
FIG. 13A is a top view diagram and FIGS. 13B-13D are different cross-section diagrams illustrating a partially completed IC structure formed according to the flow diagram of FIG. 1.

As mentioned above at process 110, sacrificial gates with gate sidewall spacers are typically patterned such that they are spaced evenly across the length of a semiconductor fin. Thus, following sacrificial gate removal and replacement metal gate processing each of the transistors 10, 20, 30 will be positioned laterally between a pair of gates (as shown in FIG. 13A). Adjacent gates can be either dummy gates (i.e., non-function) if formed on an end of a fin (as illustrated) or functional gates of adjacent concurrently formed transistors.

Additionally, contacts 15, 25, 35 (also referred to as metal plugs) to the source/drain regions 12, 22, 32 can be formed. Specifically, contact openings can be lithographically patterned and etched such that they extend essentially vertically through the second layer 209 of ILD material and through the etch stop layer 210 to the source/drain regions 12, 22, 32. A metallization process can then be performed in order to fill each contact opening with a metal conductor, thereby forming contacts 15, 25, 35. The metal conductor can include, for example, optional adhesion and/or diffusion barrier layers and one or more layers of metal and/or metal alloy materials (e.g., tungsten, cobalt, nickel, aluminum, copper, or any other suitable conductor material). It should be noted that, optionally, the contact openings can be wider than the source/drain regions 12, 22, 32 and can further be etched into or completely through the first layer 206 of ILD material, exposing top and side surfaces of the source/drain regions 12, 22, 32. In the case, the contacts 15, 25, 35 formed within the contact openings will wrap around the top and side surfaces of the source/drain regions for reduced resistance.

Conventional middle of the line (MOL) and back end of the line (BEOL) processing can then be performed in order to complete the IC structure 200.

Figure 13B:
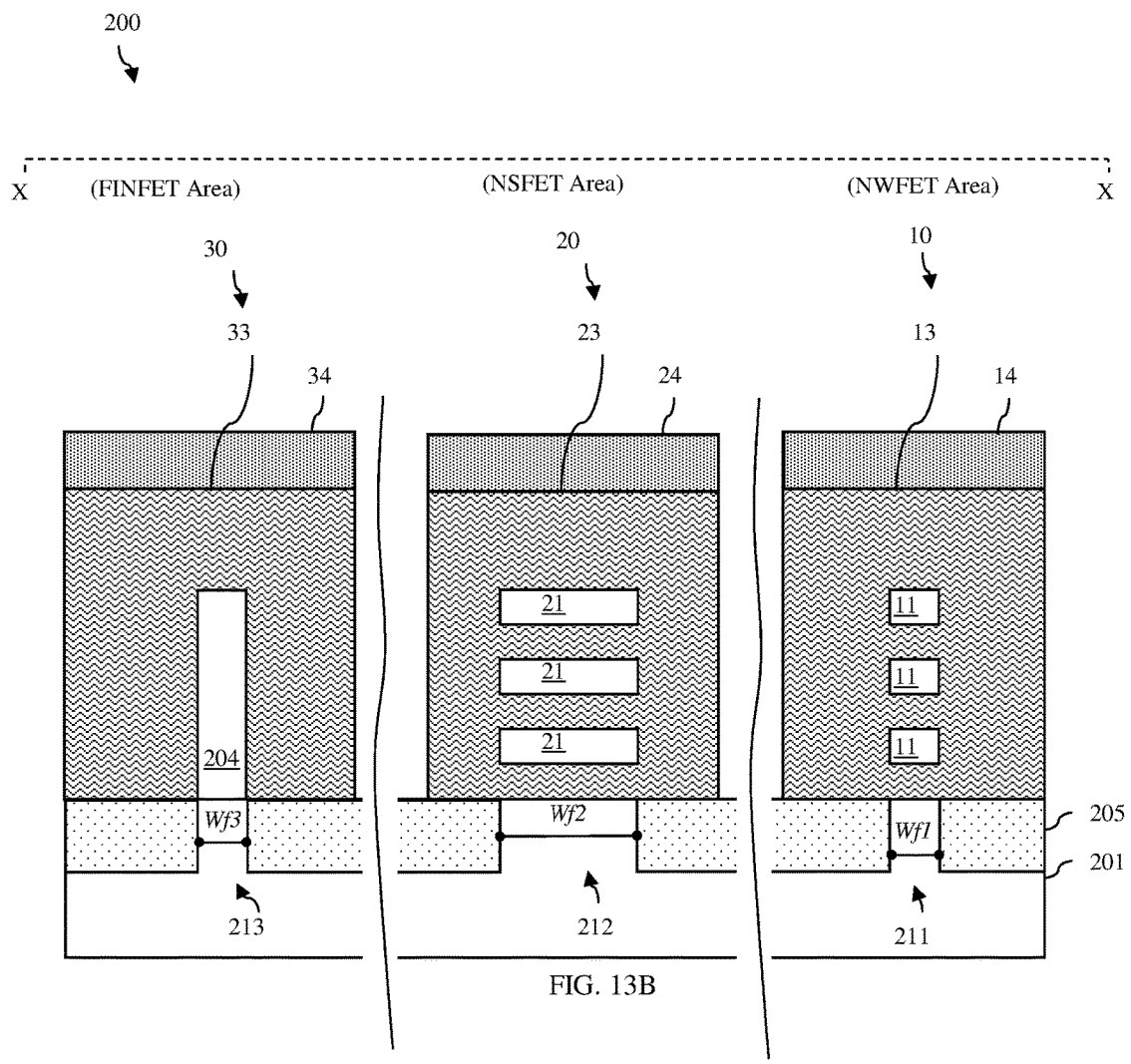
Figure 13C:
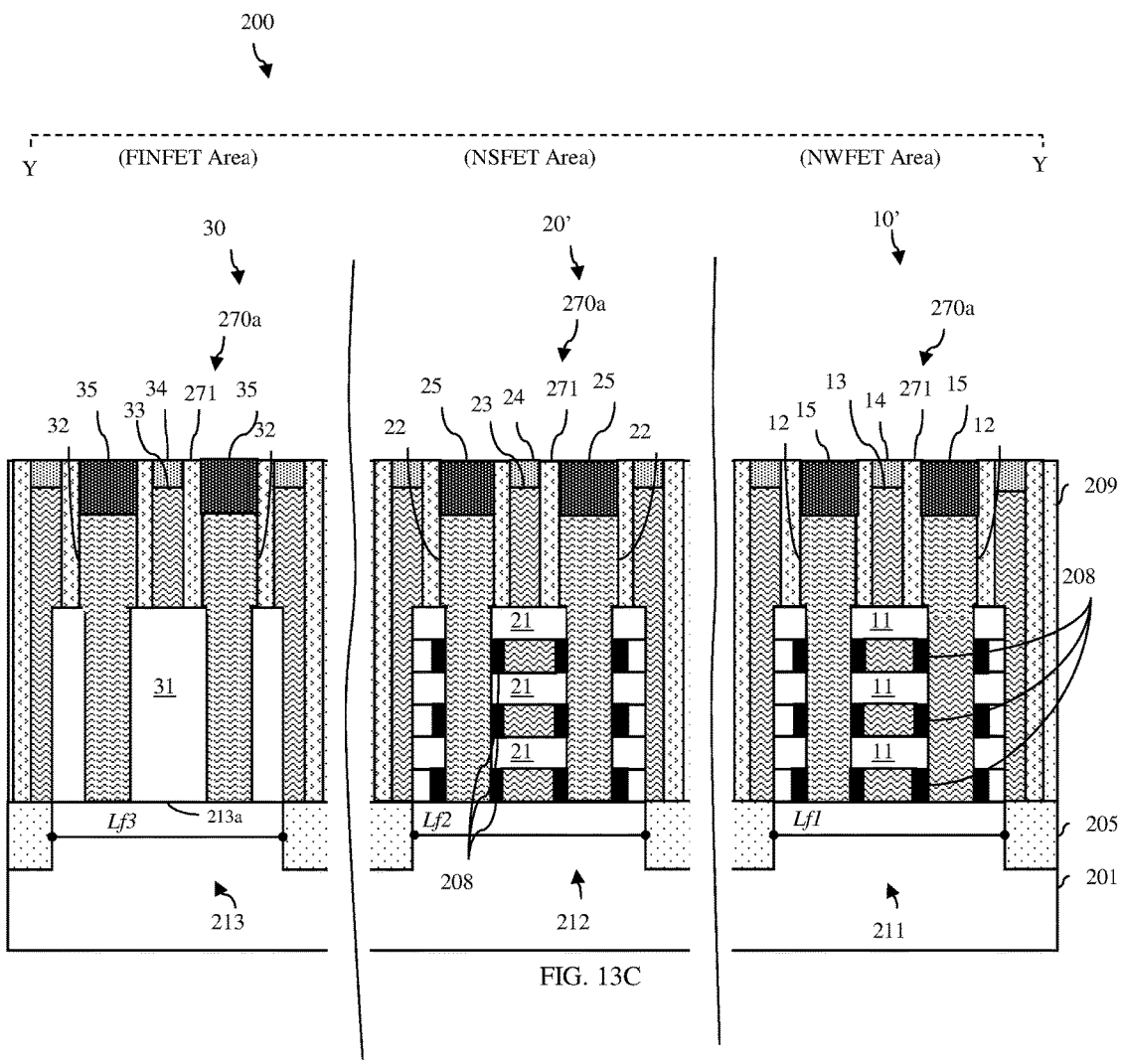
Figure 13D:
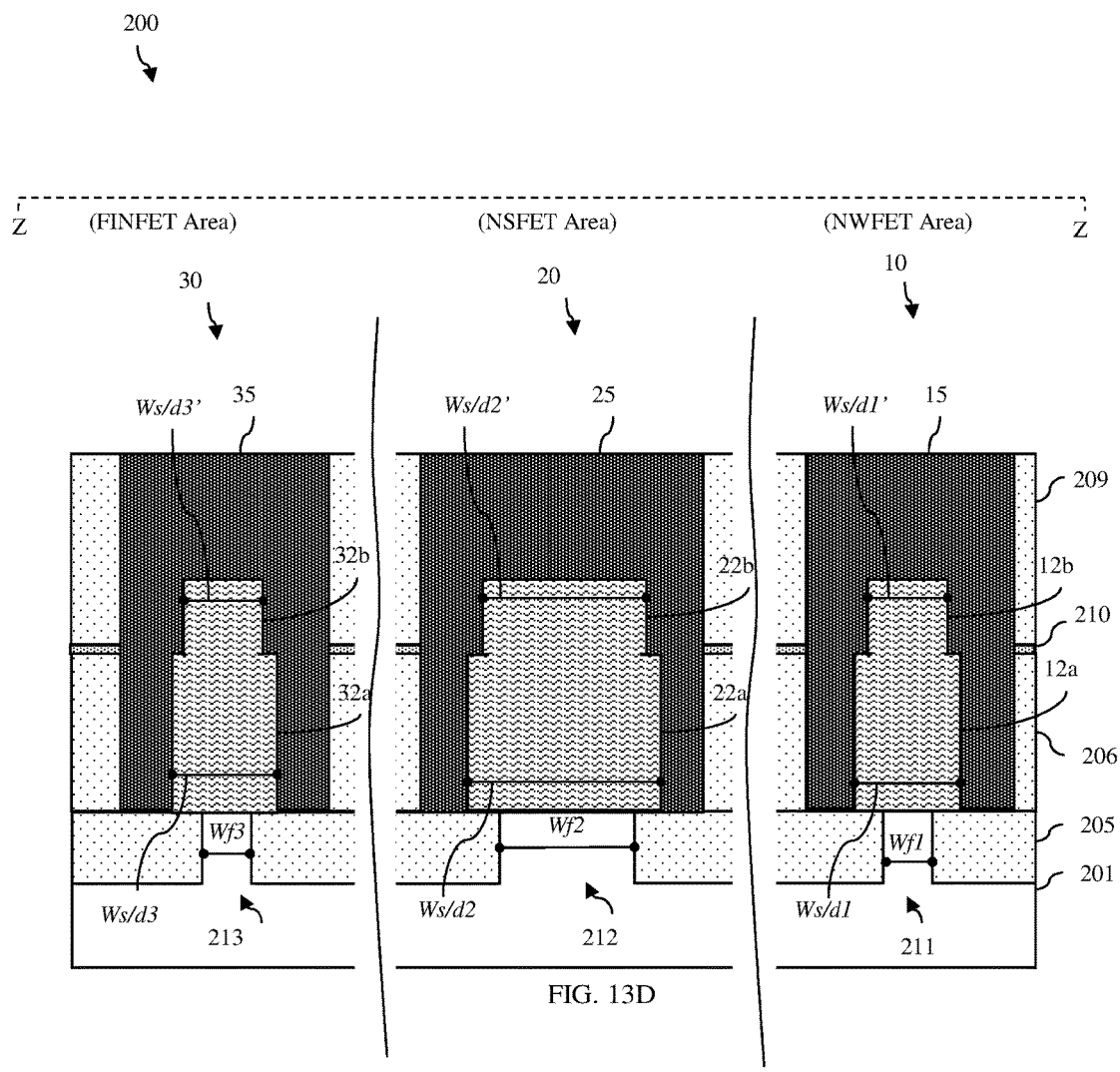

FIG. 13A is an exemplary plan view diagram and FIGS. 13B-13D are different cross-section diagrams of an embodiment of an IC structure 200 formed according to the above-describe method embodiment. Specifically, FIG. 13A is an exemplary plan view diagram showing a row of transistors including a first transistor 10 and, particularly, a nanowire-type field effect transistor (NWFET) in a NWFET area; a second transistor 20 and, particularly, a nanosheet-type field effect transistor (NSFET) in a NSFET area; and a third transistor 30 and, particularly, a fin-type field effect transistor (FINFET) in a FINFET area. FIG. 13A further shows a column of transistors including the FINFET 30 mentioned above; another NSFET 20' in another NSFET area; and another NWFET 10' in another NWFET area. FIG. 13B shows the row of transistors 30, 20, 10 in cross-section XX, which cuts across the width of each transistor at its channel region 31, 21, 11, respectively. FIG. 13C shows the column of transistors 30, 20' 10' in cross-section YY, which cuts across the length of each transistor. FIG. 13D also shows the row of transistors in cross-section ZZ, which cuts across the width of each transistor at one of its source/drain regions 32, 22, 12, respectively. The curved lines between the transistors in the row and in the column are provided in order to indicate that these transistors will be found at different locations on a chip and not actually immediately adjacent to each other as shown.

As illustrated and discussed in detail above with regard to the method, this IC structure 200 includes a semiconductor substrate 201 and, on the semiconductor substrate 201, one or more first transistors 10, 10' (i.e., nanowire-type field effect transistors (NWFETs)) and, optionally, one or more second transistors 20 (i.e., nanosheet-type field effect transistors (NSFETs)) and/or one or more third transistors 30 (i.e., fin-type field effect transistors (FINFETs)).

Each first transistor 10, 10' (i.e., each NWFET) can include source/drain regions 12 above the substrate 201 and at least one nanowire (NW) channel region 11 that extends laterally between the source/drain regions 12. Specifically, each NW channel region 11 can have top, bottom and side surfaces and can further have end portions immediately adjacent to the source/drain regions 12, respectively. Each NW channel region 11 can further have a first width (see width Wf1), which is, for example, less than or equal to 15 nanometers. Each source/drain region 12 can further have a lower portion 12a and an upper portion 12b above the lower portion 12A. The lower portion 12a of each source/drain region 12 can have essentially vertical sidewalls and a second width (see width Ws/d1) that is greater than the first width (Wf1), (e.g., that is at least 10 nanometers greater than Wf1). Optionally, the size of the upper portion 12b of the source/drain region 12 can be different than that of the lower portion 12a. For example, the upper portion 12b can be narrower in width than the lower portion 12a. That is, the lower portion 12a of the source/drain region 12 can have a width (Ws/d1) and the upper portion can have a width (Ws/d1') that is smaller than the width (Ws/d1). Each first transistor 10, 10' (i.e., each NWFET) can further include a gate 13 adjacent to the top, bottom and side surfaces of each NW channel region 11 and a dielectric gate cap 14 on the gate 13. Each first transistor 10, 10' (i.e., each NWFET) can further include a sidewall spacer (i.e., the remaining spacer layer 271 of the gate section of the sidewall spacer formed during processing as described above) and isolation elements 208 that electrically isolate the gate 13 from the source/drain regions 12. Specifically, the sidewall spacer 271 can be adjacent to outer sidewalls of the gate. The isolation elements 208 can be below the end portions of each NW channel region 11 and can positioned laterally between the gate 13 and the source/drain regions 12.

Optionally, the IC structure 200 can further include one or more second transistors 20, 20' (i.e., NSFETs). Each second transistor 20, 20' an include source/drain regions 22 on the substrate 201 and at least nanosheet (NS) channel region 21 that extends laterally between the source/drain regions 22. Specifically, each NS channel region 21 can have top, bottom and side surfaces and can further have end portions immediately adjacent to the source/drain regions 22, respectively. Each NS channel region 21 can further have a width (Wf2), which is greater than the width (Wf1) of the NW channel region(s) 11 of the first transistor 10. The width (Wf2) of each NS channel region 21 can be, for example, greater than 20 nanometers. Each source/drain region 22 can, like the source/drain regions 12 of the first transistor 10, further have a lower portion and an upper portion above the lower portion. The lower portion of each source/drain region 22 can have essentially vertical sidewalls and a width (Ws/d2) that is greater than the width (Wf2), (e.g., that is at least 10 nanometers greater than Wf2). Optionally, the size of the upper portion of the source/drain region 22 can be different than that of the lower portion. For example, the upper portion can be narrower in width than the lower portion. That is, the lower portion of the source/drain region 22 can have a width (Ws/d2) and the upper portion can have a width (Ws/d2') that is smaller than the width (Ws/d2). Each second transistor 20, 20' (i.e., each NSFET) can further include a gate 23 adjacent to the top, bottom and side surfaces of each NS channel region 21 and a dielectric gate cap 24 on the gate 23. Each second transistor 20, 20' (i.e., each NSFET) can further include a sidewall spacer (i.e., the remaining spacer layer 271 of the gate section of the sidewall spacer formed during processing as described above) and isolation elements 208 that electrically isolate the gate 23 from the source/drain regions 22.

Optionally, the IC structure 200 can further include one or more third transistors 30 (i.e., FINFETs). Each third transistor 30 can include source/drain regions 32 on the substrate 201 a fin-shaped channel region 31 that extends laterally between the source/drain regions 32. Specifically, the fin-shaped channel region 31 can have top and side surfaces and can further have end portions immediately adjacent to the source/drain regions 32, respectively. The fin-shaped channel region 31 can further have a width (Wf3), which is, for example, essentially equal to the width (Wf1) of the NW channel region(s) 11 of the first transistor 10, 10'. Each source/drain region 32 can, like the source/drain regions 12 of the first transistor 10, 10', further have a lower portion and an upper portion above the lower portion. The lower portion of each source/drain region 32 can have essentially vertical sidewalls and a width (Ws/d3) that is greater than the width (Wf3), (e.g., that is at least 10 nanometers greater than Wf3). Optionally, the size of the upper portion of the source/drain region 32 can be different than that of the lower portion. For example, the upper portion can be narrower in width than the lower portion. That is, the lower portion of the source/drain region 32 can have a width (Ws/d3) and the upper portion can have a width (Ws/d3') that is smaller than the width (Ws/d3). Each third transistor 30 (i.e., each FINFET) can further include a gate 33 adjacent to the top and side surfaces of the fin-shaped channel region 31 and a dielectric gate cap 34 on the gate 33. Each third transistor 30 (i.e., each FINFET) can further include a sidewall spacer (i.e., the remaining spacer layer 271 of the gate section of the sidewall spacer formed during processing as described above) that electrically isolates the gate 33 from the source/drain regions 32.

The IC structure 200 can further include a first layer 206 of interlayer dielectric (ILD) material on the substrate 201 and laterally surrounding lower regions of each first transistor 10, 10' and, if applicable, each second transistor 20, 20' and/or each third transistor 30. The ILD material can be silicon dioxide or any other suitable ILD material. The first layer 206 of ILD material can have a top surface that is approximately level with the interface between the lower and upper portions of the source/drain regions 12, 22, 32 of each of the transistors 10, 20, 30.

The IC structure 200 can further include an etch stop layer 210 on the top surface of the first layer 206 of ILD material (i.e., adjacent to the interface between the lower and upper portions of the source/drain regions 12, 22, 32 of each of the transistors). The etch stop layer 210 can, for example, be a relatively thin layer of silicon nitride or any other suitable dielectric material that is different from the ILD material and that can function, during processing as an etch stop material.

The IC structure 200 can further include a second layer 209 of ILD material on the top surface of the etch stop layer 210 and laterally surrounding upper regions of each first transistor 10, 10' and, if applicable, each second transistor 20, 20' and each third transistor 30. Thus, the top surface of the upper portion of each source/drain region 12, 22, 32 can, specifically, be above the level of the top surface of the etch stop layer 210 and below the level of the top surface of the second layer 209 of ILD material.

The IC structure 200 can further include contacts 15, 25, 35 (also referred to as metal plugs) to the source/drain regions 12, 22, 32. Specifically, contact openings can extend essentially vertically through the second layer 209 of ILD material and through the etch stop layer 210 to the source/drain regions 12, 22, 32. Each contact opening can be filled with metal conductor (i.e., a contact 15, 25, 35). The metal conductor can include, for example, optional adhesion and/or diffusion barrier layers and one or more layers of metal and/or metal alloy materials (e.g., tungsten, cobalt, nickel, aluminum, copper, or any other suitable conductor material). It should be noted that, optionally, the contact openings and, thereby the contacts 15, 25, 35 can be wider than the source/drain regions 12, 22, 32 and can further extend into or completely through the first layer 206 of ILD material so as to wrap around the top and side surfaces of the source/drain regions 12, 22, 32 for reduced resistance.

Figure 14:
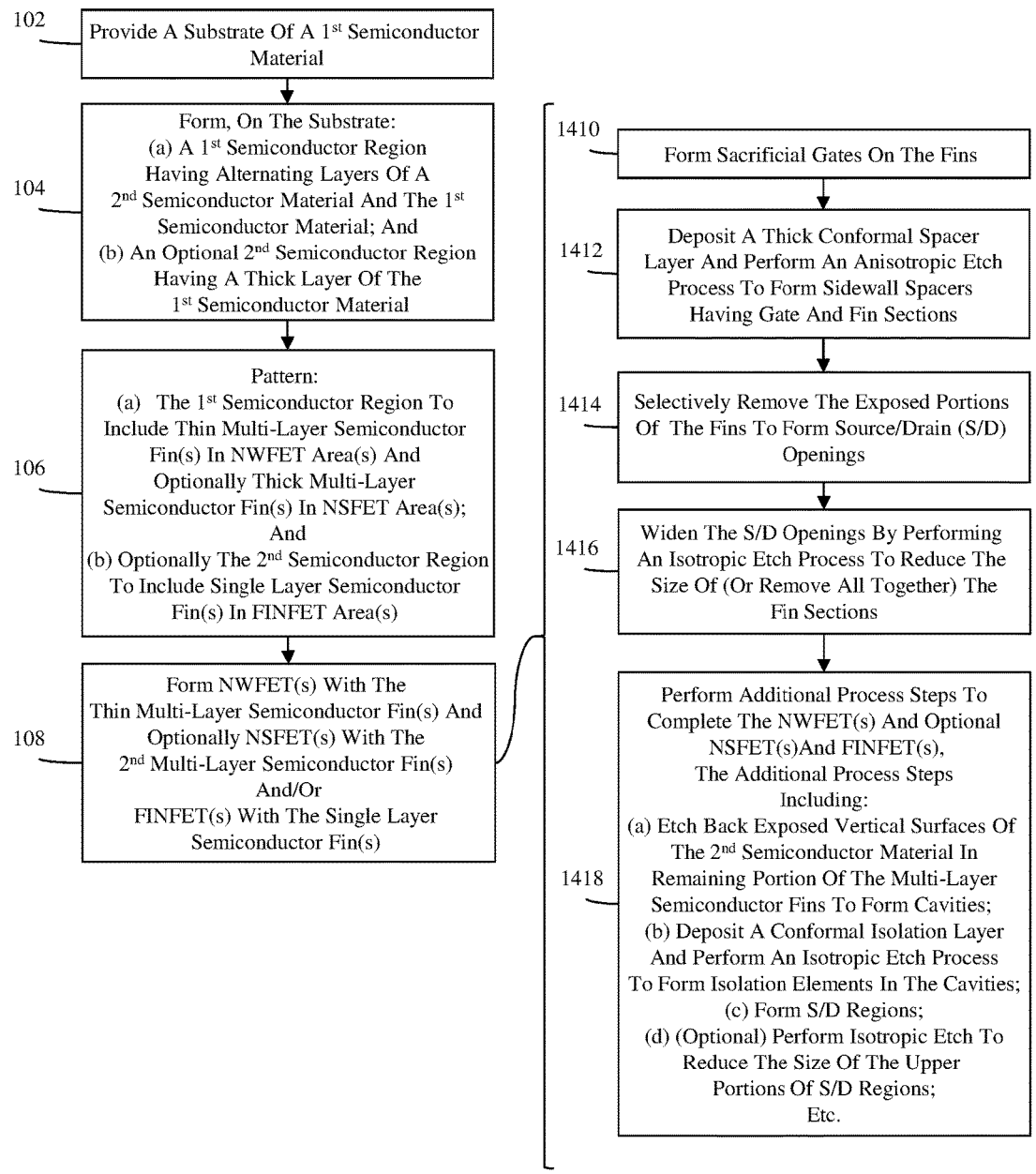
FIG. 14 is a flow diagram illustrating an alternative embodiment of a method of forming an integrated circuit (IC) structure having at least one gate-all-around field effect transistor (GAAFET)

FIG. 14 is a flow diagram illustrating another method embodiment wherein, during formation of the one or more transistor(s), exposed portions of the semiconductor fin(s) can be selectively removed to form source/drain openings and, then, the source/drain openings can be widened to ensure proper source/drain region formation therein.

In this embodiment, processes 102-108 are similar to the processes 102-108 of FIG. 1 described in detail above; however, the sub-processes used to form the one or more first transistors (i.e., the NWFET(s)) and optionally the one or more second transistors (i.e., the NSFET(s)) and/or the one or more third transistors (i.e., the FINFET(s)) at process 108 are different from those in FIG. 1.

Figure 15A:
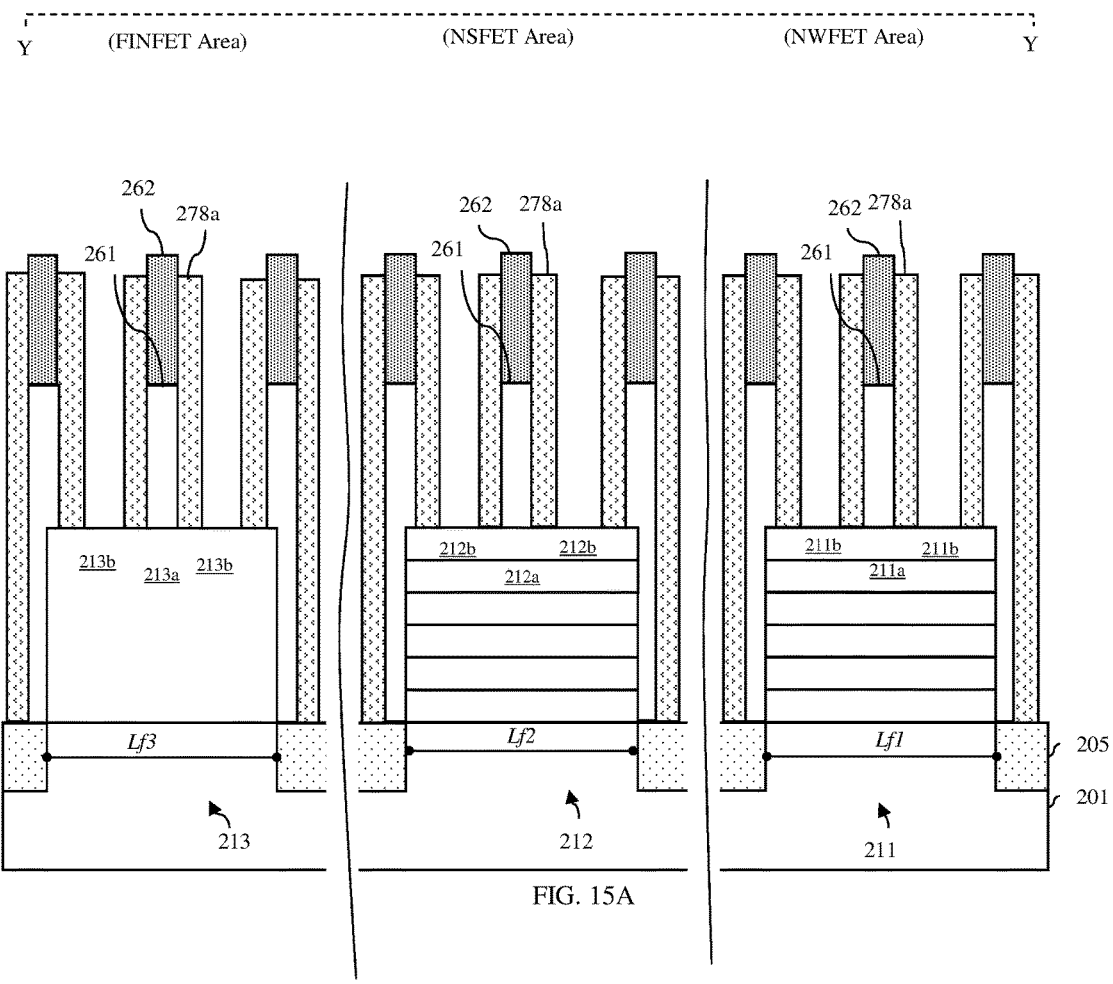
FIGS. 15A-15B are different cross-section diagrams illustrating a partially completed IC structure formed according to the flow diagram of FIG. 14.
Figure 15B:
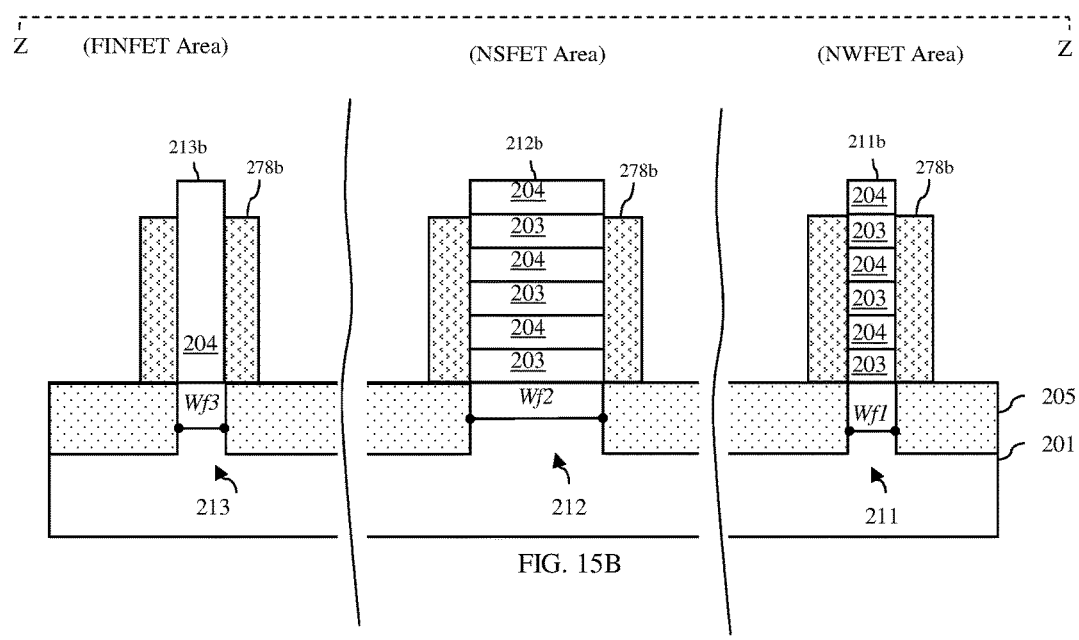

Specifically, in this method embodiment, sacrificial gates 261 with sacrificial gate caps 262 can be formed on first portions 211a, 212a, 213a (i.e., designated channel regions) of the semiconductor fins 211, 212, 213 such that second portions 211b, 212b, 213b of the semiconductor fins extend laterally beyond the sacrificial gates 261, respectively (see process 1410 and FIGS. 15A-15B). This process 1410 can be performed in essentially the same manner as process 110 of FIG. 1, described above.

In this case, instead of forming multi-layer sidewall spacers, thick sidewall spacers are formed such that the sidewall spacers each include a gate section 278a adjacent to the sidewalls of a given one of the sacrificial gates 261 and fin sections 278b adjacent to the exposed second portions of a given one of the semiconductor fins 211, 212, 213 (see processes 1412 and FIGS. 15A-15B). Specifically, a thick spacer layer made of a third dielectric material that is different from the first dielectric material and the second dielectric material can be conformally deposited over the sacrificial gate caps 262 on the sacrificial gates 261 and over the exposed second portions 211b, 212b, 213b of the semiconductor fins 211, 212, 213. As mentioned above, the first dielectric material can be, for example, silicon nitride and the second dielectric material can be, for example, silicon nitride. The third dielectric material can be, for example, silicon oxynitride (SiON), carbon-doped silicon oxynitride (SiONC), carbon-doped silicon (SiC), silicon carbon nitride (SiCN), silicon oxycarbide (SiCO), silicon boron carbon nitride (SBCN), hydrogenated silicon oxycarbide (SiCOH), etc. or any other suitable dielectric material different from the first and second dielectric materials. This thick spacer layer can have, for example, a thickness of at least 8 nm. An anisotropic etch process can then be performed in order to selectively etch the spacer layer away from horizontal top surfaces of the sacrificial gate caps 262, semiconductor fins 211-213 and isolation region 205 without exposing any vertical surfaces of the sacrificial gates 261. The resulting sidewall spacers will each be at least 8 nm thick and will each have a gate section 278a covering the vertical surfaces of a given sacrificial gate 261 and fin sections 278b, which are shorter than and have a same thickness as the gate section 278a, covering the vertical surfaces of exposed second portions of a given one of the semiconductor fins 211, 212, 213.

Figure 16A:
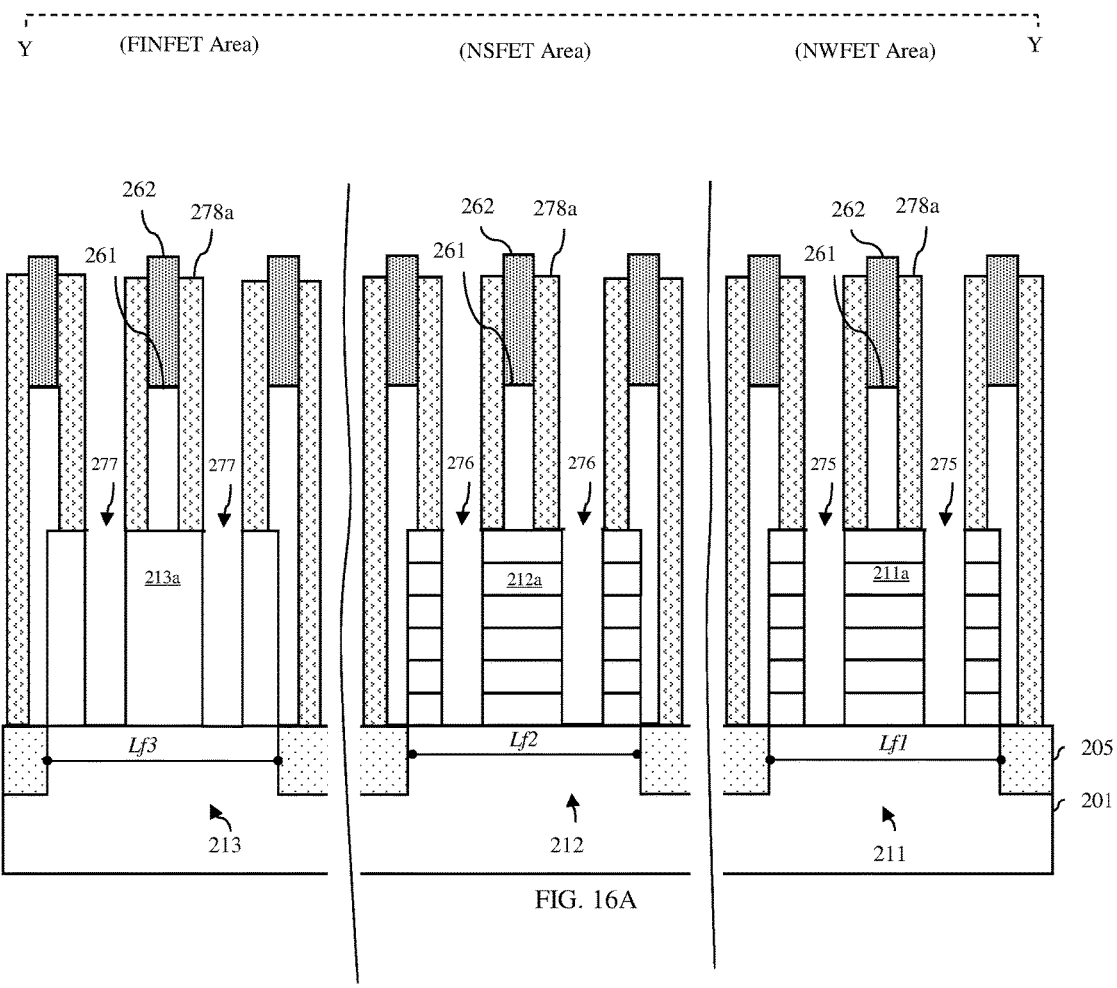
FIGS. 16A-16B are different cross-section diagrams illustrating a partially completed IC structure formed according to the flow diagram of FIG. 14.
Figure 16B:
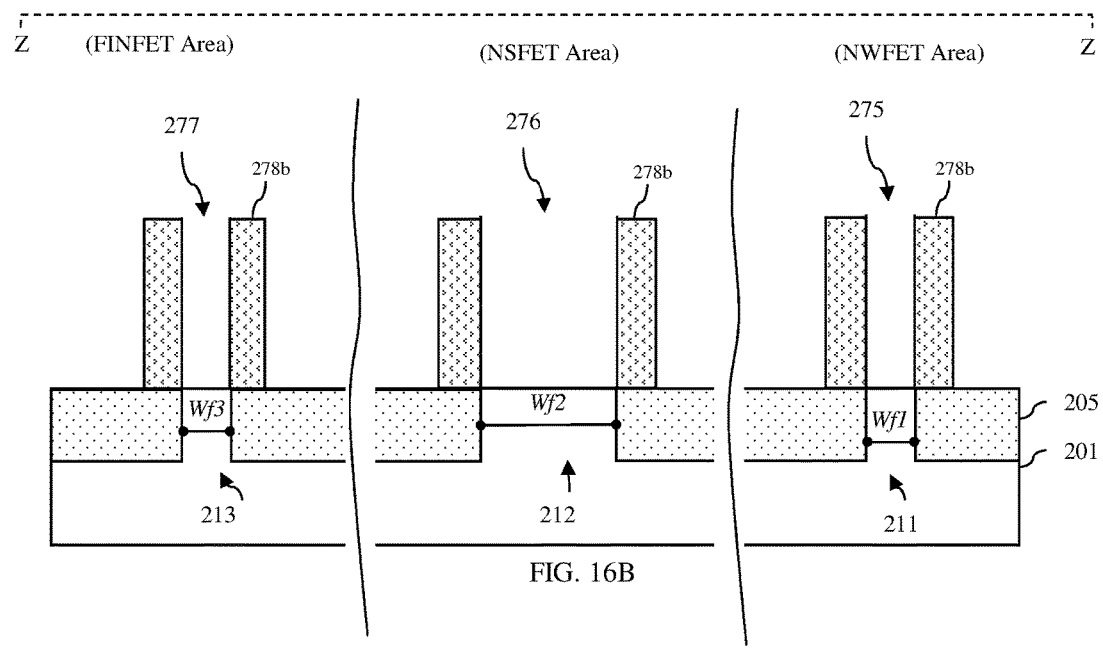

The exposed second portions 211b, 212b, 213b of the semiconductor fins 211, 212, 213 can then be selectively removed (see process 1414 and FIGS. 16A-16B). This process 1414 creates source/drain openings 275, 276, 277. Thus, as illustrated, the remaining first portions 211a, 212a, 213a of each semiconductor fin 211, 212, 213 will be positioned laterally between a pair of source/drain openings 275, 276, 277, respectively. However, due to the fact that the multi-layer semiconductor fin 211 and the single layer semiconductor fin 213 are so thin (e.g., less than 15 nm), the source/drain openings 275 and 277 may be unduly narrow and, more particularly, may have aspect ratios that are too high (as discussed above).

Figure 17A:
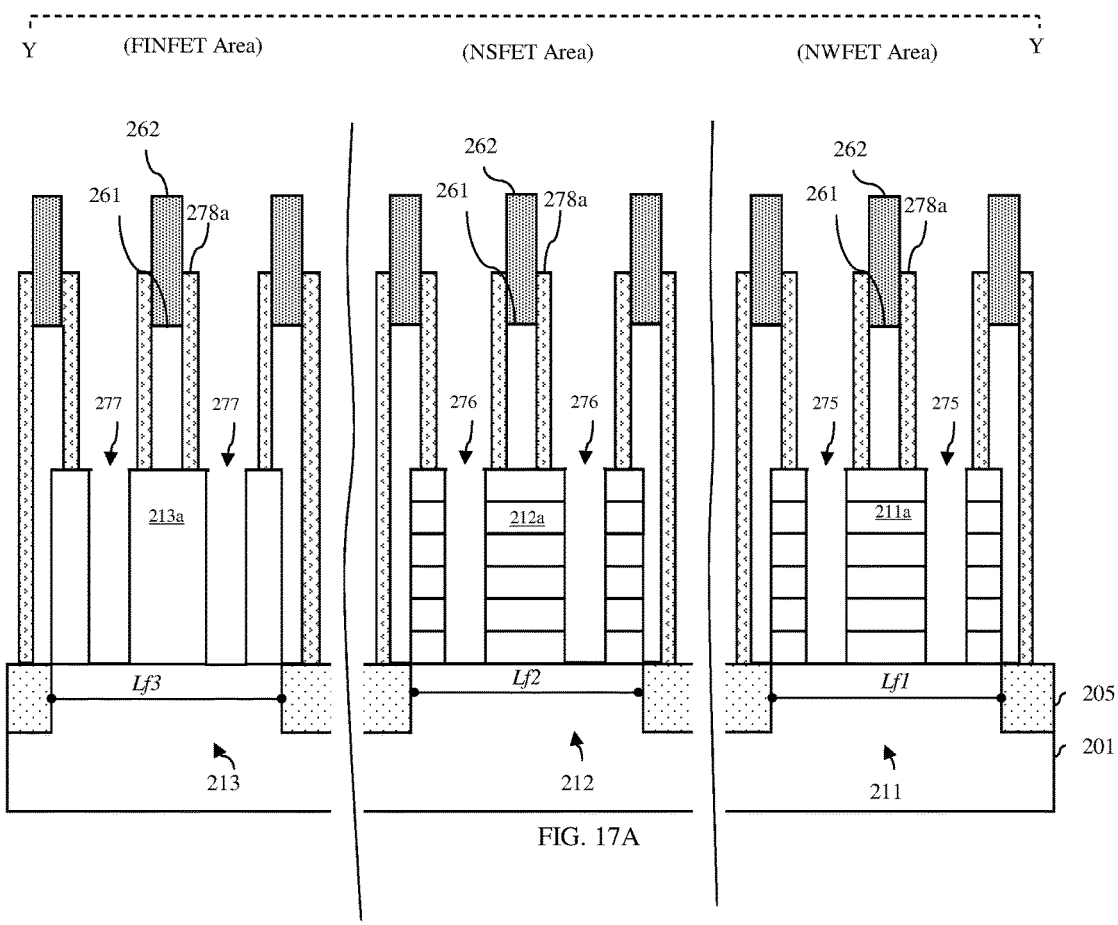
FIGS. 17A-17B are different cross-section diagrams illustrating a partially completed IC structure formed according to the flow diagram of FIG. 14.
Figure 17B:
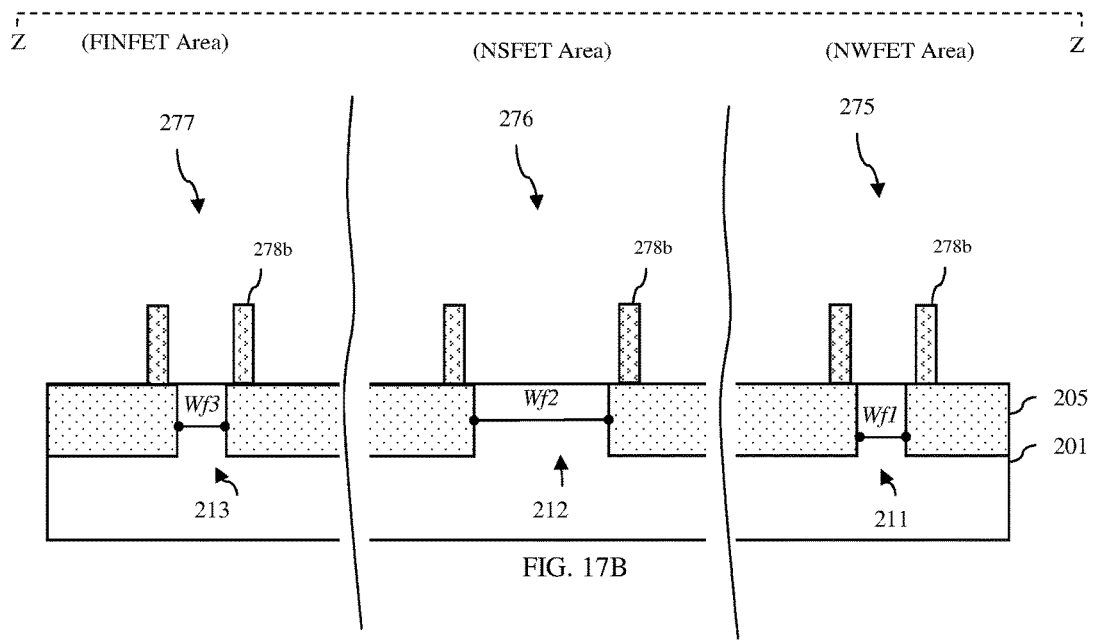

Therefore, this method embodiment further includes widening the source/drain openings 275, 276, 277 (i.e., increasing the size of each source/drain opening) (see process 1416 and FIGS. 17A-17B). Specifically, the third dielectric material of the thick spacer layer can be selectively and isotropically etched to reduce the size of (as shown) or completely remove (not shown) the fin sections 278b of each sidewall spacer, thereby widening and decreasing the aspect ratio of the source/drain openings. It should be noted that the gate section 278a will only have one exposed side and, thus, will be etched at a much slower rate than the fin sections and the selective isotropic etch process can be stopped prior to exposure of the sacrificial gate. In the resulting IC structure, the fin sections 278b of the sidewall spacer will be relatively short and narrow as compared to the gate section 278a (or will be gone altogether).

This method embodiment can further include performing conventional FET processing in order to complete an integrated circuit (IC) structure including a first transistor (i.e., a NWFET) using the multi-layer semiconductor fin 211 and, if applicable, a second transistor (i.e., a NSFET) using the multi-layer semiconductor fin 212 and/or a third transistor (i.e., a FINFET) using the single layer semiconductor fin 213 (see process 1418). These processes can include, but are not limited to, etching back vertical surfaces of the first portion 211a, 212a of each multi-layer semiconductor fin 211, 212, which were exposed when the second portions 211b, 212b, 213b of the semiconductor fins 211, 212, 213 were removed, to form cavities; conformally depositing and selectively isotropically an isolation layer to form isolation elements in the cavities; forming source/drain regions; selectively removing the sacrificial gates and removing any exposed second semiconductor material to form gate openings; forming gates in the gate openings; etc. By widening or removing all together the fin sections 278b of each sidewall spacer before isolation element formation, this method embodiment ensures that isolation material, which is deposited over any areas within which source/drain regions are to be formed, can be removed and, thus, ensures that source/drain region formation will not be blocked.

Yet another method embodiment disclosed herein forms an integrated circuit (IC) structure with one or more transistors including at least one nanowire-type field effect transistor (NWFET) and, optionally, a nanosheet-type field effect transistor (NSFET) and/or a fin-type field effect transistor (FINFET). However, in this method embodiment, during formation of the transistor(s), all sidewall spacer material is removed from the semiconductor fins before exposed portions of semiconductor fin(s) are selectively removed such that the areas within which source/drain regions are subsequently formed are not bound (i.e., structurally limited).

Figure 18:
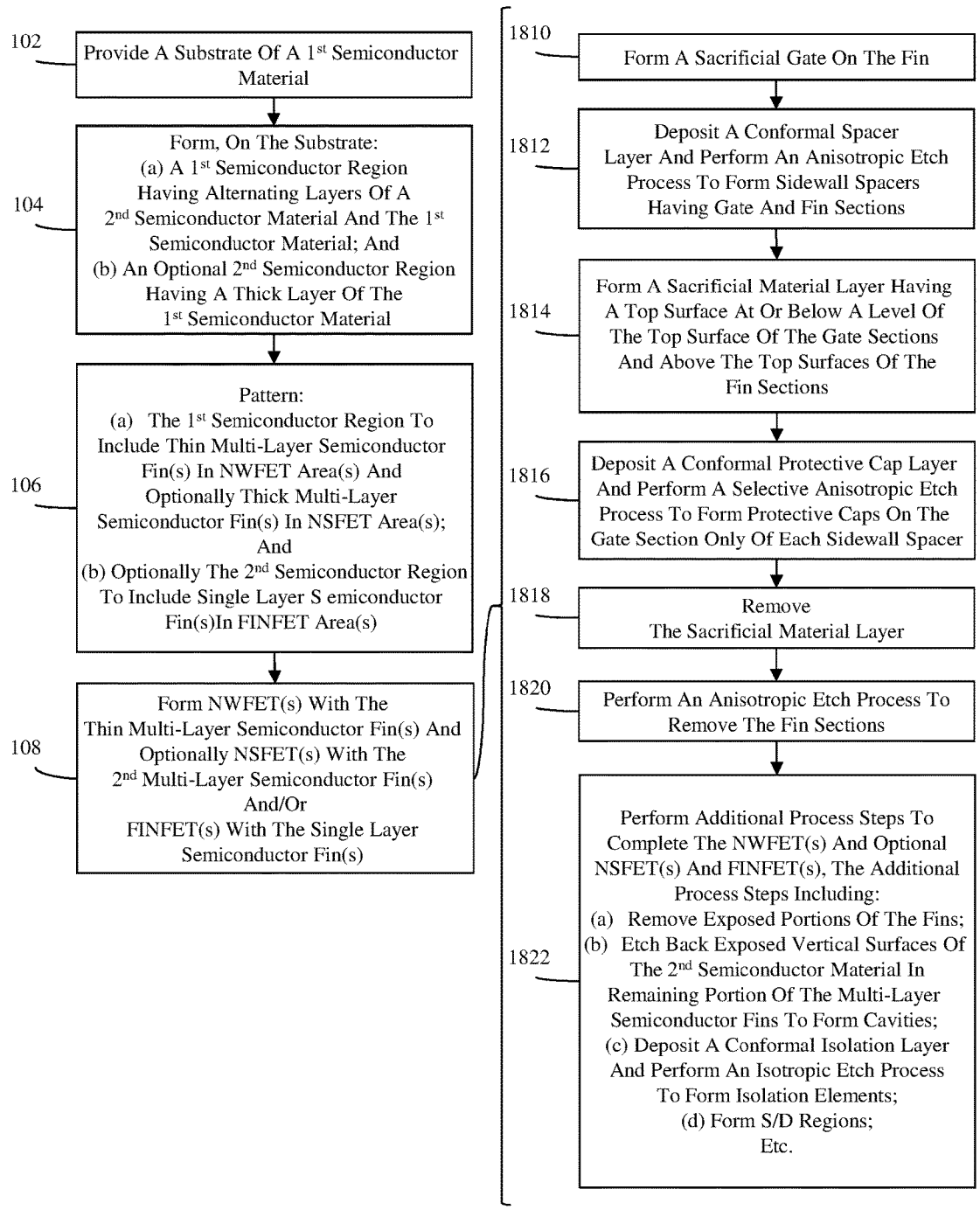
FIG. 18 is a flow diagram illustrating yet another alternative embodiment of a method of forming an integrated circuit (IC) structure having at least one gate-all-around field effect transistor (GAAFET)

More particularly, referring to the flow diagram of FIG. 18, in this embodiment, processes 102-108 are similar to the processes 102-108 of FIG. 1 described in detail above; however, the sub-processes used to form one or more first transistors (i.e., the NWFET(s)) and optionally the one or more second transistors (i.e., the NSFET(s)) and/or the one or more third transistors (i.e., the FINFET(s)) at process 108 are different from those in FIG. 1.

Figure 19A:
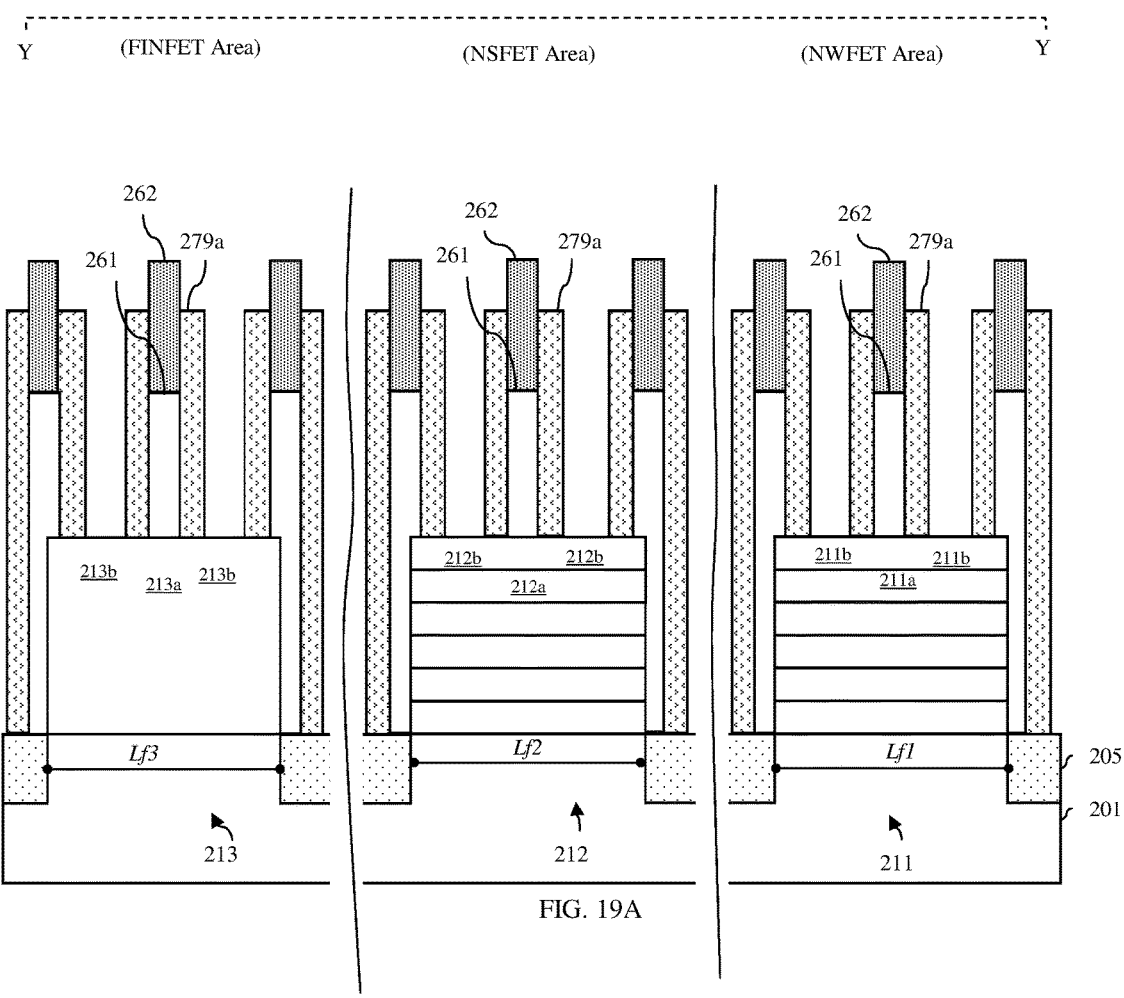
FIGS. 19A-19B are different cross-section diagrams illustrating a partially completed IC structure formed according to the flow diagram of FIG. 18.
Figure 19B:
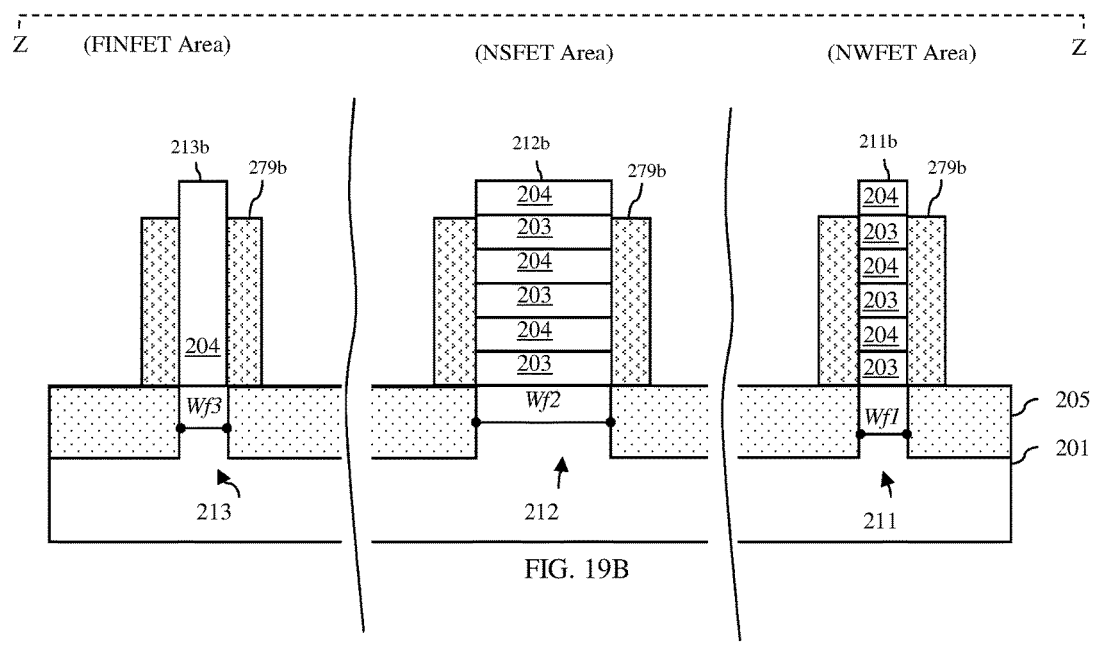

Specifically, in this method embodiment, sacrificial gates 261 with sacrificial gate caps 262 can be formed on first portions 211a, 212a, 213a of the semiconductor fins 211, 212, 213 such that second portions 211b, 212b, 213b of the semiconductor fins 211, 212, 213 extend laterally beyond the sacrificial gates 261, respectively (see process 1810 and FIGS. 19A-19B). This process 1810 can be performed in essentially the same manner as process 110 of FIG. 1, described above.

In this case, instead of forming multi-layer sidewall spacers, single layer sidewall spacers are formed so that each sidewall spacer includes a gate section 279a adjacent to the sidewalls of a given sacrificial gate 261 and fin sections 279b adjacent to the exposed second portions of a given one of the semiconductor fins 211, 212, 213 (see processes 1812 and FIGS. 19A-19B). Specifically, a spacer layer made of a third dielectric material that is different from the first dielectric material and the second dielectric material can be conformally deposited over the sacrificial gate caps 262 on the sacrificial gates 261 and over the exposed second portions 211b, 212b, 213b of the semiconductor fins 211, 212, 213. As mentioned above, the first dielectric material can be, for example, silicon nitride and the second dielectric material can be, for example, silicon nitride. The third dielectric material can be, for example, silicon oxynitride (SiON), carbon-doped silicon oxynitride (SiONC), carbon-doped silicon (SiC), silicon carbon nitride (SiCN), silicon oxycarbide (SiCO), silicon boron carbon nitride (SBCN), hydrogenated silicon oxycarbide (SiCOH), etc. or any other suitable dielectric material different from the first and second dielectric materials. An anisotropic etch process can then be performed in order to selectively etch the spacer layer away from horizontal top surfaces of the sacrificial gate caps 262, semiconductor fins 211, 212, 213 and isolation region 205 without exposing any vertical surfaces of the sacrificial gates 261. The resulting sidewall spacers will each have a gate section 279a covering the vertical surfaces of a given one of the sacrificial gate 261 and fin sections 279b, which are shorter than and have a same thickness as the gate section 279a, covering the vertical surfaces of the exposed second portions of a given one of the semiconductor fins 211, 212, 213.

Figure 20A:
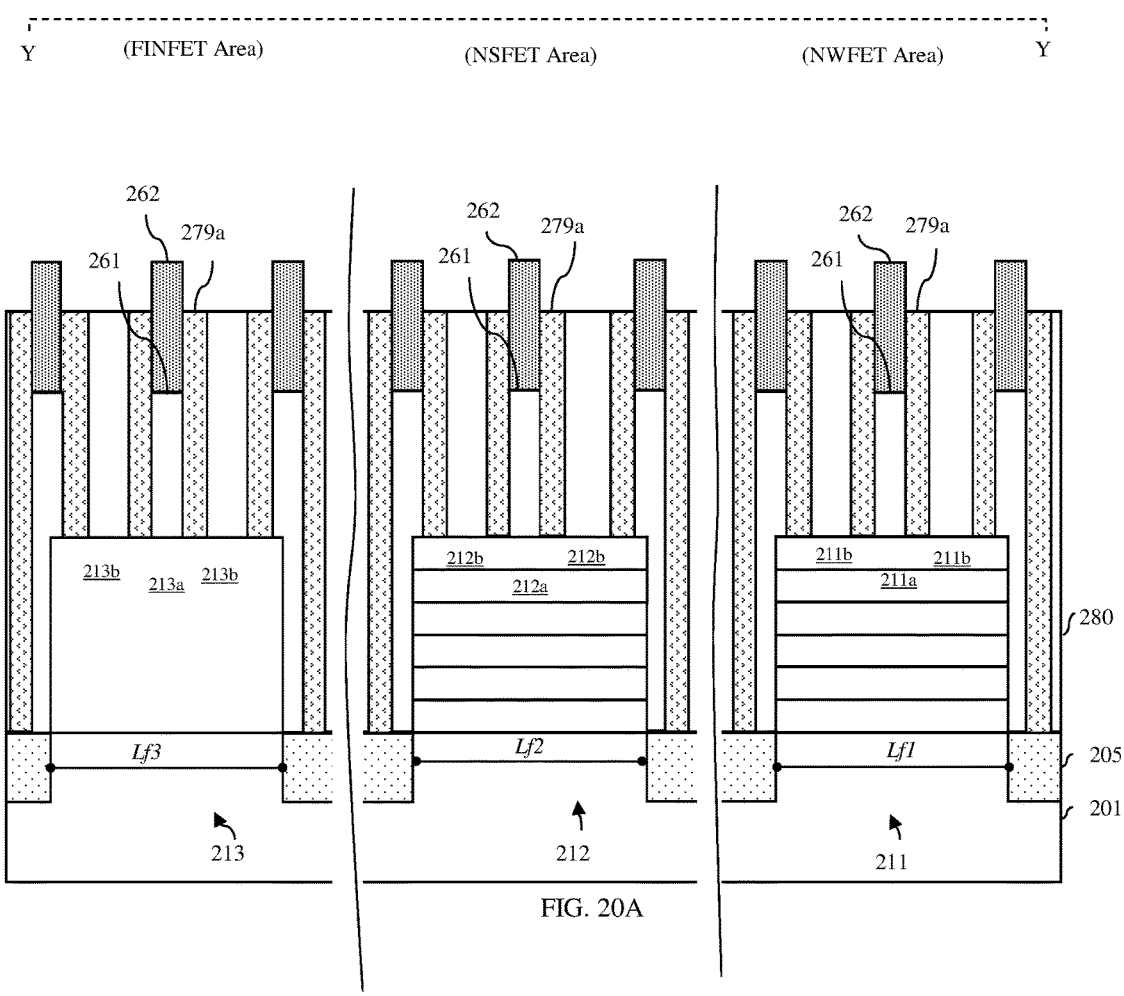
FIGS. 20A-20B are different cross-section diagrams illustrating a partially completed IC structure formed according to the flow diagram of FIG. 18.
Figure 20B:
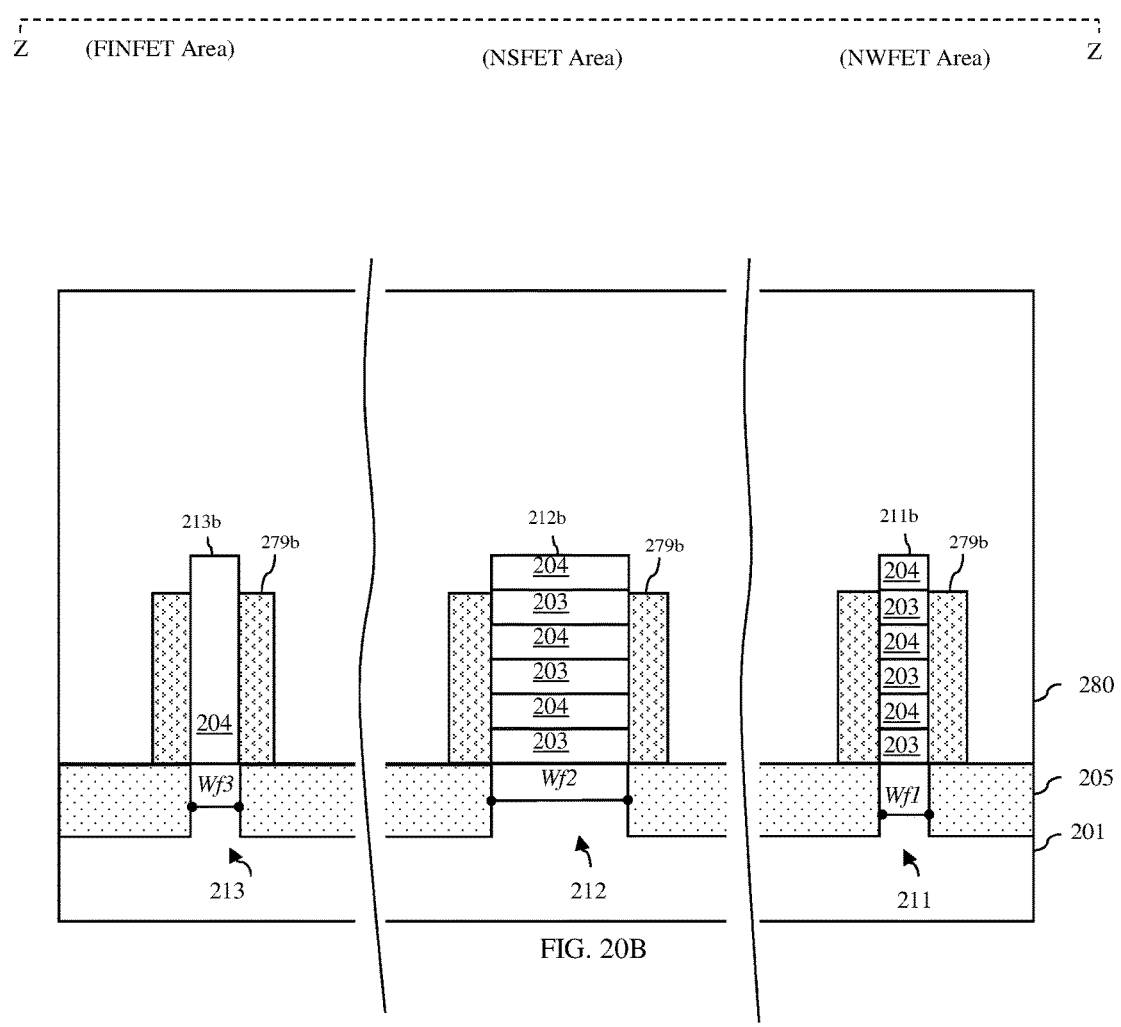
Figure 21:
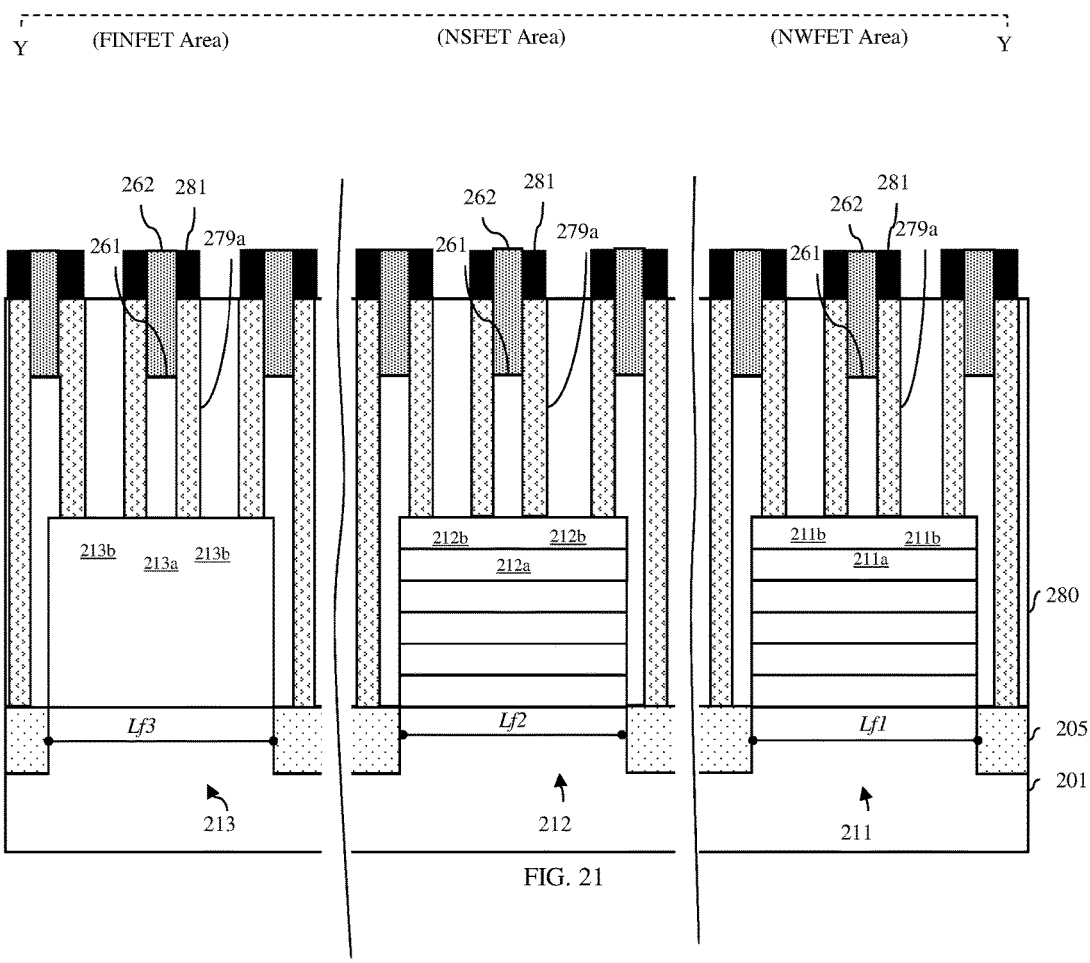
FIG. 21 is a cross-section diagram illustrating a partially completed IC structure formed according to the flow diagram of FIG. 18.
Figure 22A:
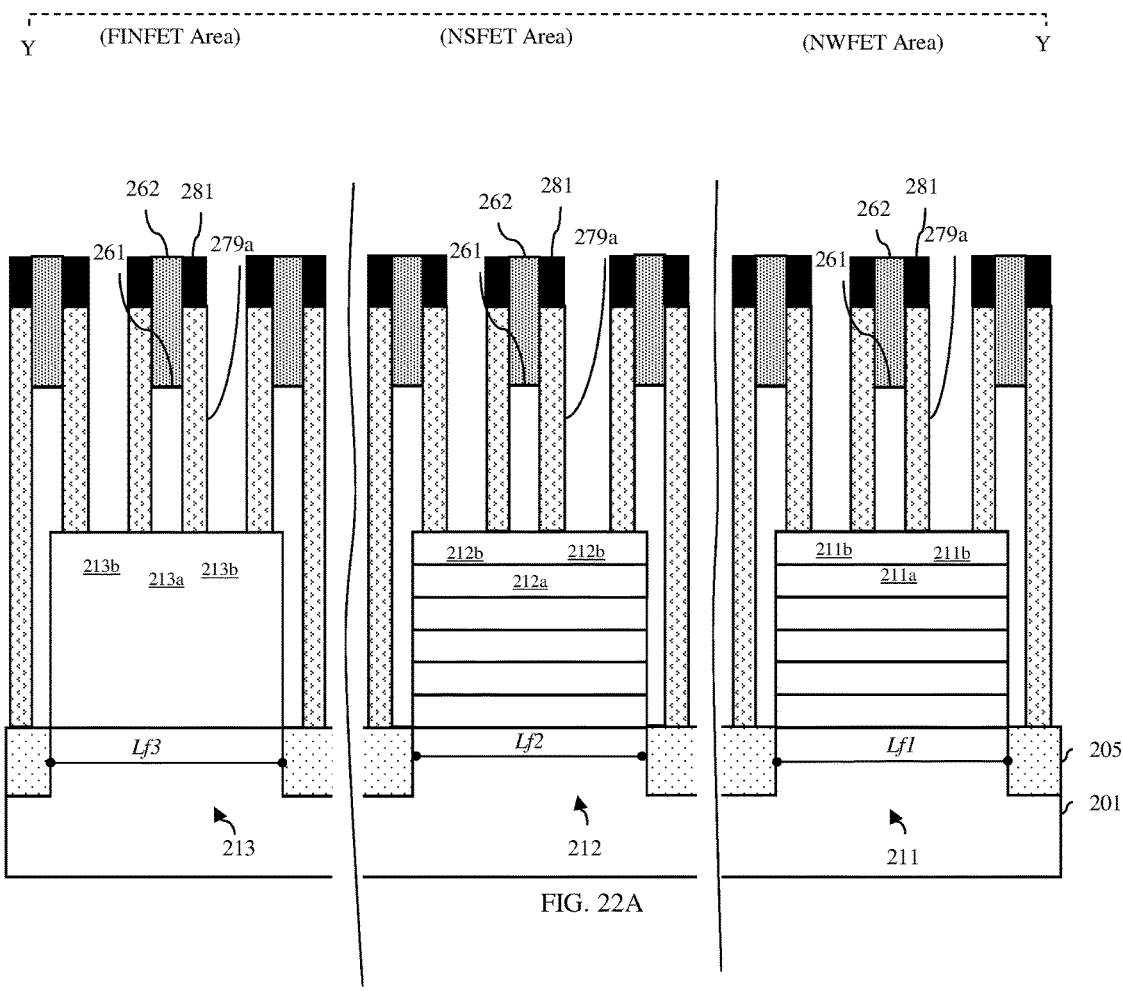
FIGS. 22A-22B are different cross-section diagrams illustrating a partially completed IC structure formed according to the flow diagram of FIG. 18.
Figure 22B:
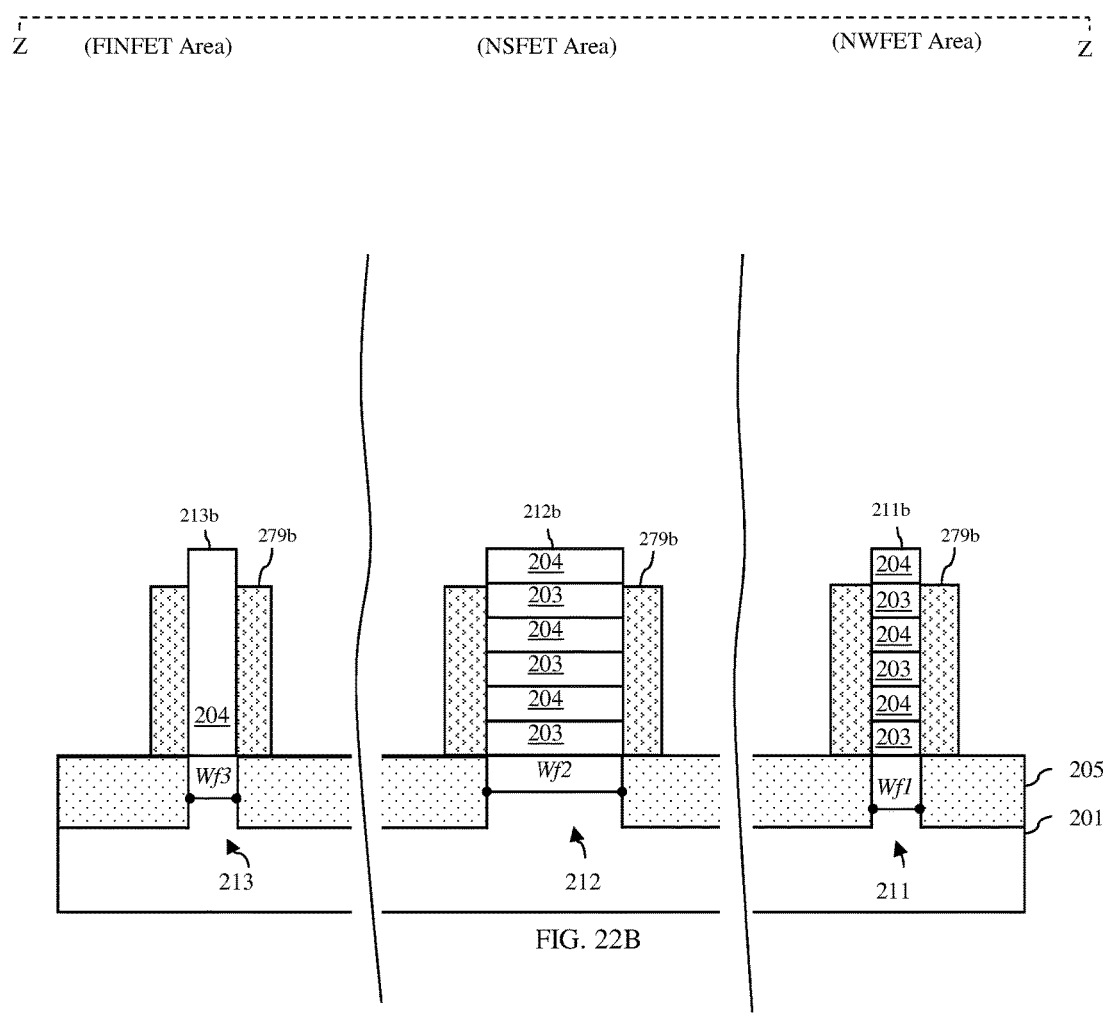
Figure 23A:
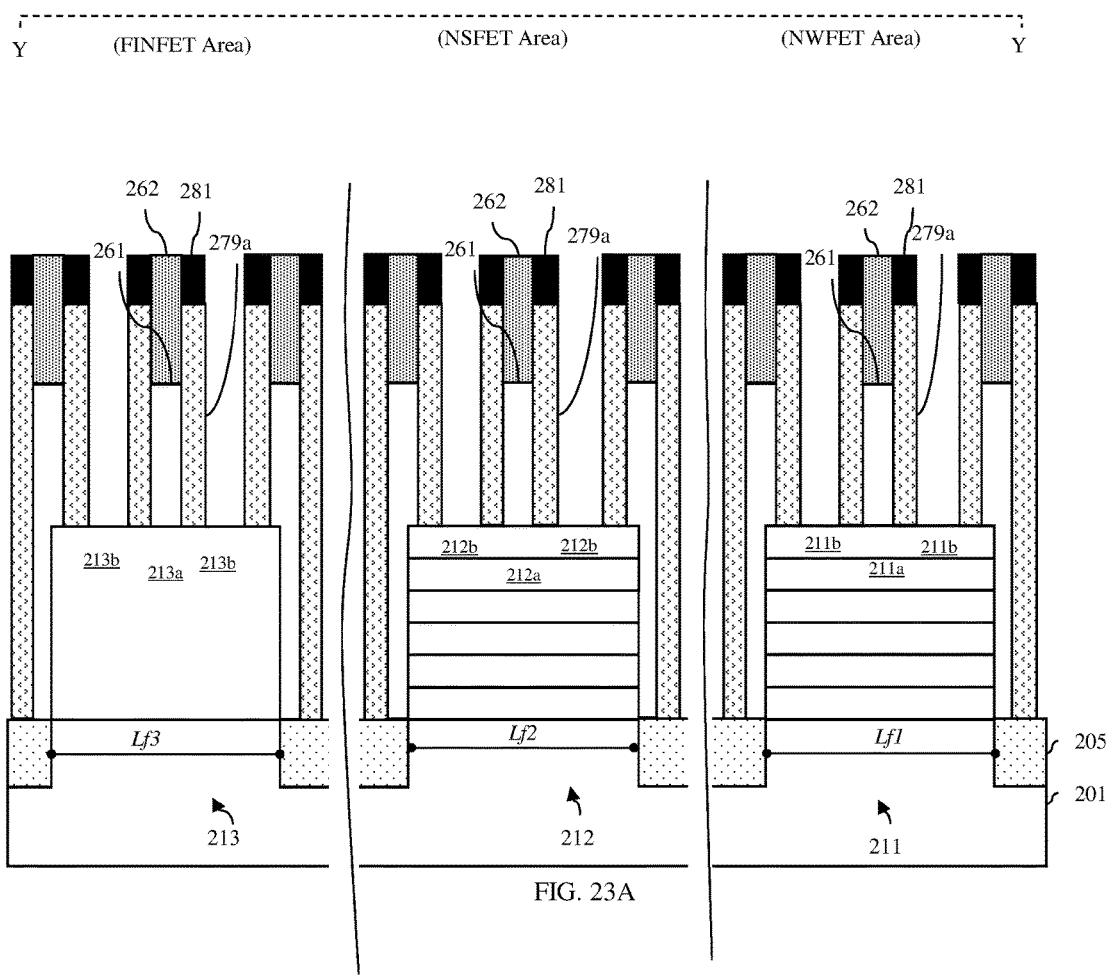
FIGS. 23A-23B are different cross-section diagrams illustrating a partially completed IC structure formed according to the flow diagram of FIG. 18.
Figure 23B:
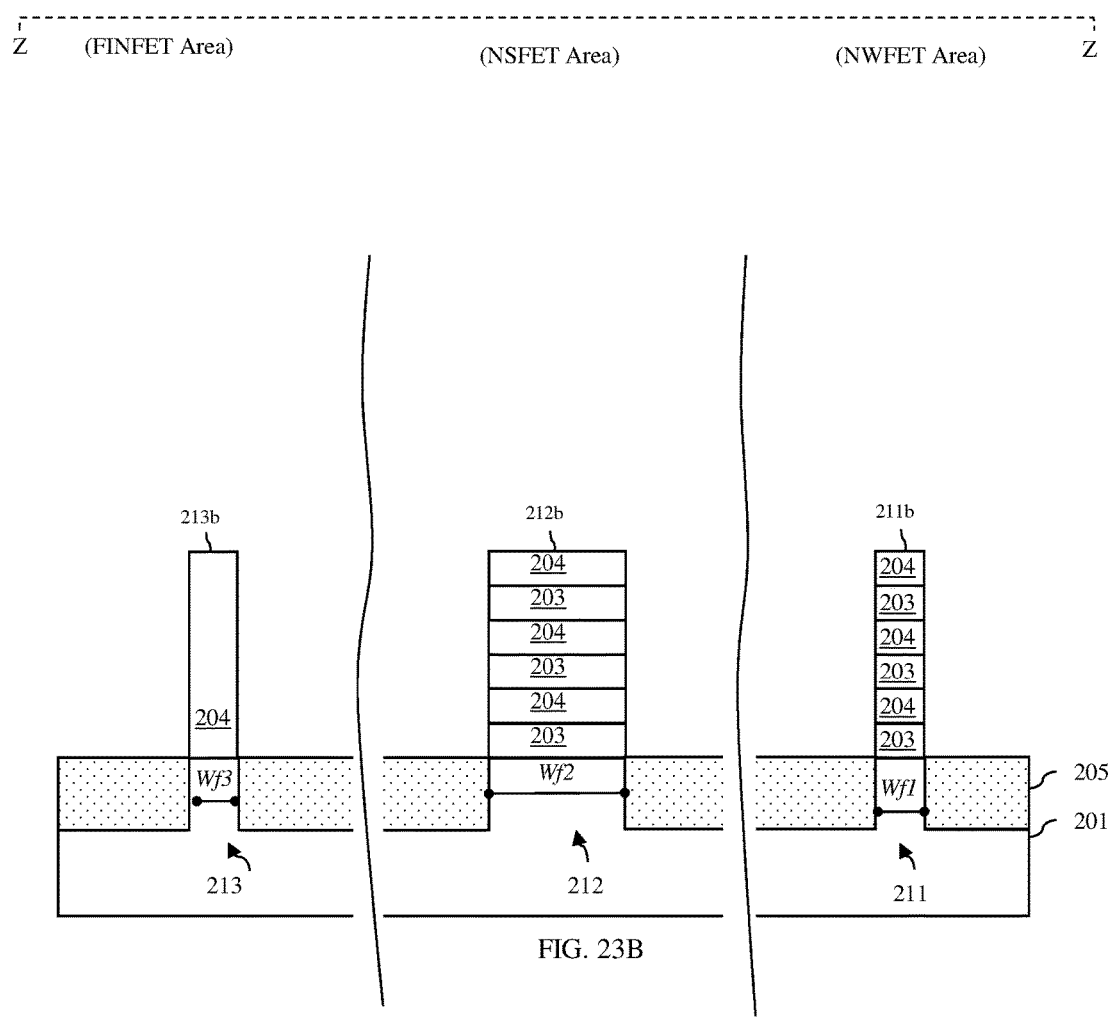
Figure 24A:
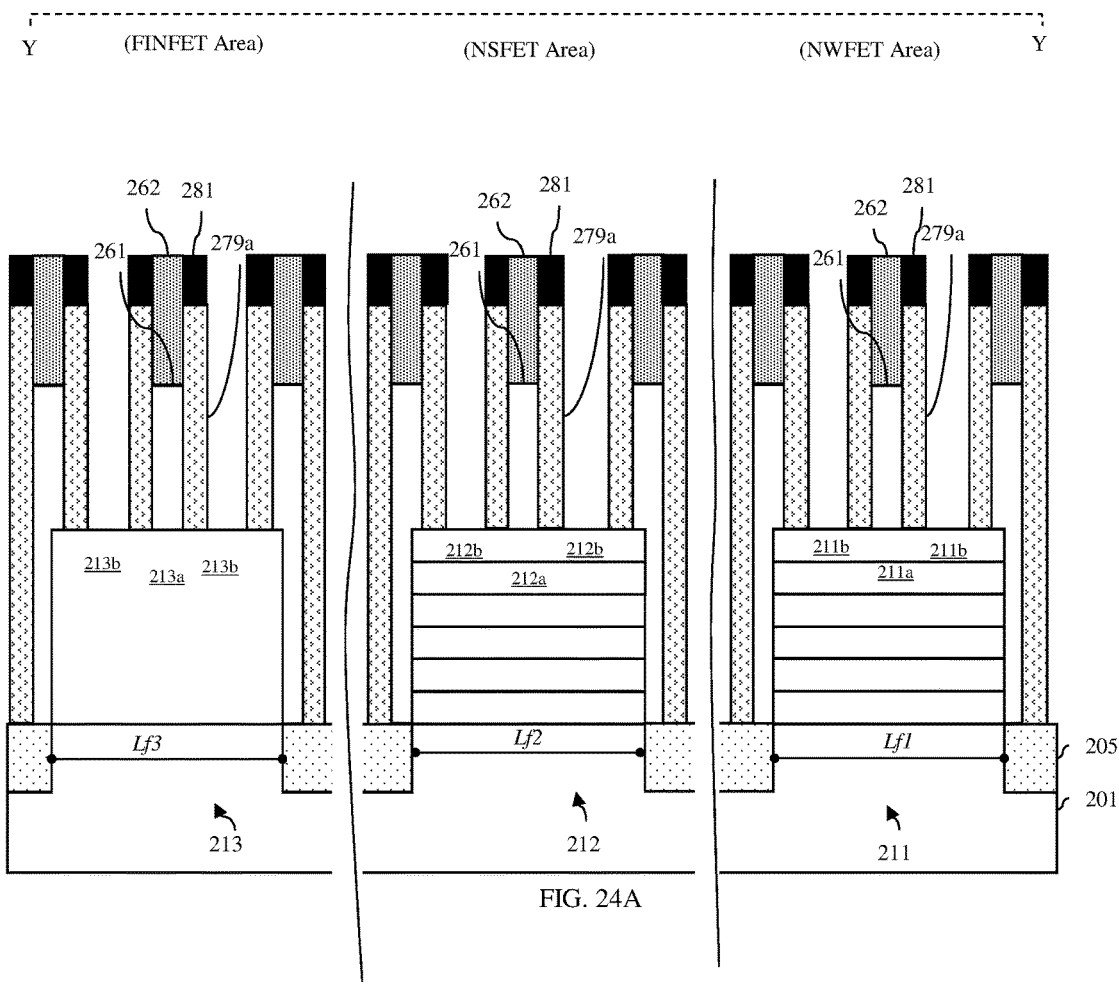
FIGS. 24A-24B are different cross-section diagrams illustrating a partially completed IC structure formed according to the flow diagram of FIG. 18.
Figure 24B:
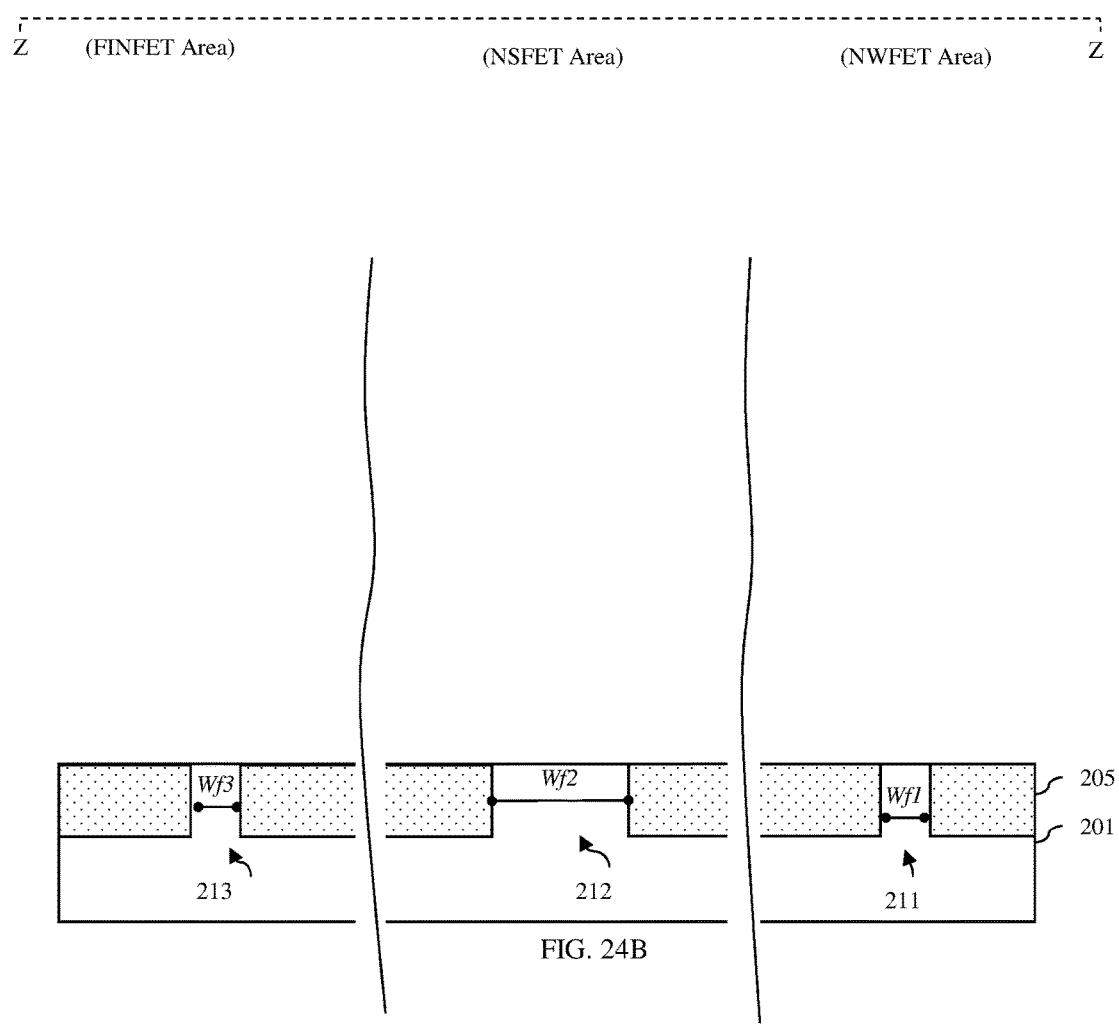

After sidewall spacer formation, a protective cap can be formed on the gate section 279a only of each sidewall spacer. Specifically, a sacrificial material layer 280 can be formed (e.g., deposited and recessed) such that it is adjacent to the different sections 279a-279b of each sidewall spacer and such that the top surface of the sacrificial material layer 280 is above the level of the top surfaces of the fin sections 279b and at or below the level of the top surface of the gate section 279a (see process 1814 and FIGS. 20A-20B). The sacrificial material layer 280 can be, for example, an optical polymerization layer (OPL), an amorphous carbon layer, an amorphous silicon layer, or a layer of any other suitable sacrificial material that can subsequently be selectively removed. Next, a protective cap layer can be conformally deposited over the partially completed structure (i.e., on the top surface of the sacrificial material layer and over the exposed upper ends of each gate section and sacrificial gate cap 262). Then, a selective anisotropic etch process can be performed in order to remove the protective cap layer from horizontal surfaces, thereby forming a protective cap 281 on the top surface of the gate section 279a only of each sidewall spacer and further positioned laterally immediately adjacent to a sacrificial gate cap 262 (see processes 1816 and FIG. 21). The protective cap layer can specifically be made of a different dielectric material than the sidewall spacer. For example, the protective cap layer can be made of the second dielectric material (e.g., silicon dioxide). The sacrificial material layer 280 can then be selectively removed such that the top surfaces of the fin sections 279b of each sidewall spacer are exposed (see process 1818 and FIGS. 22A-22B). The fin sections 279b of each sidewall spacer can then be selectively removed, thereby exposing the second portions of the fins and leaving the gate section 279a of each sidewall spacer intact (see process 1820 and FIGS. 23A-23B). Specifically, the material of the spacer layer can be selectively and anisotropically etched until the fin sections 279b of the sidewall spacers are completely removed. During this selective anisotropic etch process, the gate section 279a of each sidewall spacer will be protected by the protective cap 281, thereby preventing exposure of the adjacent sacrificial gate 261. After the fin sections 279b are removed, the exposed second portions 211b, 212b, 213b of each semiconductor fin 211, 212, 213 can be selectively removed, thereby exposing designated areas for source/drain formation and opposing sidewalls of the remaining first portion 211a, 212a, 213a of each semiconductor fin 211, 212, 213 (see FIGS. 24A-24B).

This method embodiment can further include performing conventional FET processing in order to complete an integrated circuit (IC) structure including a first transistor (i.e., a NWFET) using the multi-layer semiconductor fin 211 and, if applicable, a second transistor (i.e., a NSFET) using the multi-layer semiconductor fin 212 and/or a third transistor (i.e., a FINFET) using the single layer semiconductor fin 213 (see process 1822). These processes can include, but are not limited to, etching back exposed vertical surfaces of the second semiconductor material 203 at the opposing sidewalls of the first portion 211a, 212a of each multi-layer semiconductor fin 211, 212, which were exposed when the second portions 211b, 212b of the multi-layer semiconductor fins 211, 212 were removed, in order to form cavities; conformally depositing an isolation layer to at least fill the cavities; selectively isotropically the isolation layer to remove the isolation layer from the designated areas for source/drain region formation, but stopping prior to removal of the isolation layer from the cavities such that isolation elements remain within the cavities; forming source/drain regions in the designated areas for source/drain region formation; selectively removing the sacrificial gates and removing any exposed second semiconductor material to form gate openings; forming gates in the gate openings; etc. By capping the gate section 279a of each sidewall spacer and removing the fin sections 279b of each sidewall spacer all together before removing the second portions 211b, 212b, 213b of the semiconductor fins 211, 212, 213, this method embodiment ensures that the areas within which source/drain regions are to be formed will not be structurally bound and, thus, ensures that any isolation material deposited over these areas can be selectively removed and that source/drain region formation will not be blocked.

In the method and structures described above, each first transistor 10, 10' (i.e., each NWFET), each second transistor 20, 20' (i.e., each NSFET) and each third transistor 30 (i.e., each FINFET) can have the same type conductivity. That is, they can all be P-type field effect transistors (PFETs) or N-type field effect transistors (NFETs). Alternatively, at least two of these transistors can have different type conductivities (e.g., one transistor in a row or column can be a PFET and two can be NFETs or vice versa). It should be understood that to form FETs with different type conductivities some of the process steps described above and illustrated in the figures must be performed separately for the different transistors. That is, PFET areas would be masked while processing NFET areas and vice versa. For example, source/drain region formation for NFETs and PFETs can be performed separately so that the source/drain regions can be in situ doped so as to have different conductivities; RMG formation for NFETs and PFETs can be performed separately so that the gate conductors can have different work functions; etc.

For PFETs and/or NFETs, the channel regions will be made of the same first semiconductor material 204 (e.g., monocrystalline silicon). For PFETs, the channel region(s) can have N-type conductivity at a relatively low conductivity level (or can be undoped). For NFETs, the channel region(s) can have P-type conductivity at a relatively low conductivity level (or can be undoped). Furthermore, for both PFETs and NFETs, the source/drain regions can also be made of the same first semiconductor material (e.g., epitaxial monocrystalline silicon). However, alternatively, epitaxial semiconductor material of the source/drain regions can be different from the first semiconductor material and specifically can be preselected to enhance charge carrier mobility. For PFETs, the source/drain region(s) can be implanted or in situ doped during epitaxial deposition so as to have P-type conductivity at a relatively high conductivity level. For NFETs, the source/drain region(s) can be implanted or in situ doped during epitaxial deposition so as to have N-type conductivity at a relatively high conductivity level. Those skilled in the art will recognize that different dopants can be used to achieve the different conductivity types and that the dopants may vary depending upon the different semiconductor materials used. For example, a silicon-based semiconductor material (e.g., silicon, silicon germanium, etc.) having P-type conductivity is typically doped with a P-type dopant (e.g., a Group III dopant, such as boron (B) or indium (In)), whereas a silicon-based semiconductor material having N-type conductivity is typically doped with an N-type dopant (e.g., a Group V dopant, such as arsenic (As), phosphorous (P) or antimony (Sb)). Those skilled in the art will also recognize that different conductivity levels will depend upon the relative concentration levels of the dopants.

Additionally, for both PFETs and NFETs, the RMGs can have the same gate conductor material. Alternatively, for NFETs, the RMGs gates can have a first work function, whereas, for PFETs, the RMGs gates can have a second work function that is different from the first work function. Specifically, the RMGs can have a high-K gate dielectric layer. Those skilled in the art will recognize that a high-K gate dielectric layer refers to a gate dielectric layer made of a dielectric material with a dielectric constant that is greater than the dielectric constant of silicon dioxide (i.e., greater than 3.9). Exemplary high-K dielectric materials include, but are not limited to, hafnium (Hf-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The optimal gate conductor work function of NFETs can be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal gate conductor work function for PFETs can be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Any conductive fill material used can be a fill metal or fill metal alloy, such as tungsten, a tungsten alloy (e.g., tungsten silicide or titanium tungsten), cobalt, aluminum or any other suitable fill metal or fill metal alloy.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "second", "first", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
providing a substrate;
forming a semiconductor fin on the substrate, wherein the semiconductor fin has a first width; and
forming a first transistor using the semiconductor fin, the forming of the first transistor comprising:
forming a sacrificial gate on a first portion of the semiconductor fin such that second portions of the semiconductor fin extend laterally beyond the sacrificial gate;
forming a sidewall spacer comprising a gate section on the sacrificial gate and fin sections on the second portions of the semiconductor fin;
removing the second portions of the semiconductor fin to create source/drain openings and to expose vertical surfaces of the first portion of the semiconductor fin;
widening the source/drain openings such that the widened source/drain openings have a second width that is greater than the first width of the semiconductor fin, wherein the first width of the semiconductor fin and the second width of the widened source/drain openings are measured in a same direction; and
after the widening of the source/drain openings, forming source/drain regions in the widened source/drain openings.

2. The method of claim 1,
wherein the substrate comprises a first semiconductor material,
wherein the forming of the semiconductor fin comprises forming a multi-layer semiconductor fin comprising alternating layers of a second semiconductor material and the first semiconductor material,
wherein the removing of the second portions of the semiconductor fin exposes vertical surfaces of the first semiconductor material and the second semiconductor material, and
wherein the forming of the first transistor further comprises:
after the widening of the source/drain openings and before the forming of the source/drain regions, etching exposed surfaces of the second semiconductor material to form cavities in the first portion of the semiconductor fin;
conformally depositing an isolation layer so that the isolation layer fills the cavities and is within the widened source/drain openings; and
selectively and isotropically etching the isolation layer, wherein the etching of the isolation layer is performed until the isolation layer is completely removed from the widened source/drain openings and stopped prior to removal of the isolation layer from the cavities such that isolation elements remain in the cavities.

3. The method of claim 2,
wherein the forming of the sidewall spacer comprises:
conformally depositing a first spacer layer;
selectively and anisotropically etching the first spacer layer to remove horizontal portions of the first spacer layer;
after the selectively and anisotropically etching of the first spacer layer, conformally depositing a second spacer layer; and
selectively and anisotropically etching the second spacer layer to remove horizontal portions of the second spacer layer so as to form a multi-layer sidewall spacer and expose top surfaces of the second portions of the semiconductor fin,
wherein the forming of the first transistor further comprises forming a first layer of interlayer dielectric material adjacent to the multi-layer sidewall spacer such that top surfaces of the fin sections are at or below a level of a top surface of the first layer of interlayer dielectric material,
wherein the first spacer layer, the second spacer layer and the first layer of interlayer dielectric material comprise different dielectric materials, and
wherein the widening of the source/drain openings comprises:
selectively and isotropically etching the second spacer layer such that the second spacer layer is completely removed from the source/drain openings without exposing the sacrificial gate; and
selectively and isotropically etching the first spacer layer such that the first spacer layer is completely removed.

4. The method of claim 3, wherein the first spacer layer is thicker than the second spacer layer.

5. The method of claim 3, wherein the forming of the first transistor further comprises:
after the forming of the source/drain regions, depositing an etch stop layer over the first layer of interlayer dielectric material, the source/drain regions, and the sacrificial gate;
depositing a second layer of interlayer dielectric material on the etch stop layer;
performing a polishing process to expose the sacrificial gate;
selectively removing the sacrificial gate and the second semiconductor material to form a gate opening;
forming a replacement metal gate with a dielectric gate cap in the gate opening;
forming contact openings that extend through the second layer of the interlayer dielectric material and through the etch stop layer to the source/drain regions; and
forming contacts in the contact openings.

6. The method of claim 5, wherein the contact openings are formed so as to further extend into the first layer of interlayer dielectric material to expose top and side surfaces of the source/drain regions and wherein the forming of the contacts further comprises forming the contacts in the contact openings adjacent to the top and side surfaces of the source/drain regions.

7. The method of claim 6,
wherein the forming of the source/drain regions in the widened source/drain openings comprises depositing epitaxial semiconductor material so as to overfill the widened source/drain openings, and
wherein the method further comprises selectively and isotropically etching the epitaxial semiconductor material so that upper portions of the source/drain regions that extend above the widened source/drain openings are narrower than lower portions of the source/drain regions within the widened source/drain openings.

8. The method of claim 1,
wherein the forming of the sidewall spacer comprises:
conformally depositing a spacer layer; and
performing an anisotropic etch process to remove horizontal portions of the spacer layer in order to form the sidewall spacer, wherein the anisotropic etch process exposes top surfaces of the second portions of the semiconductor fin, and
wherein the widening of the source/drain openings comprises selectively and isotropically etching the spacer layer such that a top surface and one side surface of the gate section are etched without exposing the sacrificial gate and such that top surfaces and opposing side surfaces of the fin sections are etched.

9. The method of claim 1, further comprising, during the forming of the first transistor, concurrently forming any of a second transistor and a third transistor, wherein the first transistor comprises a nanowire-type field effect transistor, the second transistor comprises nanosheet-type field effect transistor, and the third transistor comprises a fin-type field effect transistor.

10. A method comprising:
providing a semiconductor substrate;
forming at least one semiconductor fin on the semiconductor substrate; and
forming a first transistor using the semiconductor fin, the forming of the first transistor comprising:
    forming a sacrificial gate with a sacrificial gate cap on a first portion of the semiconductor fin such that second portions of the semiconductor fin extend laterally beyond the sacrificial gate;
    forming a sidewall spacer comprising a gate section on sidewalls of the sacrificial gate and fin sections on sidewalls of the second portions of the semiconductor fin;
    forming a protective cap on a top surface of the gate section only of the sidewall spacer such that top surfaces of the fin sections of the sidewall spacer are exposed;
    after the forming of the protective cap, removing the fin sections of the sidewall spacer;
    removing the second portions of the semiconductor fin such that opposing sides of the first portion of the semiconductor fin are exposed; and
    forming source/drain regions in designated areas adjacent to the opposing sides of the first portion of the semiconductor fin.

11. The method of claim 10,
wherein the semiconductor substrate comprises a first semiconductor material,
wherein the forming of the at least one semiconductor fin comprises forming at least one multi-layer semiconductor fin comprising alternating layers of a second semiconductor material and the first semiconductor material,
wherein the removing of the second portions of the semiconductor fin exposes the designated areas for source/drain region formation and further exposes vertical surfaces of the first semiconductor material and the second semiconductor material, and
wherein the forming of the first transistor further comprises:
    after the removing of the second portions of the semiconductor fin and before the forming of the source/drain regions, etching exposed vertical surfaces of the second semiconductor material at the opposing sides of the first portion of the semiconductor fin to form cavities;
    conformally depositing an isolation layer so that the isolation layer fills the cavities; and
    selectively and isotropically etching the isolation layer, wherein the etching of the isolation layer is performed until the isolation layer is completely removed from the designated areas for source/drain region formation and stopped prior to removal of the isolation layer from the cavities such that isolation elements remain in the cavities.

12. The method of claim 10,
wherein the forming of the sidewall spacer comprises:
    conformally depositing a spacer layer; and
    selectively and anisotropically etching the spacer layer to remove horizontal portions of the spacer layer and form the sidewall spacer such that the top surface of the gate section is below a level of a top surface of the sacrificial gate cap,
wherein the forming of the protective cap on the gate section comprises:
    forming a sacrificial material layer adjacent to the sidewall spacer such that a top surface of the sacrificial material layer is above a level of the top surfaces of the fin sections and at or below a level of the top surface of the gate section;
    conformally depositing a protective cap layer;
    selectively and anisotropically etching the protective cap layer to remove horizontal portions of the protective cap layer and form the protective cap on the gate section and positioned laterally adjacent to the sacrificial gate cap; and
    removing the sacrificial material layer,
wherein the removing of the fin sections comprises: after the forming of the protective cap, selectively and anisotropically etching the spacer layer until the fin sections are completely removed, and
wherein the gate section is protected by the protective cap during removal of the fin sections in order to prevent exposure of the sacrificial gate.

13. The method of claim 12, wherein the spacer layer, the protective cap layer and the sacrificial material layer comprise different materials.

14. The method of claim 10, further comprising, during the forming of the first transistor, concurrently forming any of a second transistor and a third transistor, wherein the first transistor comprises a nanowire-type field effect transistor, the second transistor comprises a nanosheet-type field effect transistor, and the third transistor comprises a fin-type field effect transistor.

15. A method comprising:
providing a substrate, wherein the substrate comprises a first semiconductor material:
forming a semiconductor fin on the substrate, wherein the forming of the semiconductor fin comprises forming a multi-layer semiconductor fin comprising alternating layers of a second semiconductor material and the first semiconductor material; and
forming a first transistor using the semiconductor fin, the forming of the first transistor comprising:
    forming a sacrificial gate on a first portion of the semiconductor fin such that second portions of the semiconductor fin extend laterally beyond the sacrificial gate;
    forming a sidewall spacer comprising a gate section on the sacrificial gate and fin sections on the second portions of the semiconductor fin;
    removing the second portions of the semiconductor fin to create source/drain openings and expose vertical surfaces of the first portion of the semiconductor fin, wherein the removing of the second portions of the semiconductor fin exposes vertical surfaces of the first semiconductor material and the second semiconductor material;

widening the source/drain openings;
after the widening of the source/drain openings, etching exposed surfaces of the second semiconductor material to form cavities in the first portion of the semiconductor fin;
conformally depositing an isolation layer so that the isolation layer fills the cavities and is within the source/drain openings;
selectively and isotropically etching the isolation layer, wherein the etching of the isolation layer is performed until the isolation layer is completely removed from the source/drain openings and stopped prior to removal of the isolation layer from the cavities such that isolation elements remain in the cavities; and
after the selectively and isotropically etching of the isolation layer, forming source/drain regions in the source/drain openings.

16. The method of claim 15,
wherein the forming of the sidewall spacer comprises:
conformally depositing a first spacer layer;
selectively and anisotropically etching the first spacer layer to remove horizontal portions of the first spacer layer;
after the selectively and anisotropically etching of the first spacer layer, conformally depositing a second spacer layer; and
selectively and anisotropically etching the second spacer layer to remove horizontal portions of the second spacer layer so as to form a multi-layer sidewall spacer and expose top surfaces of the second portions of the semiconductor fin,
wherein the forming of the first transistor further comprises forming a first layer of interlayer dielectric material adjacent to the multi-layer sidewall spacer such that top surfaces of the fin sections are at or below a level of a top surface of the first layer of interlayer dielectric material,
wherein the first spacer layer, the second spacer layer and the first layer of interlayer dielectric material comprise different dielectric materials, and
wherein the widening of the source/drain openings comprises:
selectively and isotropically etching the second spacer layer such that the second spacer layer is completely removed from the source/drain openings without exposing the sacrificial gate; and
selectively and isotropically etching the first spacer layer such that the first spacer layer is completely removed.

17. The method of claim 16, wherein the forming of the first transistor further comprises:
after the forming of the source/drain regions, depositing an etch stop layer over the first layer of interlayer dielectric material, the source/drain regions, and the sacrificial gate;
depositing a second layer of interlayer dielectric material on the etch stop layer;
performing a polishing process to expose the sacrificial gate;
selectively removing the sacrificial gate and the second semiconductor material to form a gate opening;
forming a replacement metal gate with a dielectric gate cap in the gate opening;
forming contact openings that extend through the second layer of the interlayer dielectric material and through the etch stop layer to the source/drain regions; and
forming contacts in the contact openings.

18. The method of claim 15,
wherein the forming of the source/drain regions in the source/drain openings comprises depositing epitaxial semiconductor material so as to overfill the source/drain openings, and
wherein the method further comprises selectively and isotropically etching the epitaxial semiconductor material so that upper portions of the source/drain regions that extend above the source/drain openings are narrower than lower portions of the source/drain regions within the source/drain openings.

19. The method of claim 15,
wherein the forming of the sidewall spacer comprises:
conformally depositing a spacer layer; and
performing an anisotropic etch process to remove horizontal portions of the spacer layer in order to form the sidewall spacer,
wherein the anisotropic etch process exposes top surfaces of the second portions of the semiconductor fin, and
wherein the widening of the source/drain openings comprises selectively and isotropically etching the spacer layer such that a top surface and one side surface of the gate section are etched without exposing the sacrificial gate and such that top surfaces and opposing side surfaces of the fin sections are etched.

20. The method of claim 15, further comprising, during the forming of the first transistor, concurrently forming any of a second transistor and a third transistor, wherein the first transistor comprises a nanowire-type field effect transistor, the second transistor comprises nanosheet-type field effect transistor, and the third transistor comprises a fin-type field effect transistor.

* * * * *